(12) United States Patent  (10) Patent No.: US 6,430,071 B1
Haneda  (45) Date of Patent: *Aug. 6, 2002

(54) RECTIFICATION CIRCUIT

(75) Inventor: Masaji Haneda, Tokyo (JP)

(73) Assignee: NTT Data Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/011,089

(22) PCT Filed: Jun. 4, 1997

(86) PCT No.: PCT/JP97/01899

§ 371 (c)(1),
(2), (4) Date: Feb. 15, 1998

(87) PCT Pub. No.: WO97/47071

PCT Pub. Date: Dec. 11, 1997

(30) Foreign Application Priority Data

Jun. 5, 1996 (JP) .............................. 8-142549
Jan. 31, 1997 (JP) .............................. 9-019505

(51) Int. Cl.$^7$ .............................................. H02M 7/217
(52) U.S. Cl. ......................................... 363/127; 363/89
(58) Field of Search ......................... 363/84, 89, 125, 363/127, 65, 69, 71

(56) References Cited

U.S. PATENT DOCUMENTS 3,582,758 A * 6/1971 Gunn ..................... 363/127 X
4,291,266 A * 9/1981 Portmann ................... 320/2
4,519,024 A * 5/1985 Federico et al. ............ 363/127
4,922,404 A * 5/1990 Ludwig et al. ......... 363/127 X

FOREIGN PATENT DOCUMENTS

| DE | 0184963 | 6/1985 |
| DE | 0464246 | 4/1990 |
| EP | 97924316 | 3/2001 |
| JP | 51-90275 | 8/1976 |
| JP | 55-41141 | 3/1980 |
| JP | 57-59475 | 4/1982 |
| JP | 60-502135 | 12/1985 |
| JP | 63-58898 | 4/1988 |
| JP | 04007209 | 1/1992 |
| JP | 5-1951 | 1/1993 |
| JP | 05147092 | 5/1993 |
| JP | 06144117 | 3/1994 |
| JP | 136065 | 5/2000 |
| JP | 137325 | 5/2000 |

OTHER PUBLICATIONS

Japanese Publication 34–10867, Jun. 1954.
Japanese Publication 4–179, Jan. 1992.
Japanese Publication 8–126317, May 1996.
Japanese Publication 3–218264, Sep. 1991.
Japanese Publication 2–211062, Aug. 1990.
Japanese Publication 3–195360, Aug. 1991.
Japanese Publication 48–31302, Apr. 1973.
European Search Report for European Patent Application No. EP97924316.

* cited by examiner

Primary Examiner—Jessica Han
(74) Attorney, Agent, or Firm—Rader, Fishman & Grauer PLLC

(57) ABSTRACT

The present invention sets forth multiple embodiments of an electrical circuit which rectifies alternating current in a manner which results in very little electrical loss. This is in contrast to conventional rectifier circuits that use simple diode configurations which typically give rise to voltage losses from 0.4 volts to 1.0 volts.

7 Claims, 42 Drawing Sheets

FIG.5
(A)
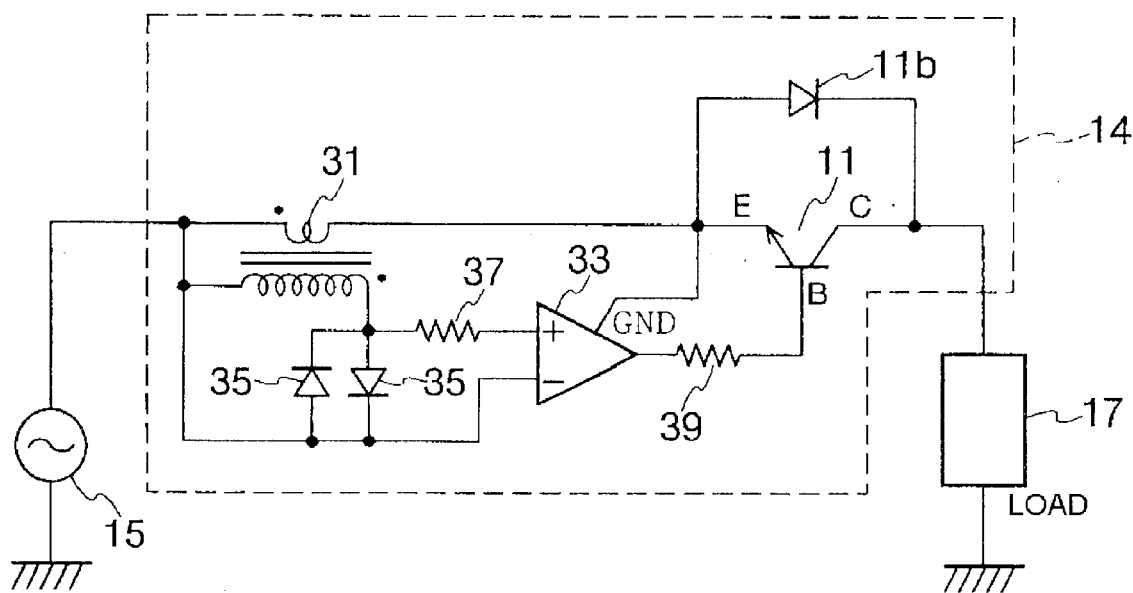
(B)
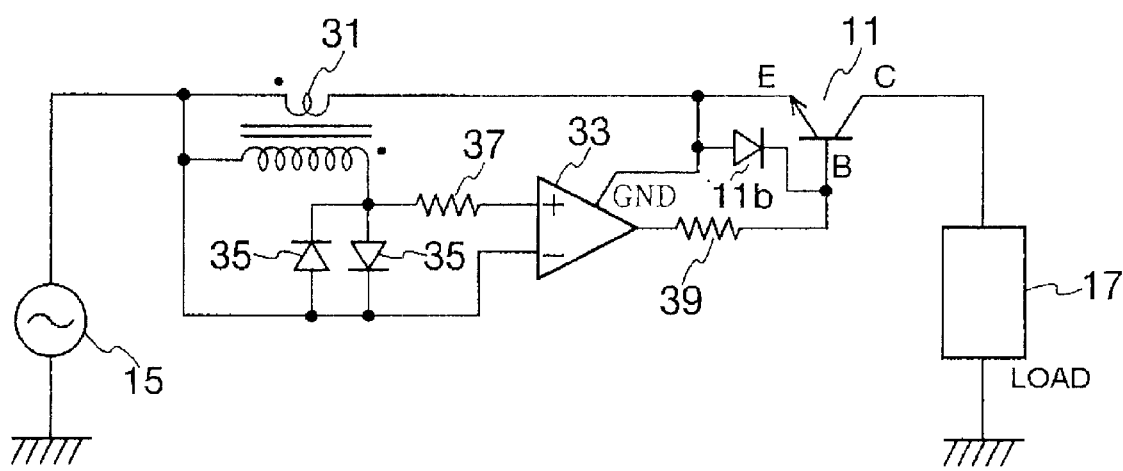

FIG.6
(A) SOURCE VOLTAGE
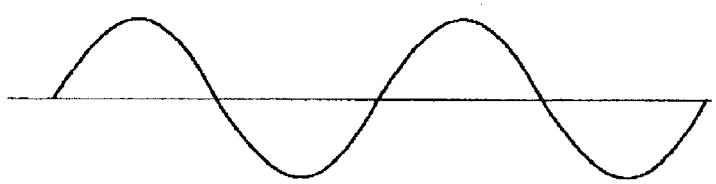
(B) VOLTAGE BETWEEN E AND C
0.6V
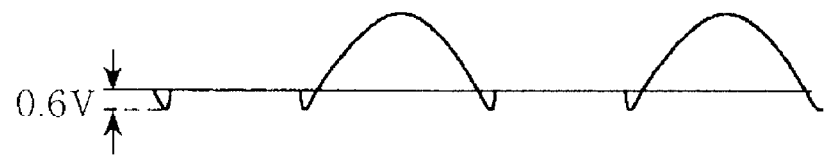
(C) LOAD VOLTAGE

FIG.9
(A)
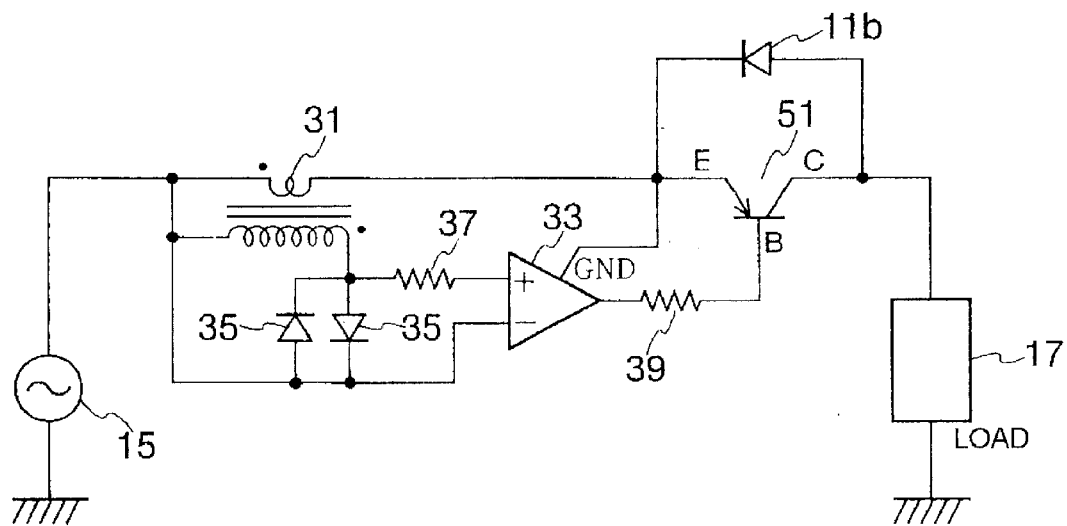
(B)
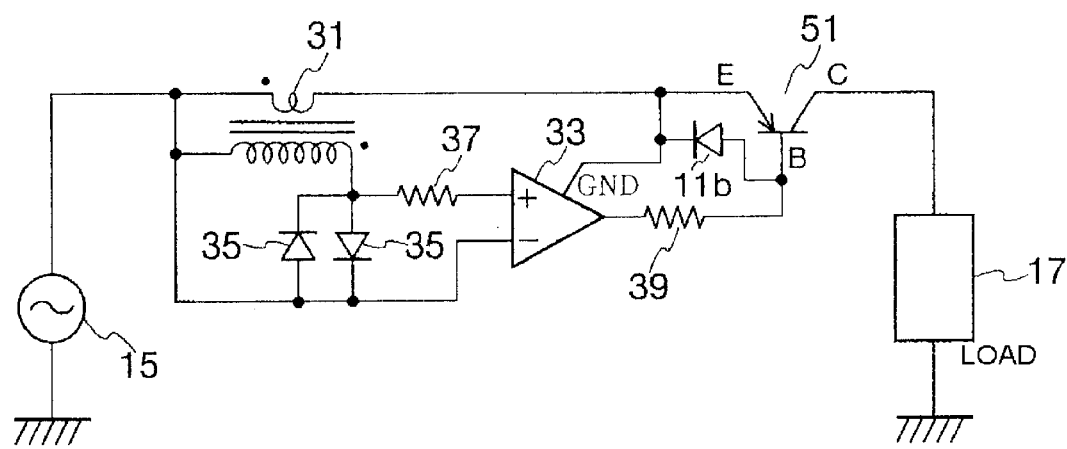

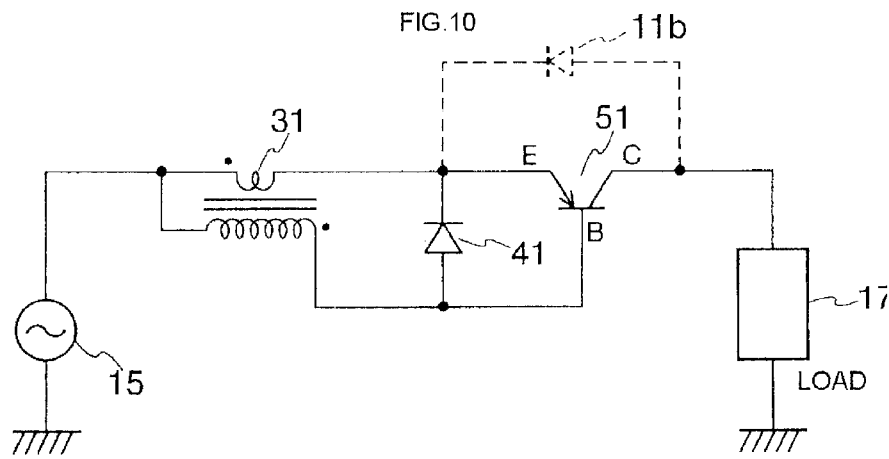
FIG.10
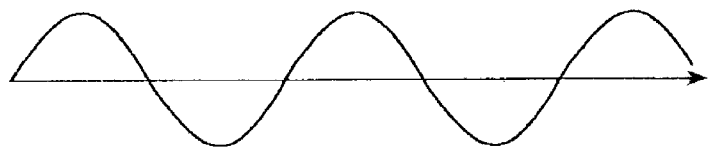
FIG.11
(A) SOURCE VOLTAGE
(B) CONTROL VOLTAGE
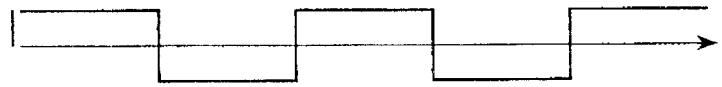
(C) CONDUCTION STATE IN BIPOLAR TRANSISTOR ←OFF→←ON→←OFF→←ON→←OFF→
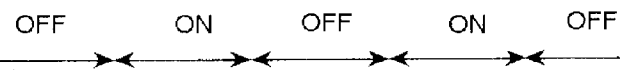
(D) LOAD VOLTAGE
(E) VOLTAGE BETWEEN EMITTER AND CORRECTOR

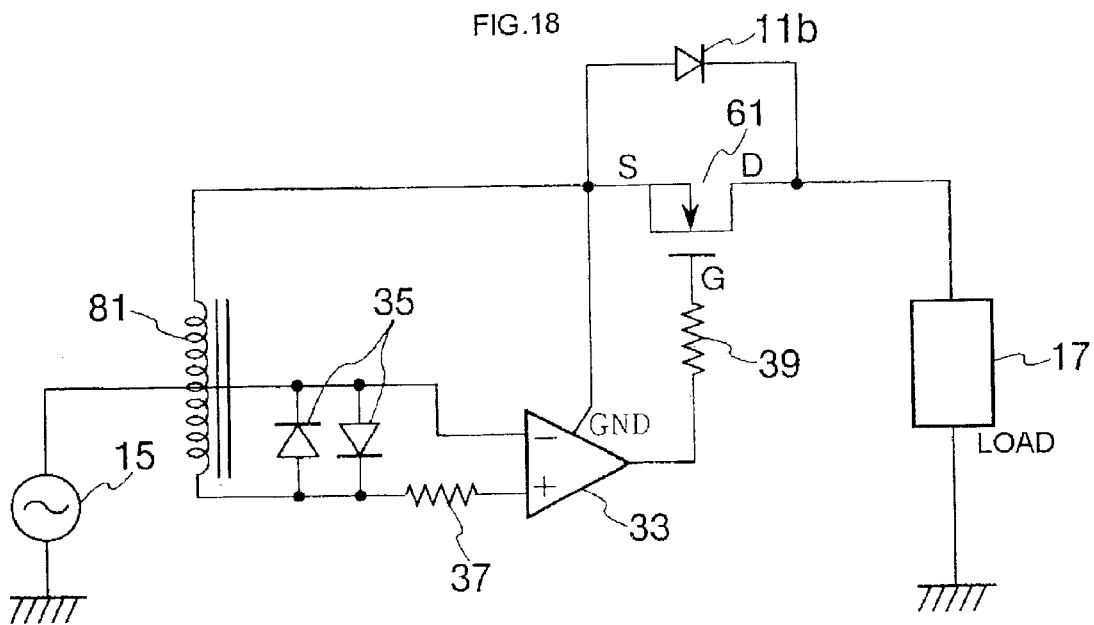
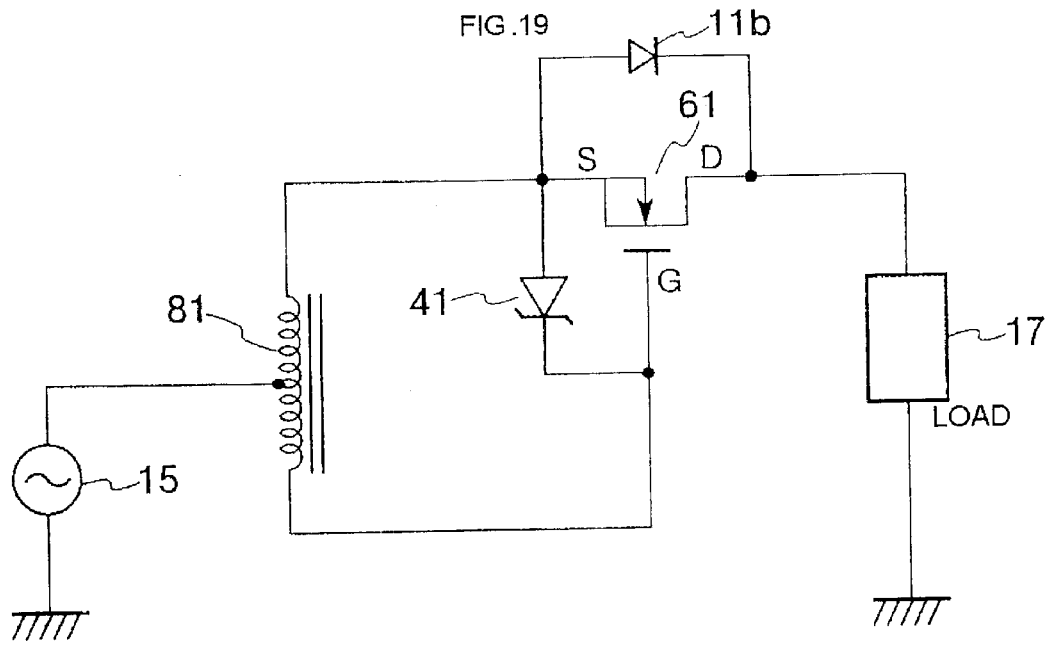

FIG.22
(A)
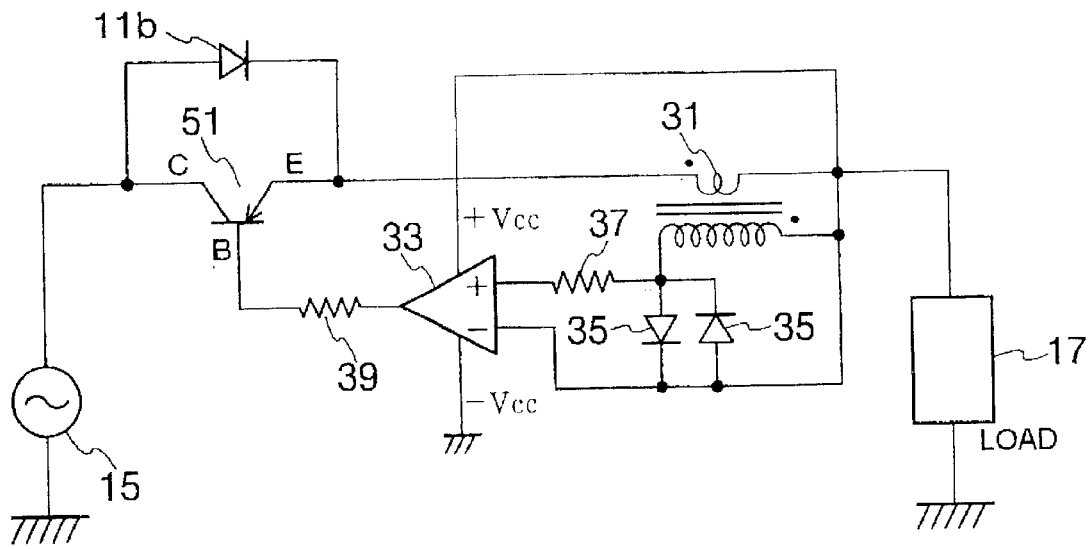
(B)
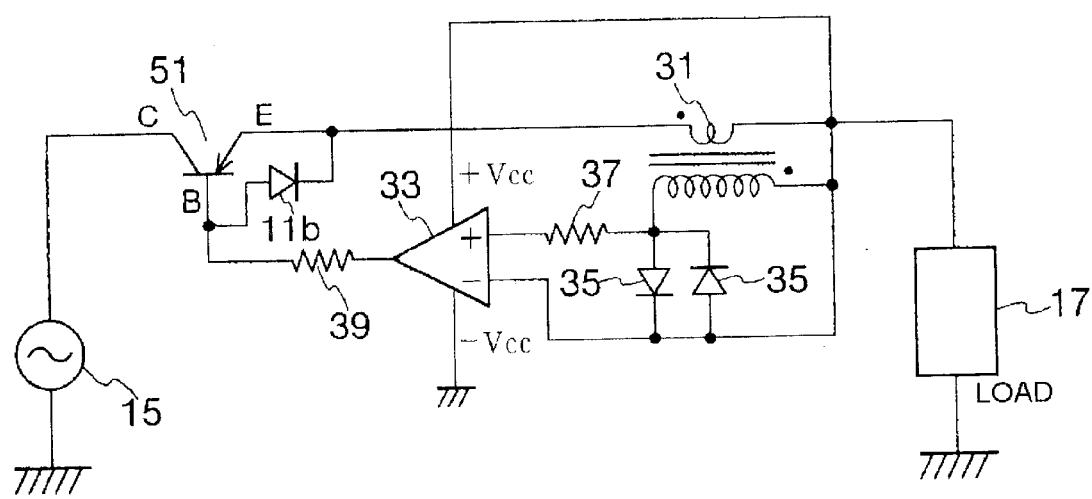

FIG.23
(A)
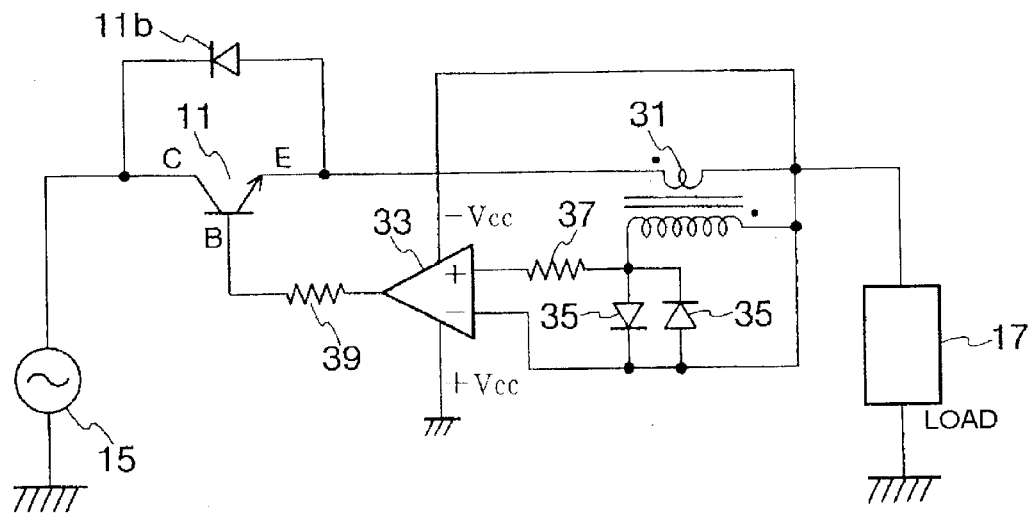
(B)
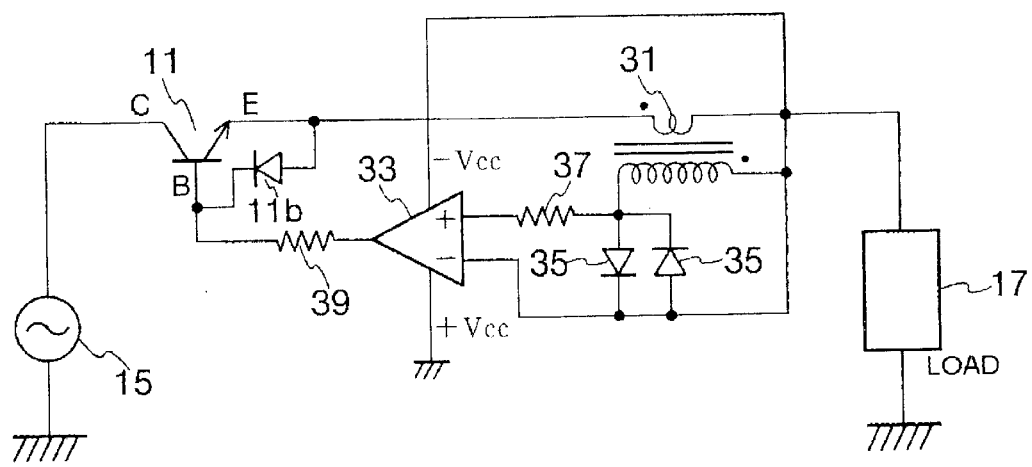

(A) INPUT ALTERNATE Sa
    ELECTRICITY (B) OP-AMP OUTPUT Sb (C) RECTIFIED Sc
    ELECTRICITY (A) SW SOURCE OUTPUT Sd
200kHz
±5V
10A (B) FET OUTPUT Se (A) SOURCE VOLTAGE (B) CONTROL VOLTAGE (C) ON/OFF (D) VOLTAGE BETWEEN D AND S (E) VOLTAGE APPLIED TO LOAD

FIG.46
(A)
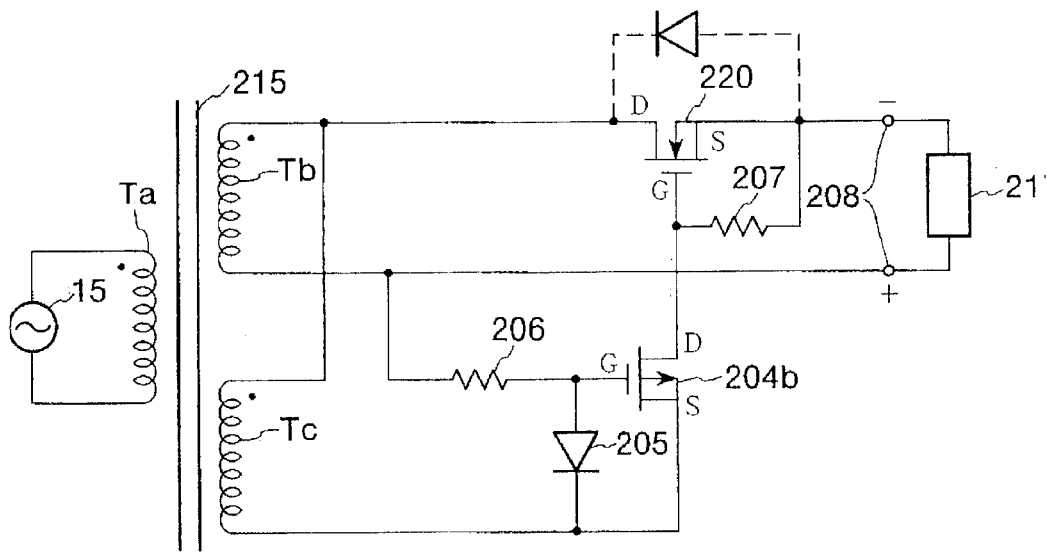
(B)
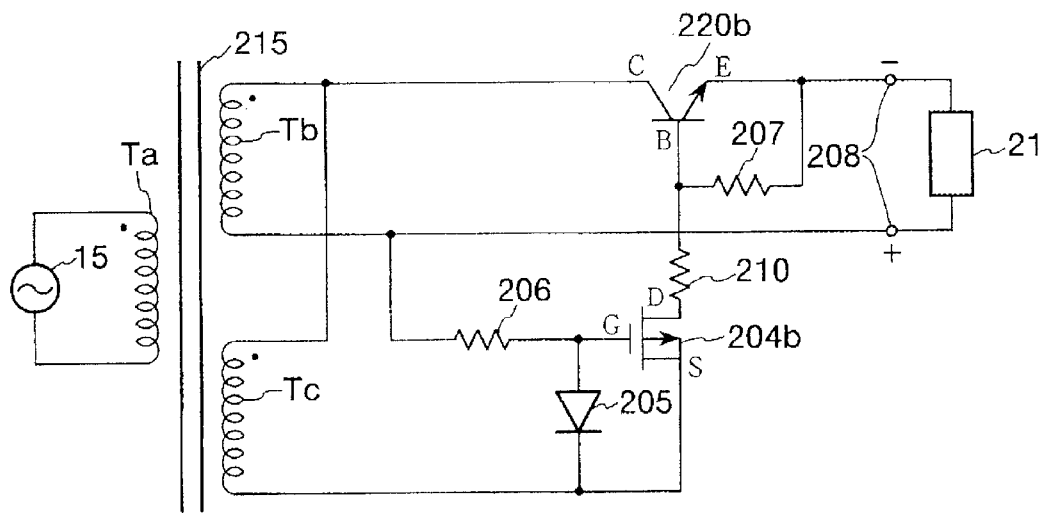

FIG.47
(A)
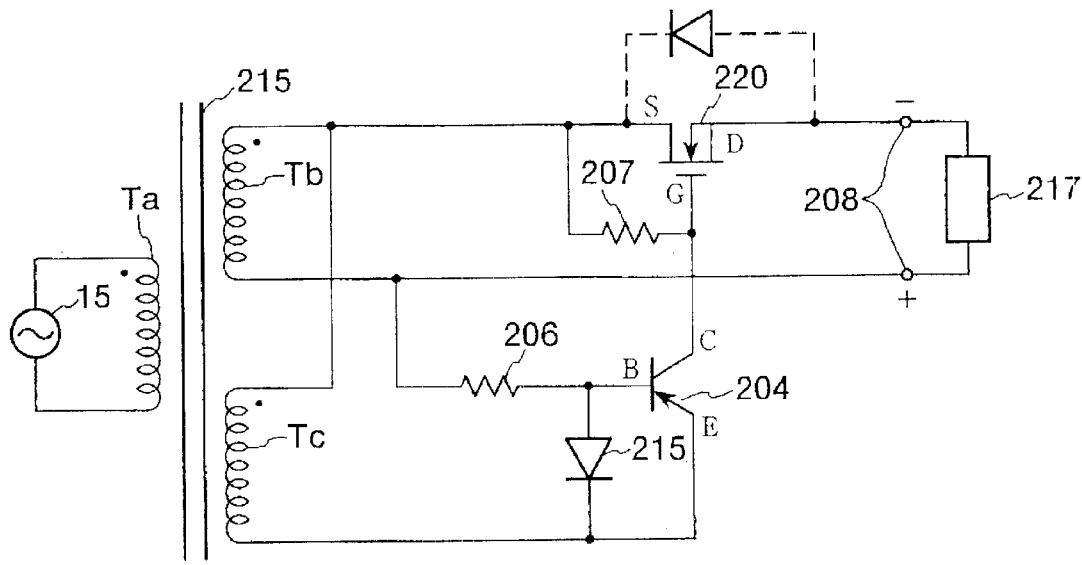
(B)
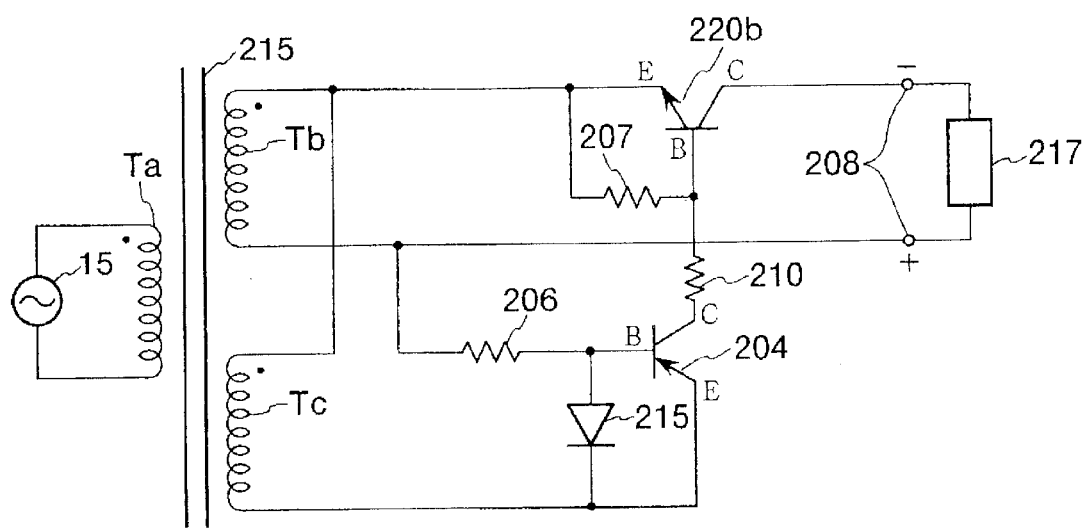

FIG.48
(A)
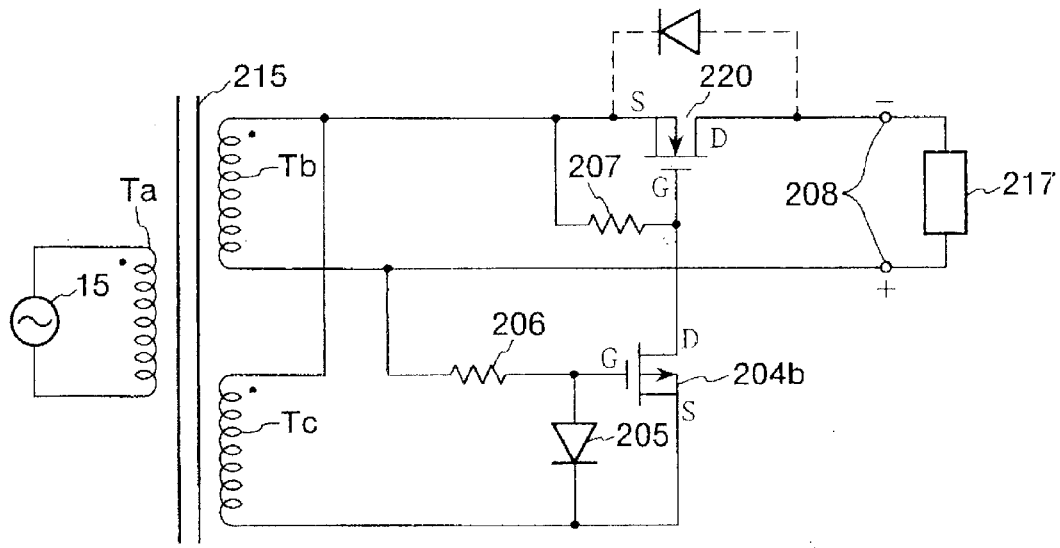
(B)
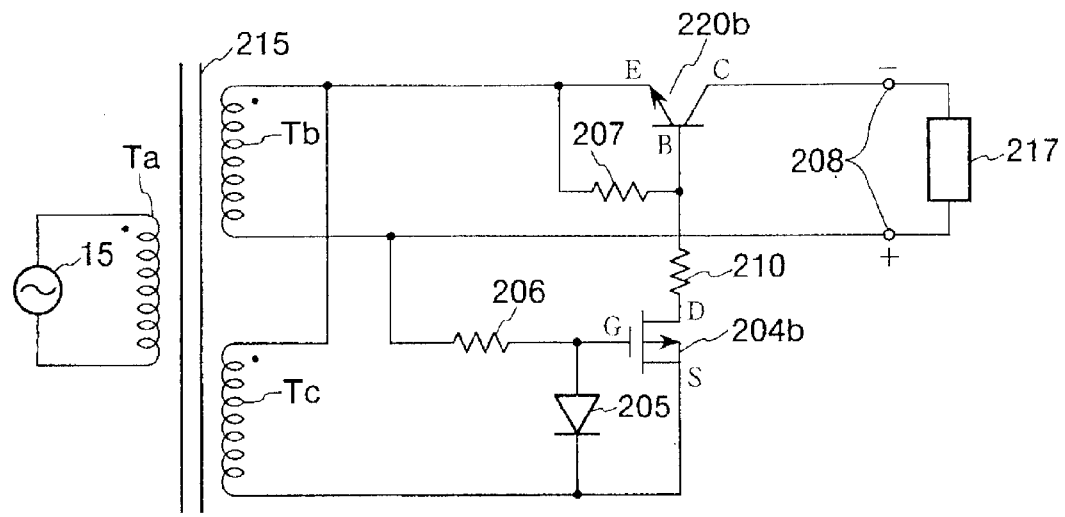

FIG.51
(A)
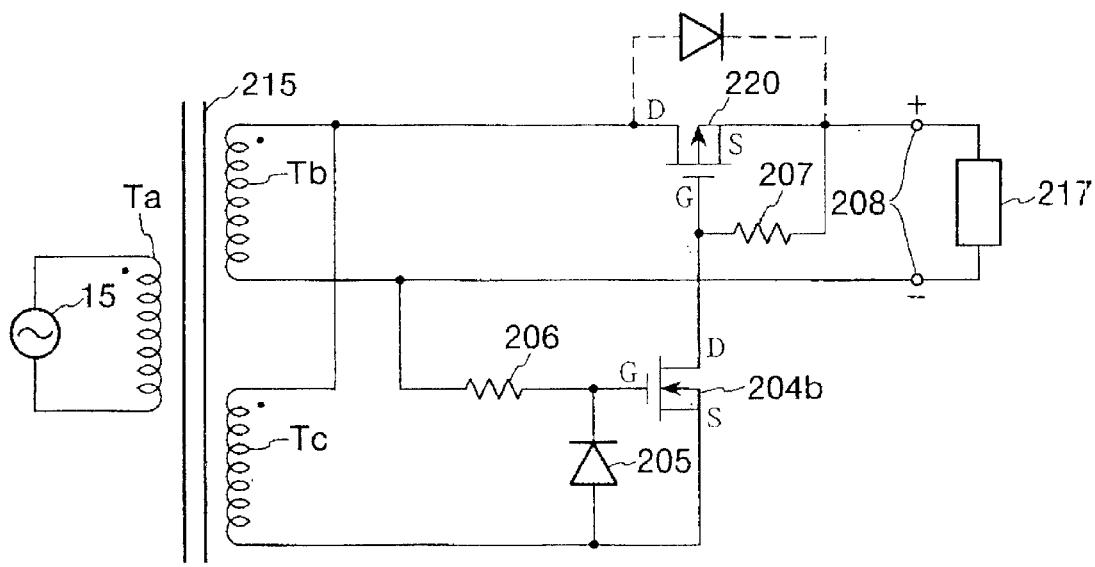
(B)
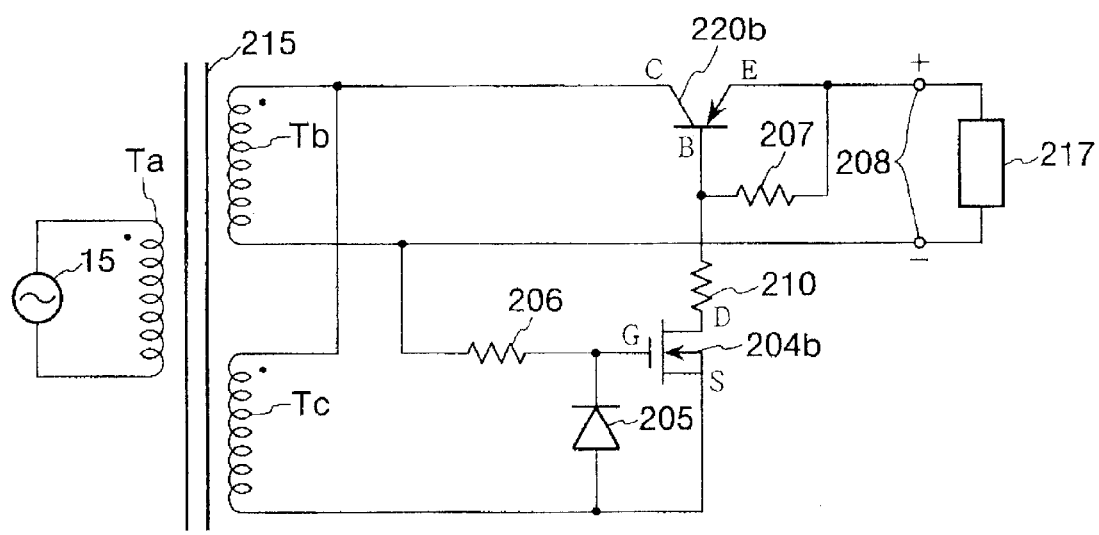

FIG.52
(A)
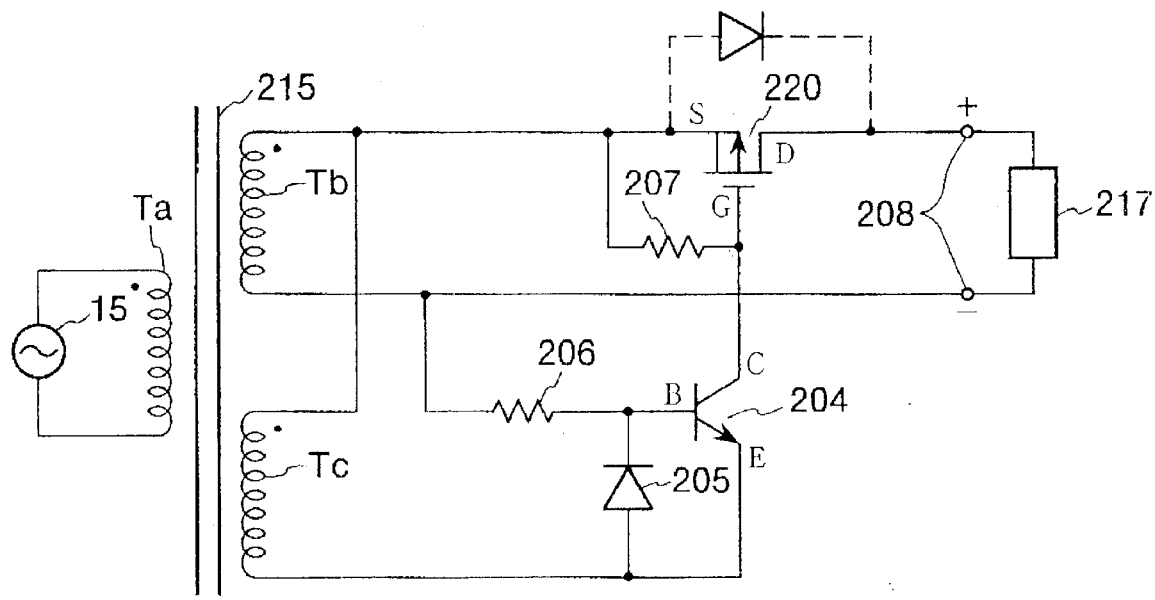
(B)
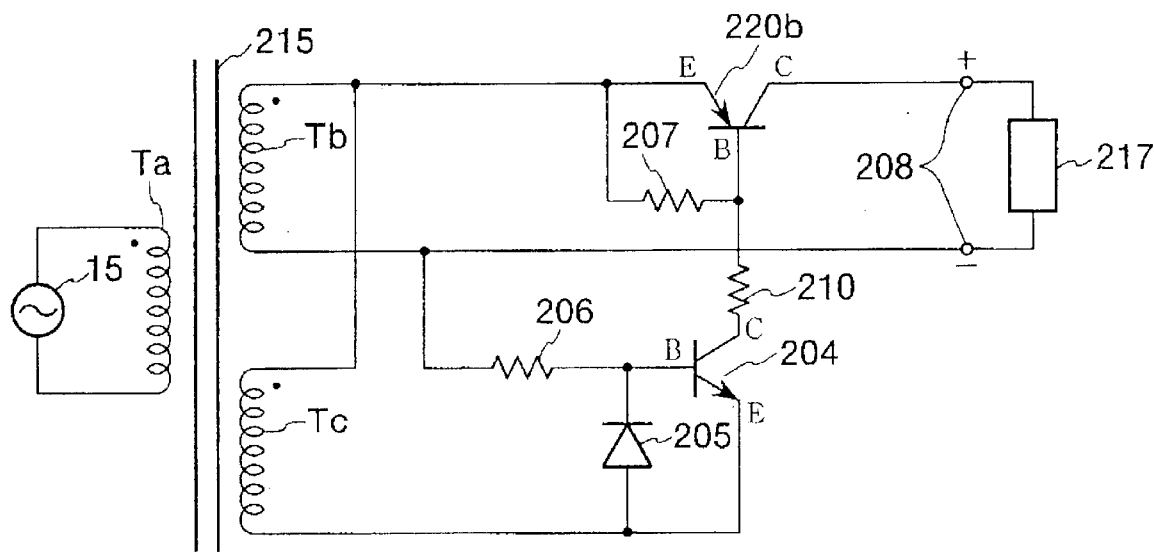

FIG.53
(A)
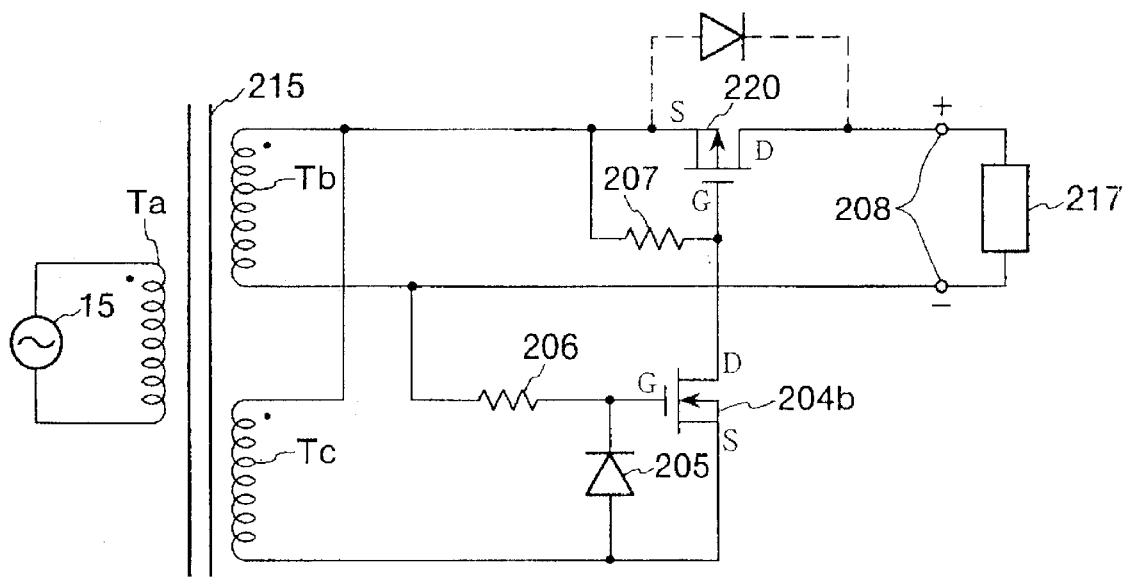
(B)
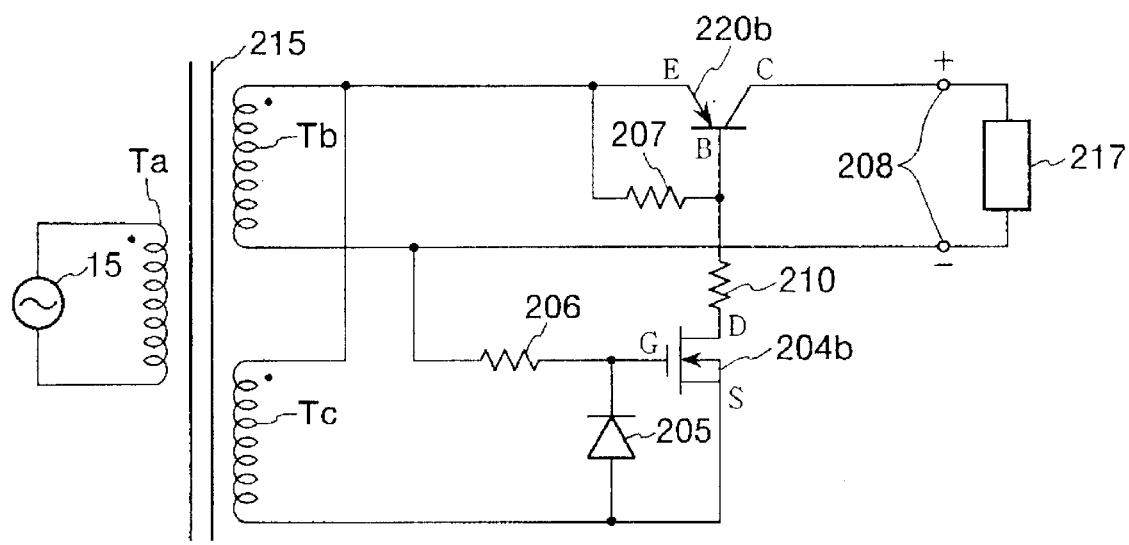

FIG.55
(A)
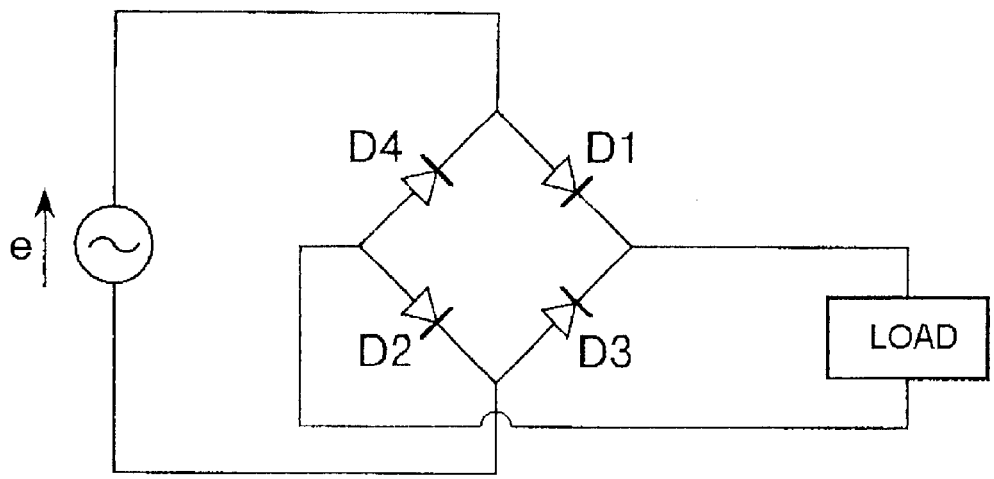
(B)
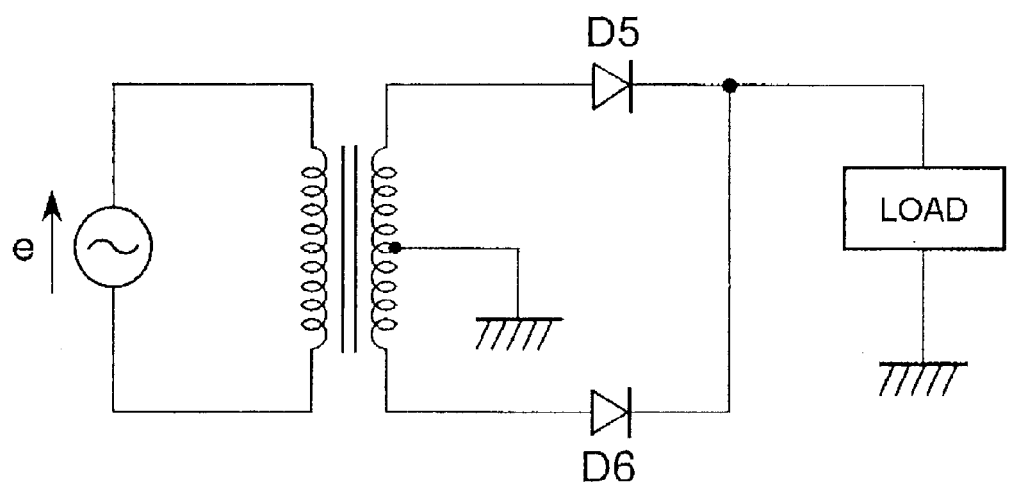

FIG.56
(A)
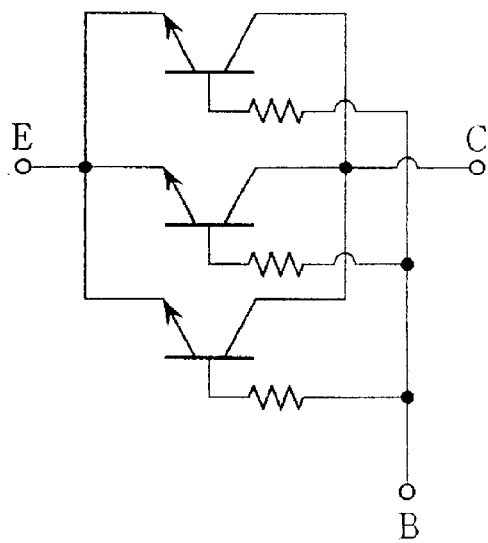
(B)
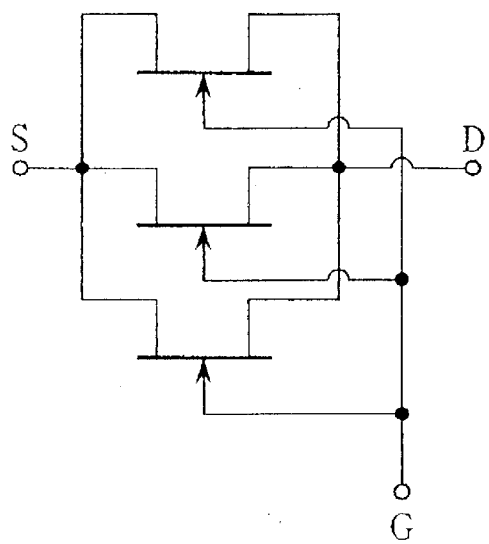
(C)
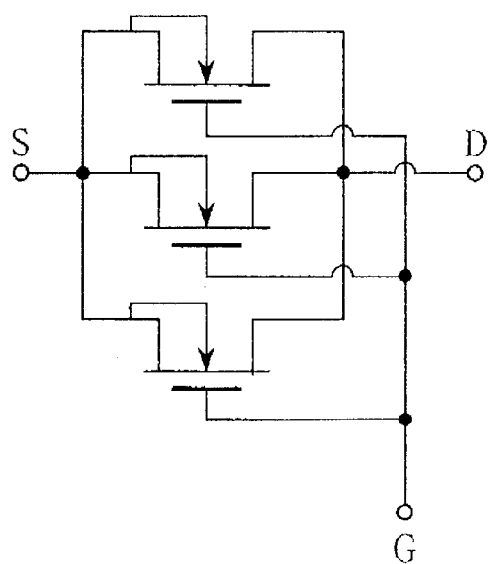

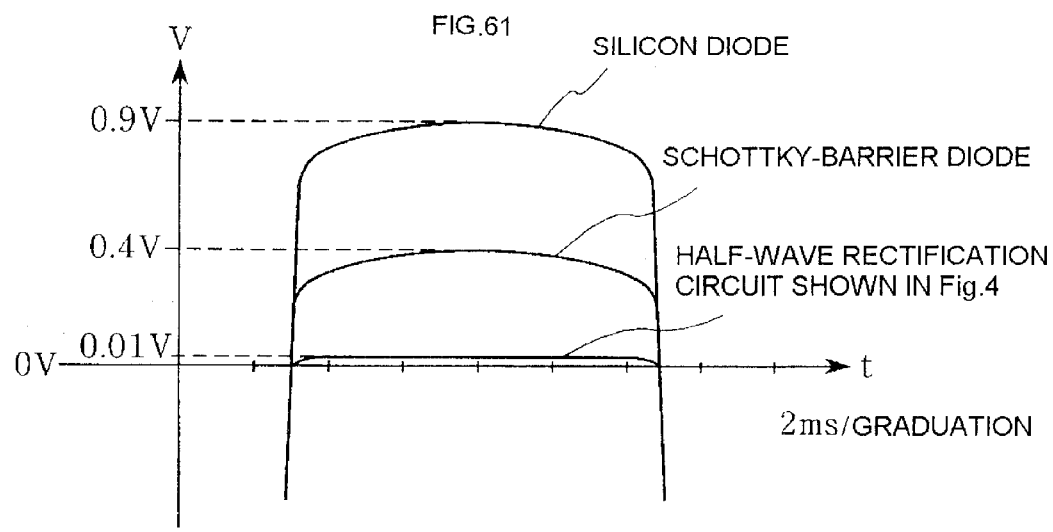
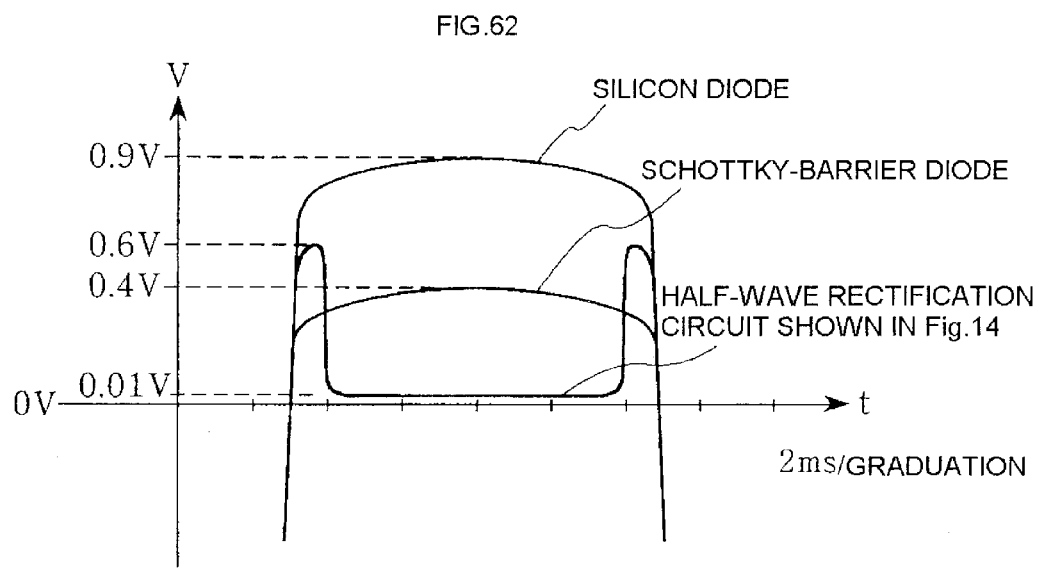

RECTIFICATION CIRCUIT

DETAILED DESCRIPTION OF THE INVENTION

1. Technical Field

The present invention relates to an electric circuit for rectifying an alternating current, more particularly to an electric circuit for rectifying an alternating current with a small loss.

2. Background Art

A rectification circuit has been used as a circuit for converting an alternating voltage to a direct voltage.

The conventional rectification circuit is comprised of a silicon diode, a schottky-barrier diode, or the like.

In the conventional circuit, however, a forward voltage Vf of a diode is approximately 0.4V to 1.0V, as shown in FIG. 3 showing a relationship between the voltage Vf and a current If. Therefore, the voltage drop, in other words, a loss in the diode of the rectification circuit, is large. As a result, inefficient rectification has been a problematical matter.

The present invention has been made in consideration of the above, and it is an object of the present invention to provide an electric circuit which can rectify an alternating current with a small loss.

DISCLOSURE OF INVENTION

To achieve the above described object, an electric circuit according to a first aspect of the present invention comprises a transistor and a control circuit connected to said transistor, and is characterized in that said transistor comprises a current path and a control terminal, receives a target voltage to be rectified at one end of said current path, and is controlled by said control circuit to be activated or inactivated to output a rectified voltage at the other end of said current path; and said control circuit is connected to at least one end of said current path of said transistor and said control terminal, activates said transistor when a reverse voltage is applied to said current path, inactivates said transistor when a forward voltage is applied to said current path, and controls a signal to be applied to said control terminal for activating or inactivating said transistor to make said transistor rectify said target voltage.

According to the electric circuit of the first aspect of the present invention, the transistor is activated when the voltage applied to the current path of the transistor is a reverse voltage, and is inactivated when it is a forward voltage. Therefore, only a voltage having one polarity is applied to a load which is connected to the transistor. And, a forward voltage is applied to the current path when the transistor is inactivated, therefore, a high withstanding voltage can be obtained.

The electric circuit according to a second aspect of the present invention comprises a transistor and a control circuit connected to said transistor, and is characterized in that said transistor comprises a current path and a control terminal, receives a target voltage to be rectified at one end of said current path, and outputs a rectified voltage at the other end of said current path by being activated or inactivated in accordance with control of said control circuit; and said control circuit is connected to both ends of said current path and said control terminal, detects the potential difference between the both ends of said current path, and controls a signal to be applied to said control terminal for activating or inactivating said transistor, so as to activate said transistor when a reverse voltage of said transistor is applied to said current path of said transistor and inactivate said transistor when a forward voltage of said transistor is applied to said current path, to make said transistor rectify said target voltage.

The electric circuit according to a third aspect comprises a transistor and a control circuit connected to said transistor, and is characterized in that said transistor comprises a current path and a control terminal, receives a target voltage to be rectified at one end of said current path, and outputs a rectified voltage to the other end of said current path by being activated or inactivated in accordance with control of said control circuit; and said control circuit is connected to both ends of said current path and said control terminal, detects the potential difference between the both ends of said current path, and controls a signal to be applied to said control terminal for activating or inactivating said transistor so as to activate said transistor when a reverse voltage is applied to said current path of said transistor and inactivate said transistor when a forward voltage is applied to said current path to make said transistor rectify said target voltage.

According to the electric circuit of the second and third aspects of the present invention, the voltage which is applied between the both ends of the current path of the transistor or the polarity of the voltage is detected, and the transistor is activated when the voltage is in the reverse direction and the transistor is inactivated when the voltage is in the forward direction. Therefore, only voltage in one polarity is applied to a load which is connected to the other end side of the current path of the transistor. And, the forward voltage is applied to the current path when the transistor is inactivated, therefore, a high withstanding voltage can be obtained.

In thus structured electric circuit, there is a way to activate/inactivate the transistor based on values for the supplied target voltage to be rectified or its polarity. However, a reverse current flow is caused by this method because the source voltage becomes lower than the voltage at the load while the transistor is being activated, when a capacitor or a battery is used as the load retaining the voltage. By the present invention, the target voltage to be rectified can be rectified without such a problem because the voltage to be applied to the current path of the transistor is detected.

Said transistor is, for example, a bipolar transistor. In this case, both ends of said current path are the emitter and collector of said bipolar transistor, said control terminal is the base of said bipolar transistor, and said control circuit comprises means for detecting voltage and/or its polarity between said emitter and said collector, and for supplying a voltage and a current to said base.

If said bipolar transistor is an NPN type bipolar transistor:

one end of said current path is emitter of said NPN bipolar transistor, the other end of said current path is collector of said NPN bipolar transistor, and said control terminal is base of said NPN bipolar transistor; and said control circuit supplies a voltage and a current for activating said NPN transistor to said base when potential in positive polarity, which is higher than that applied to said collector, is applied to said emitter, and supplies a voltage and a current for inactivating said NPN transistor to said base when voltage in positive polarity, which is lower than that applied to said collector, is applied to said emitter.

If said bipolar transistor is a PNP type bipolar transistor:

one end of said current path is emitter of said PNP bipolar transistor, the other end of said current path is collector of said PNP bipolar transistor, and said control terminal is base of said PNP bipolar transistor; and said control circuit supplies a voltage and a current for activating said PNP transistor to said base when potential in positive polarity, which is higher than that applied to said emitter, is applied to said collector, and supplies a voltage and a current for inactivating said PNP transistor to said base when voltage in positive polarity, which is lower than that applied to said emitter, is applied to said collector.

Said bipolar transistor comprises the emitter and the collector both having substantially the same thickness of semiconductor layers. According to such a structure, the emitter and the collector are not distinguished substantially, and it can save current amplification factor largely during activation. Moreover, high withstanding voltage can be obtained.

Said transistor may be replaced with a field effect transistor.

In this case, both ends of said current path are source and drain of said field effect transistor, said control terminal is gate of said field effect transistor, and said control circuit comprises means for detecting voltage and/or its polarity between said source and said drain, and for applying a control voltage to said gate in accordance with the detected voltage.

If said field effect transistor is an N-channel type field effect transistor:

one end of said current path is source of said N-channel field effect transistor, the other end of said current path is drain of said N-channel field effect transistor, and said control terminal is gate of said N-channel field effect transistor; and said control circuit comprises means for applying an activation voltage to said gate when voltage in positive polarity, which is higher than that applied to said drain, is applied to said source, and for supplying an inactivation voltage to said gate when voltage in positive polarity, which is lower than that applied to said drain, is applied to said source.

If said field effect transistor is a P-channel type field effect transistor;

said control circuit comprises means for applying voltage for activating said P-channel field effect transistor to said gate when voltage in positive polarity, which is lower than that applied to said drain, is applied to said source, and applying voltage for inactivating said P-channel field effect transistor to said gate when voltage in positive polarity, which is higher than that applied to said drain, is applied to said source.

Said control circuit comprises, for example, an amplification circuit, such as an operational amplifier, whose one input terminal is connected to one end of said current path of said transistor, whose other input terminal is connected to the other end of the current path of said transistor, and whose output terminal is connected to said control terminal of said transistor. In this case, a diode, which is connected parallel in reverse between said one and the other input terminals of said amplification circuit, and a constant current source, which is inserted between said one input terminal and the one end of said current path or between said other input terminal and the other end of said current path, may be further disposed thereon.

The operational amplifier may be one which performs as not only an amplifier but also a comparator. In other words, it may be one whose output voltage is saturated in accordance with input voltage.

The electric circuit according to a fourth aspect of the present invention comprises a transistor and a control circuit connected to said transistor, and is characterized in that said transistor comprises a current path and a control terminal, receives a target voltage to be rectified at one end of said current path, and is controlled by said control circuit to be activated and inactivated to output a rectified voltage to the other end of said current path; and said control circuit is connected to said current path and said control terminal of said transistor, and controls a signal to be applied to said control terminal in accordance with the direction of the current flowing through a node between one end of said current path and an external circuit, for activating or inactivating said transistor to make said transistor rectify said target voltage.

In the electric circuit according to the fourth aspect of the present invention, the transistor is activated and inactivated in accordance with the direction of the current flowing at the connection node between the current path of the transistor and the external circuit. When the transistor is activated, said current flows via the current path of the transistor and is supplied to a load circuit. Therefore, the rectified current can be applied to the load. Moreover, because forward voltage is applied when the transistor is inactivated, high withstanding voltage can be obtained.

Said transistor is, for example, a bipolar transistor. In this case, both ends of said current path are emitter and collector of said bipolar transistor, and said control terminal is base of said bipolar transistor. Said control circuit supplies a voltage and a current to said base, and activates said bipolar transistor.

If said bipolar transistor is an NPN type bipolar transistor;

one end of said current path is emitter of said NPN bipolar transistor, the other end of said current path is collector of said NPN bipolar transistor, and said control terminal is base of said bipolar transistor. Said control circuit detects the direction of the current flowing at a node between said emitter and said external circuit, and supplies a voltage and a current for activating said NPN transistor when the current in the predetermined direction is detected.

In this case, a diode may be connected between said emitter and said collector or between said emitter and said base so that the current in the predetermined direction flow at said node even if said NPN bipolar transistor is not activated.

If said bipolar transistor is a PNP type bipolar transistor;

one end of said current path is emitter of said PNP bipolar transistor, the other end of said current path is collector of said PNP bipolar transistor, and said control terminal is base of said PNP bipolar transistor. Said control circuit detects the direction of the current flowing at the node between said emitter and said external circuit, and supplies a voltage and a current for activating said PNP transistor to said base when the current in the predetermined direction are detected.

In those cases, a diode may be connected between said emitter and said collector or between said emitter and said base so that the current in the predetermined direction flow at said node even if said NPN bipolar transistor is not activated.

Said transistor is, for example, a field effect transistor;

both ends of said current path are source and drain of said field effect transistor, and said control terminal is gate of said field effect transistor; and said control circuit comprises means for applying the gate voltage, which activates said field effect transistor in an area, to said gate.

If said field effect transistor is an N-channel type field effect transistor, for example, one end of said current path is source of said N-channel field effect transistor, the other end is drain of said N-channel field effect transistor, and said control terminal is gate of said field effect transistor. Said control circuit comprises means for applying voltage, which activate said N-channel field effect transistor, to said gate when the current flowing at the node between said source and said external circuit are in the predetermined direction.

If said field effect transistor is the N-channel type field effect transistor, said control circuit comprises means for detecting, for example, the current flowing from said source to said drain via a parasitic diode to activate said N-channel field effect transistor.

A diode may be connected between said source and said drain, or a voltage regulation diode may be connected between said gate and said source.

If said field effect transistor is a P-channel type field effect transistor, for example, one end of said current path is source of said P-channel field effect transistor, the other end thereof is drain of said P-channel field effect transistor, and said control terminal is gate of said P-channel field effect transistor. Said control circuit comprises means for applying voltage, which activates said P-channel field effect transistor, to said gate when the current flowing at the node between said source and said external circuit are in the predetermined direction.

Said control circuit may comprise means for detecting a current flowing from said drain to said source via a parasitic diode of said P-channel field effect transistor to activate said P-channel field effect transistor.

In those cases, a diode may be connected between said source and said drain, or a voltage regulation diode may be connected between said gate and said source.

Said control circuit comprises, for example, a transformer having a primary winding which is connected to one end of said current path of said transistor and a secondary winding which is magnetically connected to said primary winding, and a bias circuit which is connected to said secondary winding of said transformer and controls a signal to be supplied to said control terminal of said transistor in accordance with current which is generated at said secondary winding.

Said control circuit may comprise, for example, means for converting the inductive current at said secondary winding into a voltage signal to apply it to said control terminal. In this case, said control circuit comprises, for example, a conversion circuit for converting said inductive current at the secondary winding into a voltage signal, and means for amplifying the voltage signal converted by said conversion circuit and applying the amplified signal to said control terminal of said transistor.

Said control circuit comprises, for example, an active element which requires electricity, and said rectified voltage is supplied to said active element as the electricity.

The electric circuit according to a fifth aspect of the present invention comprises a transistor and a control circuit connected to said transistor, and is characterized in that said transistor comprises a current path and a control terminal, receives a target voltage to be rectified at one end of said current path from the power source, is connected to a resistance load via the other end of said current path, and is controlled by said control circuit to be activated and inactivated to output a rectified voltage to the other end of said current path; and a predetermined reference potential is applied to said control terminal.

This is a very simple structure, however, the rectified voltage can be applied to the resistance road.

For example, said control terminal of said transistor, said power source, and said load are grounded at a substantially common point.

It is to be desired that said control circuit should activate said transistor under its saturation. Under the saturation, the emitter and the collector of the bipolar transistor have almost the same potential. Therefore, the voltage drop in the transistor seldom occurs while the bipolar transistor is activated, that is, at the moment of applying the voltage which is rectified by the load. Therefore, it is capable of efficient rectification with a small loss.

In the first to fifth inventions, the target voltage to be rectified may be an alternate signal or an alternate signal (a pulsating current) to which a direct current component is added, and its waveform may be any one of the sine wave, the triangle wave, the rectangular wave, or the like.

The meaning of "connected" here is not limited to "wire-bound". It includes cases of physical or electrical connection with the magnetism, an electric field, the light, or the like. For example, if a transistor, which is activated and inactivated in accordance with the amount of the light applied to its control terminal, is used, a control circuit and the control terminal are connected each other with the light. If a transistor which responds to the magnetic field of a Hall element, or the like, its control terminal and the control circuit are connected each other with the magnetic field.

The electric circuit according to a sixth aspect of the present invention comprises a transistor and a control circuit connected to said transistor, and is characterized in that said transistor comprises a current path and a control terminal, receives a target voltage to be rectified at one end of said current path, and is controlled by said control circuit to be activated or inactivated to output rectified voltage to the other end of said current path; and said control circuit, which is connected to at least one end of said current path of said transistor and said control terminal, makes said transistor rectify said target voltage to be rectified by controlling a signal to be applied to said control terminal to activate or inactivate said transistor so that said transistor is activated when a reverse voltage is applied to said current path and said transistor is inactivated when a forward voltage is applied to said current path, said electric circuit is characterized in that said control circuit comprises:

a transformer comprising a primary winding to which electricity is provided, a secondary winding, which is inductively connected to said primary winding, for taking an output to be supplied to a load, and a detection winding, which is inductively connected to said primary winding, showing an output corresponding to an output of said secondary winding, and detection means for inputting an output voltage of said secondary winding and an output voltage of said detection winding, for detecting whether said reverse voltage is applied to said current path and whether said forward voltage is applied to said current path, and for applying a signal indicating a result of the detection to said control terminal of said transistor.

The electric circuit according to a seventh aspect of the present invention comprises a transistor and a control circuit connected to said transistor, and is characterized in that said transistor comprises a current path and a control terminal, receives a target voltage to be rectified at one end of said current path, and is controlled by said control circuit to be activated or inactivated to output rectified voltage to the other end of said current path; and said control circuit, which is connected to at least one end of said current path of said transistor and said control terminal, makes said transistor rectify said target voltage to be rectified by controlling a signal to be applied to said control terminal to activate or inactivate said transistor so that said transistor is activated when the reverse voltage is applied to said current path and said transistor is inactivated when the forward voltage is applied to said current path, said electric circuit is characterized in that said control circuit comprises:

a first transformer comprising a primary winding to which an electricity is provided, and a second winding, which is inductively connected to said primary winding, for taking an output to be supplied to a load;

a second transformer, which is disposed being parallel to said first transformer while being insulated from said first transformer, comprising a first winding to which an electricity is provided, and a detection winding, which is inductively connected to said primary winding, showing an output corresponding to an output of said secondary winding of said first transformer; and detection means for inputting an output voltage of said secondary winding and an output voltage of said detection winding, for detecting whether said reverse voltage is applied to said current path and whether said forward voltage is applied to said current path, and for applying a signal indicating a result of the detection to said control terminal of said transistor.

The electric circuits according to the sixth and the seventh aspects can rectify the alternate voltage output from the transformer.

The electric circuit according to an eighth aspect of the present invention comprises a semiconductor switching element and a control circuit for controlling said semiconductor switching element, and is characterized in that said semiconductor switching element comprises a current path whose one end is connected to a power source side and the other end is connected to a load side, and is controlled by said control circuit to be activated and inactivated; and said control circuit is connected to both ends of said current path of said semiconductor switching element, detects voltage to be applied to said current path, and supplies a signal to said semiconductor switching element in accordance with a result of the detection to activate or inactivate said semiconductor switching element.

For example, a bipolar transistor, a field effect transistor, a photo transistor, a Hall element, a thyristor, or the like may be used as the semiconductor switching element.

The control circuit applies a control signal to the semiconductor switching element in accordance with the characteristics of the semiconductor switching element. For example, if the semiconductor switching element is the bipolar transistor, a voltage and a current to be supplied to base are controlled to activate and inactivate the bipolar transistor. If the semiconductor switching element is the field effect transistor, an electric field to be applied to gate is controlled to activate and inactivate the field effect transistor. If there is a gate electrode, voltage to be applied to the gate electrode is controlled. If the semiconductor switching element is the photo transistor, quantity (or strength) of the light to be irradiated to base is controlled to activate and inactivate the photo transistor. If the semiconductor switching element is the Hall element, a magnetic field (magnetic flux) is controlled to activate and inactivate the Hall element.

BRIEF DESCRIPTION OF DRAWINGS

FIGS. 5(A) and (B) are circuit diagrams showing concrete examples of components of the rectification circuit shown in FIG. 1.

FIGS. 6(A) to (C) are timing charts showing operations of the rectification circuits shown in FIGS. 5(A) and (B).

FIGS. 9(A) and (B) are circuit diagrams showing examples of modified circuits of the rectification circuits shown in FIGS. 5(A) and (B).

FIG. 10 is a circuit diagram showing an example of a modified circuit of the rectification circuit shown in FIG. 7.

FIGS. 11(A) to (E) are timing charts showing the basic operations of the rectification circuits shown in FIGS. 8 to 10.

FIG. 18 is a circuit diagram showing an example of a modified circuit of the rectification circuit shown in FIG. 13.

FIG. 19 is a circuit diagram showing an example of a modified circuit of the rectification circuit shown in FIG. 14.

FIGS. 22(A) and (B) are circuit diagrams showing examples of modified circuits of the rectification circuits shown in FIGS. 5(A) and (B).

FIGS. 23(A) and (B) are circuit diagrams showing examples of modified circuits of the rectification circuits shown in FIGS. 9(A) and (B).

FIGS. 46(A) and (B) are diagrams showing examples of the structural elements forming rectification circuits which activate and inactivate a transistor with an output from a secondary winding of a transformer to rectify an alternating current.

FIGS. 47(A) and (B) are diagrams showing examples of the structural elements forming rectification circuits which activate and inactivate a transistor with an output from a secondary winding of a transformer to rectify an alternating current.

FIGS. 48(A) and (B) are diagrams showing examples of the structural elements forming rectification circuits which activate and inactivate a transistor with an output from a secondary winding of a transformer to rectify an alternating current.

FIGS. 51(A) and (B) are diagrams showing examples of the structural elements forming rectification circuits which activate and inactivate a transistor with an output from a secondary winding of a transformer to rectify an alternating current.

FIGS. 52(A) and (B) are diagrams showing examples of the structural elements forming rectification circuits which activate and inactivate a transistor with an output from a secondary winding of a transformer to rectify an alternating current.

FIGS. 53(A) and (B) are diagrams showing examples of the structural elements forming rectification circuits which activate and inactivate a transistor with an output from a secondary winding of a transformer to rectify an alternating current.

FIG. 55(A) is a circuit diagram showing an example of the structural elements forming a full-wave rectification circuit comprising bridge-connected rectification circuits, and FIG. 55(B) is a circuit diagram showing an example of the structural elements forming a full-wave rectification circuit comprising a transformer, whose secondary winding has a middle point, and two rectification circuits.

FIGS. 56(A) to (C) are circuit diagrams showing examples of rectification circuits having a plurality of transistors which are connected parallel with each other.

FIG. 61 is a diagram showing the characteristics of the rectification circuit which FIG. 12 exemplifies.

FIG. 62 is a diagram showing the characteristics of the rectification circuit which FIG. 14 exemplifies.

BEST MODE FOR CARRYING OUT THE INVENTION

A best mode for carrying out the invention will now be described with reference to accompanying drawings.
(Rectification Circuit Using NPN Bipolar Transistor)

Figure 1:
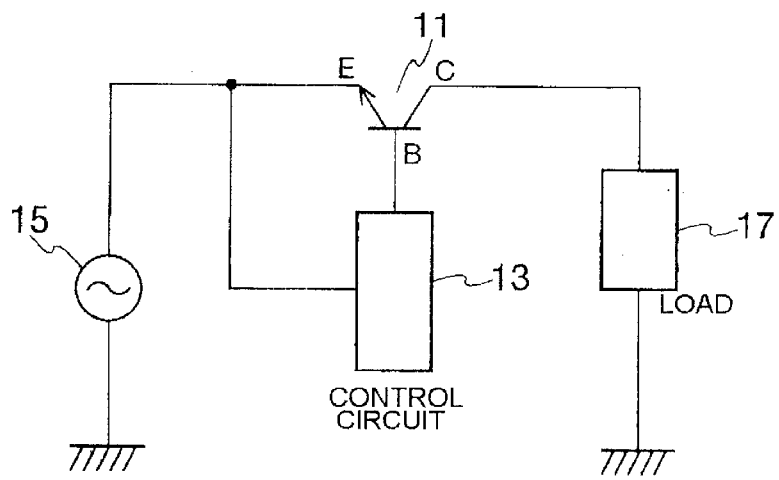
FIG. 1 is a circuit diagram showing a rectification circuit according to an embodiment of the present invention.

FIG. 1 is a circuit diagram showing a rectification circuit according to an embodiment of the present invention.

The rectification circuit is comprised of an NPN bipolar transistor 11, and a control circuit 13 connected to base B of the bipolar transistor 11.

Emitter E of the bipolar transistor 11 is connected to an alternating current source 15, and a collector C of the bipolar transistor 11 is connected to a load 17.

The control circuit 13 is connected to the alternating current source 15. When the polarity of a source voltage is positive, a bias voltage (which is satisfactorily higher than an emitter voltage), which is for activating the bipolar transistor 11 under saturation, and an electric current are applied to the base B. On the other hand, when the polarity of an output voltage from the alternating current source 15 is negative, a very low voltage (whose polarity is negative against the emitter voltage), which is enough for inactivating the bipolar transistor 11, is applied to the base B to inactivate the bipolar transistor 11.

When the load 17 has its own voltage as in the case where the load 17 is a secondary battery, the control circuit 13 applies the bias voltage (which is satisfactorily higher than the emitter voltage), which is enough for activating the bipolar transistor 11 under saturation, and the electric current to the base B when the emitter voltage is higher than a collector voltage (when the emitter voltage is higher than the collector voltage while the polarity of the emitter voltage is positive). On the other hand, when the emitter voltage is lower than the collector voltage, the very low voltage (whose polarity is negative against the emitter voltage) which is enough for inactivating the bipolar transistor 11 is applied to the base B to inactivate the bipolar transistor 11.

An operation of the rectification circuit shown in FIG. 1 will now be described with reference to the timing charts shown in FIGS. 2(A) to (E).

Figure 2:
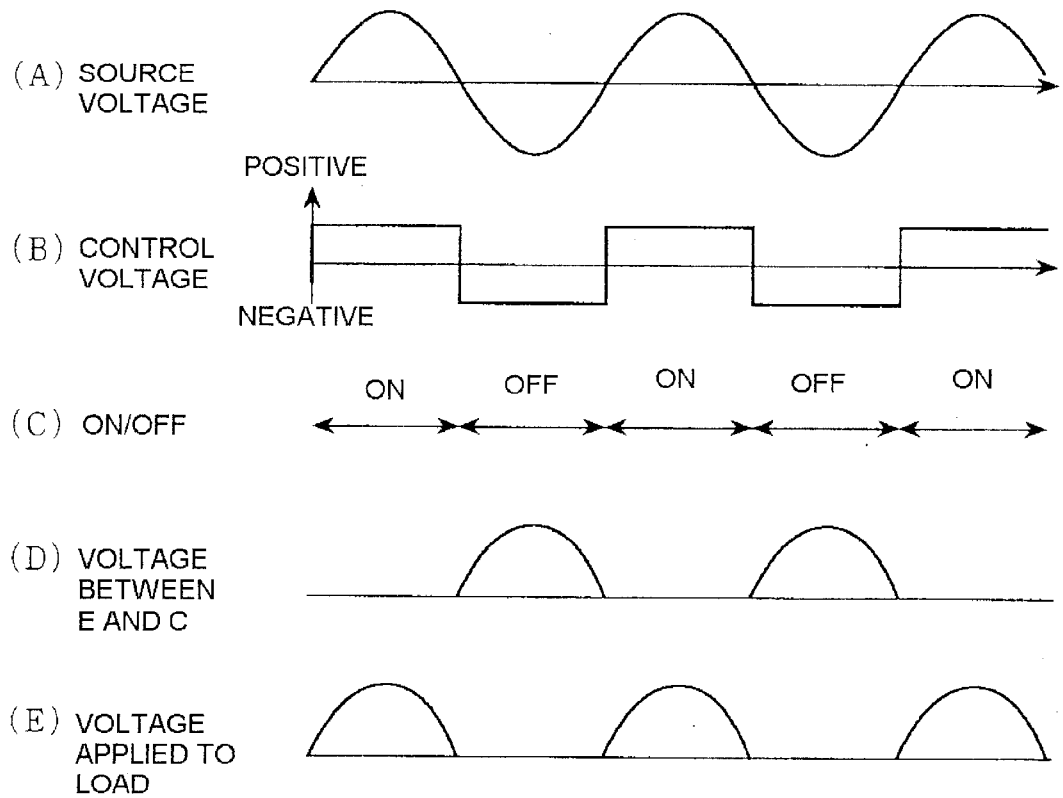
FIGS. 2(A) to (E) are timing charts for explaining an operation of the rectification circuit shown in FIG. 1.

FIG. 2(A) shows the waveform of the source voltage output from the alternating current source 15. FIG. 2(B) shows the waveform of a voltage (a control voltage) for a control signal output from the control circuit 13. FIG. 2(C) shows activated/inactivated periods of the bipolar transistor 11. FIG. 2(D) shows waveform of a voltage to be applied between the emitter and the collector of the bipolar transistor 11. FIG. 2(E) shows the waveform of a voltage to be applied to the load 17.

First, when the polarity of the source voltage shown in FIG. 2(A) becomes positive (more precisely, when the emitter voltage becomes higher than the collector voltage), the control circuit 13 applies the control signal of a positive polarity, which is shown in FIG. 2(B), to the base B of the bipolar transistor 11. In response to the control signal, the bipolar transistor 11 is activated as shown in FIG. 2(C).

At that time, a voltage higher than the voltage applied to the collector C is applied to the emitter E of the bipolar transistor 11, unlike in the ordinary case (where the voltage applied to the collector C is higher than the voltage applied to the emitter E). Thus, the bipolar transistor 11 functions as, so called, an inverse transistor. However, the bipolar transistor 11 can retain satisfactorily large current amplification factor (hfe), and supply a current to the current path between the emitter E and the collector C which is satisfactorily greater than a bias current (base current).

Figure 3:
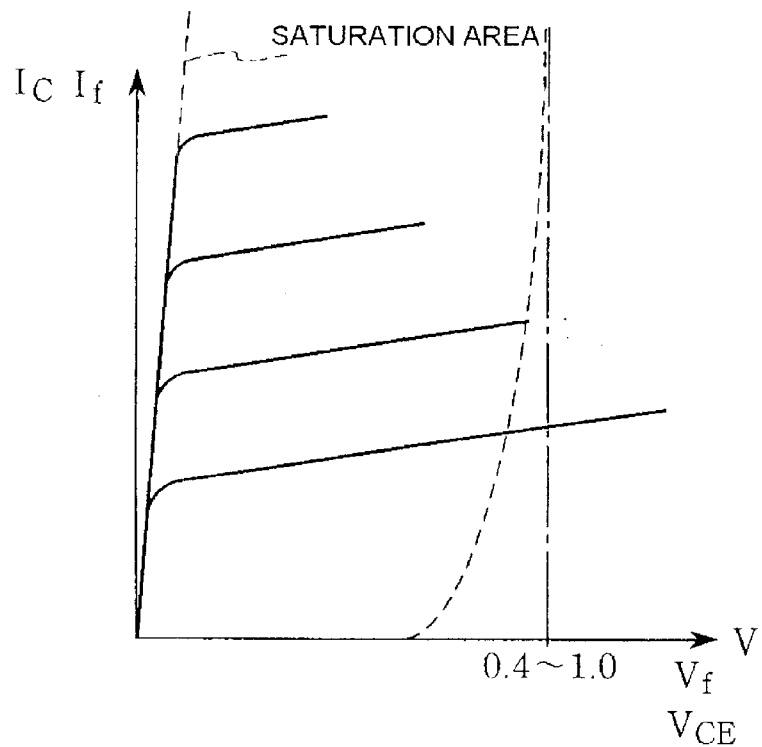
FIG. 3 a graph showing ground characteristics of emitter of an NPN bipolar transistor and current/voltage characteristics of a diode.

Since the driving ability of the control circuit 13 is very high, considerable minority carriers are implanted into the base B of the bipolar transistor 11, and the bipolar transistor 11 is operated under the saturation. As shown in the characteristic diagram of FIG. 3, the voltage between the emitter E and the collector C of the bipolar transistor 11 is approximately 0 (shunted) under the saturation, and the voltage applied to the emitter E is almost equal to the voltage applied to the collector C. Moreover, those voltages are much lower than the forward voltage for the diode which is shown by a broken line.

Therefore, the voltage drop in the bipolar transistor 11 is approximately 0 as shown in FIG. 2(E), and a voltage which is almost equal to the source voltage is applied to the load 17 as shown in FIG. 2(D).

On the other hand, when the polarity of the source voltage shown in FIG. 2(A) becomes negative, the control circuit 13 supplies a control signal having a negative polarity to the base B of the bipolar transistor 11, as shown in FIG. 2(B). Thus, the bipolar transistor 11 is inactivated as shown in FIG. 2(C), a ground voltage is applied to the load 17 as shown in FIG. 2(E), and the source voltage is applied between the emitter E and the collector C as shown in FIG. 2(D) (FIG. 2(D) shows the voltage applied to the collector C and its standard voltage being applied to the emitter E). At the same time, the bipolar transistor 11 shows forward connection, and a withstanding voltage, which is mainly determined by a withstanding voltage of PN junction between the collector C and the base B, can be obtained.

As a result of such processing being repeated, a half-wave rectified voltage is applied to the load 17 as shown in FIG. 2(E).

According to the structure shown in FIG. 1, a voltage drop between the emitter E and the collector C becomes approximately 0 (for example, around 5 mV to 40 mV) when the bipolar transistor 11 is activated. Thus, the alternating voltage can be rectified with a small loss.

Moreover, a high withstanding voltage which is determined by a withstanding voltage between the collector C and the base B can be obtained when the bipolar transistor 11 is inactivated.

Furthermore, because the bipolar transistor 11 is switched on or off at the time the target voltage to be rectified is nearly 0, the overshoot and the undershoot does not occur in a rectified voltage.

It is preferred that the single bipolar transistor be used as the bipolar transistor 11. A transistor having so called Darlington structure is not desirable one because a bias current (base current) does not flow when the transistor is activated.

The target voltage to be rectified is not limited to a sine wave voltage such as that shown in FIG. 2(A). A triangular or rectangular wave voltage, or the like may be used. A voltage whose average value is not 0, in other words, a voltage having an alternating current component to which a direct current component has been added, may be used.

A concrete example of the control circuit 13 will now be described with reference to FIG. 4.

This example is one in which the control circuit 13 is comprised of an OP-amp (operational amplifier) 21.

Figure 4:
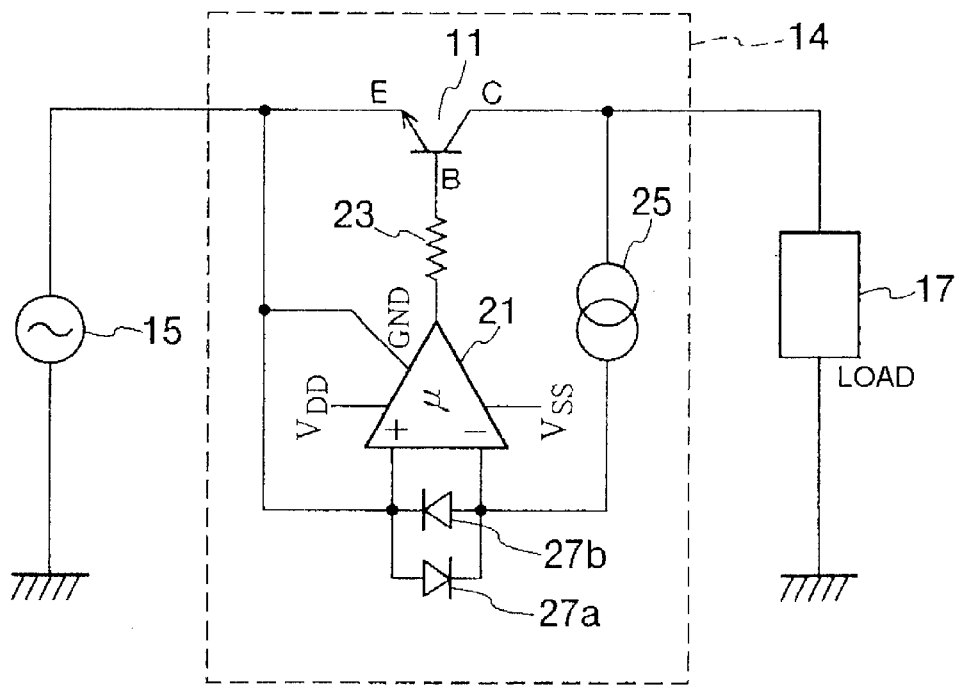
FIG. 4 is a circuit diagram showing a concrete example of components of the rectification circuit shown in FIG. 1.

In FIG. 4, an output terminal of the OP-amp 21 is connected to the base B of the NPN bipolar transistor 11 via a resistor 23 for regulating (limiting) current. A positive input terminal of the OP-amp 21 is connected to the emitter E of the bipolar transistor, and a negative input terminal thereof is connected to the collector C of the bipolar transistor via a constant current source 25. Further, a diode 27a and a diode 27b, which are parallel with and opposed to each other, are connected between the positive input terminal and the negative input terminal.

The OP-amp 21 has the ability to drive a satisfactorily large current which is larger than (may be twice as large as) the bias current for the bipolar transistor. The ground (reference) potential of the power supplied to the OP-amp 21 from the power source is designed to coincide with the emitter potential of the bipolar transistor 11 (the ground source to be supplied to the OP-amp 21 may be supplied to the emitter E if the power source is single).

A portion enclosed by a broken line 14 in FIG. 4, that is, the bipolar transistor 11, the OP-amp 21, the resistor 23, a constant current circuit 25, and the diodes 27a and 27b form an integrated circuit (IC). This IC 14 comprises a power source terminal to which the target voltage to be rectified is applied, an output terminal to which the rectified voltage is applied, and two source terminals VDD and VSS for the OP-amp 21.

In this structure, when a voltage of the emitter E of the bipolar transistor 11 becomes higher than a voltage for the collector C in positive polarity, a forward voltage is applied to the diode 27a, and a reverse voltage is applied to the diode 27b. As a result, the voltage drop, due to the forward current in the diode 27a occurs between the input terminals of the OP-amp 21. The OP-amp 21 amplifies the voltage and applies a control signal having a positive polarity to the base B of the bipolar transistor 11. Thus, the bipolar transistor 11 is activated and is operated in a saturation area, the emitter E and the collector C become conductive and voltages for the emitter E and the collector C become almost equal to each other. Therefore, the source voltage is applied to the load 17 with almost no loss.

The forward current in the diode 27a is regulated to be constant by the constant current source 25 to prevent the OP-amp 21 and the diode 27a from being broken.

When the polarity of the source voltage becomes negative and the voltage for the emitter E of the bipolar transistor 11 becomes lower than the voltage for the collector C in positive polarity, a reverse voltage is applied to the diode 27a and a forward voltage is applied to the diode 27b. As a result, the voltage drop due to the forward current in the diode 27b occurs between both the input terminals of the OP-amp 21. The voltage is amplified by the OP-amp 21 and a control signal having a negative polarity is applied to the base of the bipolar transistor 11. In response to the control signal, the bipolar transistor 11 is inactivated, and almost the whole source voltage is applied between the emitter E and the collector C of the bipolar transistor 11 because the emitter E and the collector C become non conductive, and the ground voltage is applied to the load 17.

The forward current in the diode 27b is regulated to be constant by the constant current source 25 to prevent the OP-amp 21 and the diode 27b from being broken.

In such a manner, also the rectification circuit shown in FIG. 4 can rectifies the alternating source voltage efficiently, as shown in FIGS. 2(A) to (E).

Furthermore, it is unnecessary for externally supplying a control signal to the IC 14.

In this embodiment, the bipolar transistor 11 is switched on and off in response to the polarity of the voltage between the emitter E and the collector C, therefore, a reverse current is prevented from flowing even if the load 17 has a voltage. For example, if the bipolar transistor 11 is switched on and off merely in response to the polarity of an output voltage from the alternating current source 15 if the load 17 is a secondary battery having a constant voltage, an electric current flows in reverse (the battery is discharged) when the source voltage is lower than an output voltage of the secondary battery. However, such a problem does not occur with the structure shown in FIG. 4.

The constant current source 25 may be replaced with a resistor for regulating the current, a constant current diode, or the like. An arbitrary diode may be used instead of the operational amplifier.

The group of the diodes 27a and 27b may be replaced with Zener diodes or resistors.

FIGS. 5(A) and (B) show other examples of the rectification circuit.

In these examples, the control circuit 13 of the rectification circuit is comprised of a transformer (hereinafter referred as a CT (Current Transformer)) 31 and an OP-amp 33.

A primary winding of the current transformer 31 intervenes between a current path from the power source 15 and the emitter E of the bipolar transistor 11.

In FIG. 5(A), a diode 11b is connected between the emitter E and the collector C of the bipolar transistor 11 so that the direction from the emitter E to the collector C is the forward direction. A shottky-barrier diode, a first recovery diode, or the like may be connected therebetween, instead of the diode 11b.

In FIG. 5(B), the diode 11b is connected between the emitter E and the base B of the bipolar transistor 11 so that the direction from the emitter E to the base B is the forward direction.

A secondary winding of the current transformer 31 is magnetically connected to the primary winding, and one end thereof is connected to the power source 15. The primary winding generates an electromotive force and the secondary winding generates a reversed electromotive force (showing an additive polarity).

Diodes 35 for regulating the voltage, which are opposite in direction from each other, are connected between one end and the other end of the secondary winding.

Further, a voltage at the one end of the secondary winding is applied to a negative input terminal of the OP-amp 33 as is, and a voltage at the other end of the secondary winding is applied to a positive input terminal of the OP-amp 33 via a resistor 37. Slight offset in the negative polarity is added to the OP-amp 33. As a result, the output from the OP-amp 33 shows the negative polarity when there is no intentional input to the OP-amp 33, thus, the bipolar transistor 11 is prevented from being activated erroneously by noise, or the like. Instead of the resistor 37, a direct current source such as a battery may be connected so that the negative side of the direct current source is connected to the positive input terminal.

An output terminal of the OP-amp 33 is connected to the base B of the bipolar transistor 11 via a current regulating resistor 39.

The emitter E of the bipolar transistor 11 is connected to the ground voltage terminal GND of the OP-amp 33.

A portion enclosed by a broken line 14 in FIG. 5(A), that is, the bipolar transistor 11, the transformer 31, the OP-amp 33, the diodes 35, and the resisters 37 and 39 form the integrated circuit (IC). This IC 14 comprises a source terminal to which the target voltage to be rectified is applied, an output terminal to which the rectified voltage is applied, and two source terminals VDD and VSS of the OP-amp 21.

Operations of the rectification circuits shown in FIGS. 5(A) and (B) will now be described with reference to the timing charts shown in FIGS. 6(A) to (C).

First, when the polarity of the source voltage shown in FIG. 6(A) becomes positive, an electric current flows from the emitter E to the collector C in the circuit shown in FIG. 5(A) because of the forward conductivity characteristics of the diode 11b. At that time, the voltage between the emitter E and the collector C becomes approximately 0.6V (when a shottky-barrier diode is used, it becomes approximately 0.4V) as shown in FIG. 6(B).

In the circuit shown in FIG. 5(B), a current flows from the emitter E to the base B.

Because of the current, a voltage is generated also at the secondary winding of the current transformer 31. The OP-amp 31 amplifies the voltage and applies a control signal having a positive polarity to the base B of the bipolar transistor 11. Thus, the bipolar transistor 11 is activated, and the voltage between the emitter E and the collector C drops to approximately 0V, therefore, almost the whole source voltage is applied to the load 17.

If the source voltage drops and the current gets closer to 0 A, an inductive voltage in the secondary side also drops. Because the OP-amp 33 is biased toward the negative polarity side, the OP-amp 33 applies a bias signal having a negative polarity to the base B and inactivates the bipolar transistor 11. However, the current flows via the diode 11b, and a forward voltage for the diode 11b is applied between the emitter E and the collector C of the bipolar transistor.

When the polarity of the source voltage becomes negative, the bipolar transistor 11 and the diode 11b become non conductive. Therefore, no current flows through the primary winding of the current transformer 31, and also the secondary winding thereof generates no current. However, because the OP-amp 33 is biased toward the negative side, the OP-amp 33 applies a control signal having a negative polarity to the base B of the bipolar transistor 11. Thus, the bipolar transistor is inactivated completely, and the whole of the source voltage is applied between the emitter E and the collector C, and the ground voltage is applied to the load 17.

As described above, the alternating voltage can be rectified by the structure shown in FIGS. 5(A) and (B). Moreover, because the bipolar transistor 11 is activated in the saturation area, the voltage between the emitter E and the collector C is almost 0V, therefore, rectification with almost no loss can be performed.

Figure 7:
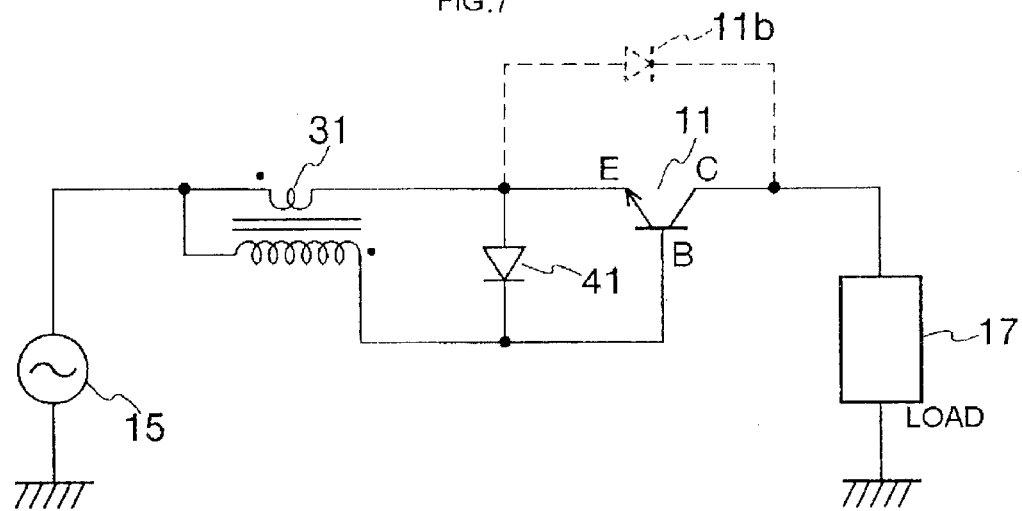
FIG. 7 is a circuit diagram showing a concrete example of components of the rectification circuit shown in FIG. 1.

FIG. 7 shows another example of the rectification circuit.

In this example, the control circuit 13 of the rectification circuit is comprised of the current transformer 31 and a diode 41 for protection.

The primary winding of the current transformer 31 is provided in the current path extending from the power source 15 to the emitter E of the bipolar transistor 11.

One end of the secondary winding of the current transformer 31 is connected to the power source 15 so as to show the additive polarity, and the other end of the secondary winding is connected to the base B of the bipolar transistor 11. Furthermore, the anode and cathode of the diode 41 are connected to the emitter E and the base B of the bipolar transistor 11, respectively.

An operation of the rectification circuit shown in FIG. 7 will now be described.

When the source voltage is raised and the polarity thereof becomes positive, a current flows from the emitter E to the base B because of the forward conductivity characteristics of the diode 41. At that time, the potential difference between the emitter E and the base B becomes approximately 0.6V (when a schottky-barrier diode is connected, it becomes approximately 0.4V).

Because of the current, a secondary current, corresponding to the turn ratio of the primary winding secondary winding of the current transformer 31, occurs and is supplied to the base B. Because of the secondary current, the voltage for the base B becomes higher than the voltage for the emitter E, and a reverse voltage is applied to the diode 41. Therefore, no current flows through the diode 41. Thus, the bipolar transistor 11 is activated, and the potential difference between the emitter E and the collector C drops to almost 0V, therefore, almost the whole source voltage is applied to the load 17.

When the source voltage drops and the current gets closer to 0 A, the voltage in the secondary side of the current transformer 31 also drops. Moreover, counter-electromotive force is generated by the self induction. And a forward current flows through the diode 41. Then, a reverse bias voltage which is approximately 0.6V (when a schottky-barrier diode is used, it is approximately 0.4V) is applied between the base B and the emitter E.

Therefore, the alternating voltage can be also rectified by the structure shown in FIG. 7. Moreover, because the current drive ability of the current transformer 31 is high, an adequate bias current is supplied to the base B of the bipolar transistor 11 to activate the bipolar transistor 11 in the saturation area. Therefore, the voltage between the emitter E and the collector C can be reduced to almost 0V, and the rectification with almost no loss can be accomplished.

As shown by a broken line in FIG. 7, the diode 11b may be connected between the emitter E and the collector C of the bipolar transistor 11 so that the direction from the emitter E to the collector C is the forward direction. In this case, when the source voltage raises and the polarity thereof becomes positive, a current flows via the diode 11b. The current causes the generation of a secondary current at the secondary winding of the current transformer 31. The secondary current is supplied to the base B, and the bipolar transistor 11 is activated.

(Rectification Circuit Using PNP Bipolar Transistor)

In the above described embodiment, although the NPN bipolar transistor is used as a rectification switching element, a PNP bipolar transistor may be used.

FIGS. 8, 9(A), 9(B) and 10 show examples of rectification circuits each using a PNP bipolar transistor 51.

The basic structures of these rectification circuits are the same as those of the rectification circuits shown in FIGS. 4, 5(A), 5(B), and 7. Emitter E of the PNP bipolar transistor 51 is connected to the power source 15 side, collector C is connected to the load 17, and base B is connected to the control circuit.

In FIG. 9(A), a diode 11b or a schottky-barrier diode is connected between the emitter E and the collector C of the bipolar transistor 51 so that the direction from the collector C to the emitter E is the forward direction.

In FIG. 9(B), the diode 11 b is connected between emitter E and the base B of the bipolar transistor 51 so that the direction from the base B to the emitter E is the forward direction.

In the examples shown in FIGS. 9(A) and (B), the bipolar transistor 51 is inactivated when a control signal having the positive polarity is applied to the base B. Therefore, a voltage at one end of a secondary winding is applied to a negative input terminal of an OP-amp 31 as it is, and a voltage at the other end of the secondary winding is applied to a positive input terminal of the OP-amp 31 via a resistor 37 (some of offset voltages of the OP-amp 31 may be set to the positive voltage side).

In the rectification circuit shown in FIG. 10, when the polarity of the source voltage becomes negative, a current flows from the collector C to a transformer 31 via the base B and a diode 41 in order. The current causes the generation of a secondary current at the secondary winding of the current transformer 31. The secondary current is supplied to the base B, thus, the bipolar transistor 51 is activated. The potential difference between the emitter E and the collector C drops to almost 0V, and almost the whole source voltage is applied to the load 17.

When the source voltage drops and the current gets closer to 0 A, the voltage at the secondary side of the current transformer 31 also drops. Moreover, counter-electromotive force is generated by the self induction. And a forward current flows through the diode 41. Then, a reverse bias voltage is applied between the base B and the emitter E, thus, the bipolar transistor 51 is inactivated.

As shown by a broken line in FIG. 10, the diode 11b may be connected between the emitter E and the collector C of the bipolar transistor 51 so that the direction from the collector C to the emitter E is the forward direction. In this case, when the polarity of the source voltage becomes negative, a current flows via the diode 11b. The current causes the generation of a secondary current at the secondary winding of the current transformer 31. And the secondary current is supplied to the base B. thus, the bipolar transistor 51 is activated.

Each of the control circuits activates the PNP bipolar transistor 51 in the saturation area when the polarity of the source voltage is negative (more precisely, when the emitter voltage is lower than the collector voltage), and inactivates the PNP bipolar transistor 51 when the polarity of the source voltage is positive (when the emitter voltage is higher than the collector voltage).

According to these rectification circuits, the bipolar transistor 51 is activated when the polarity of the source voltage is negative (when the emitter voltage is lower than the collector voltage), and the voltage between the emitter E and the collector C of the bipolar transistor 51 drops to almost 0V, and the source voltage is applied to the load 17, as shown in FIG. 11. On the other hand, the bipolar transistor 51 is inactivated when the polarity of the source voltage is positive (when the emitter voltage is higher than the collector voltage), and the source voltage is applied between the emitter E and the collector C of the bipolar transistor 51. Then, the ground voltage is applied to the load 17.

(Rectification Circuit Using N-Channel Type FET)

A field effect transistor (FET) may be used as a switching element for rectification.

Figure 12:
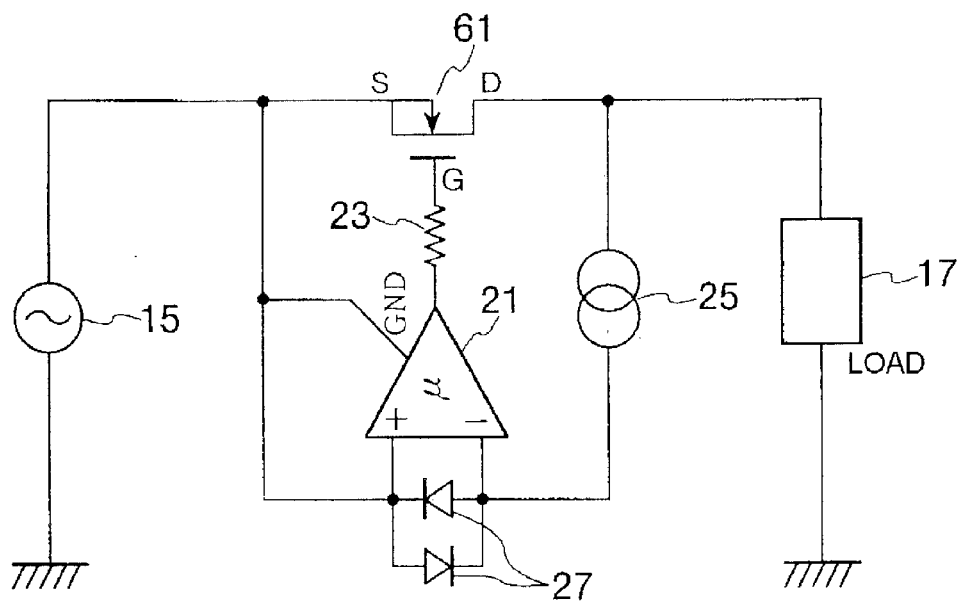
FIG. 12 is a circuit diagram showing an example of a modified circuit of the rectification circuit shown in FIG. 4.
Figure 13:
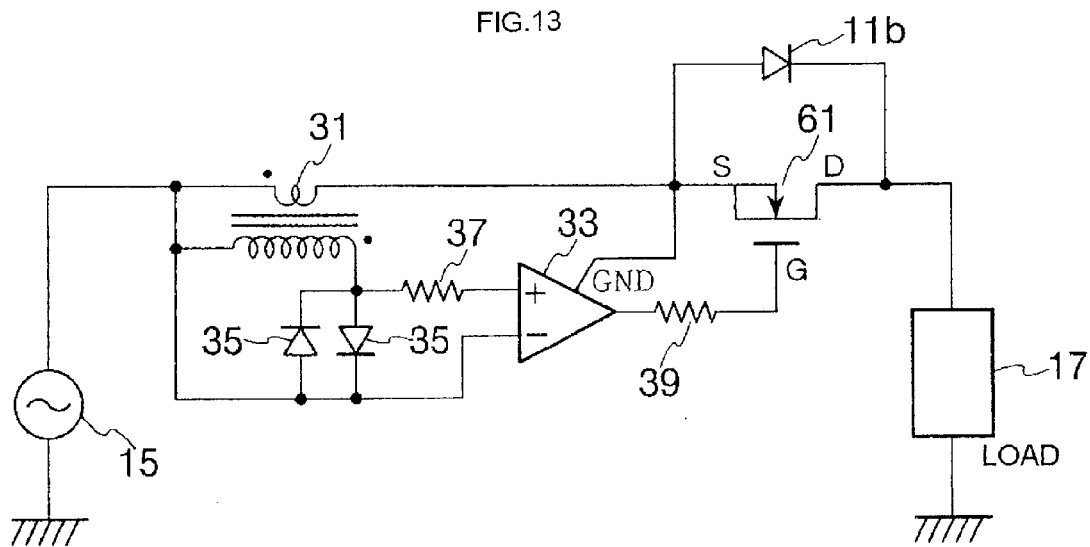
FIG. 13 is a circuit diagram showing an example of a modified circuit of the rectification circuits shown in FIGS. 5(A) and (B).
Figure 14:
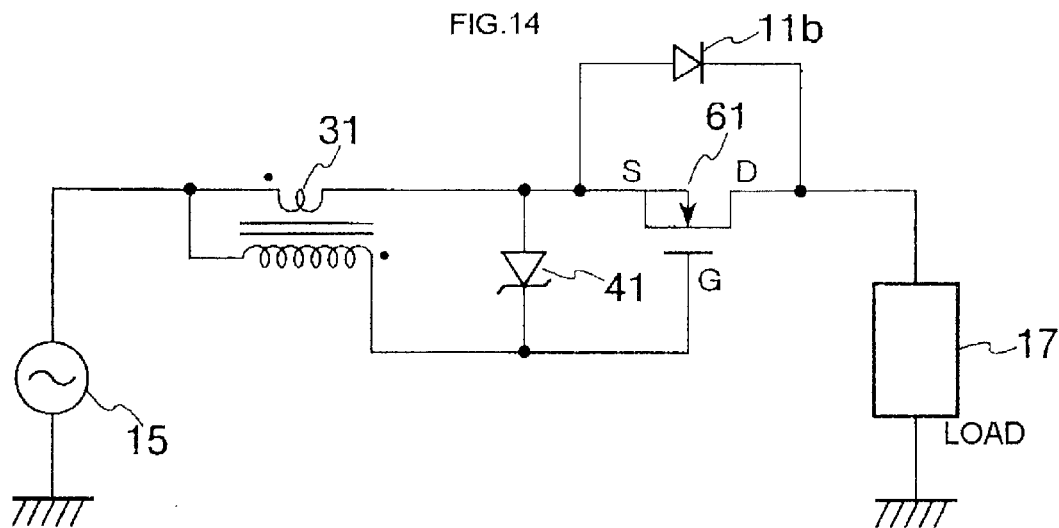
FIG. 14 is a circuit diagram showing an example of a modified circuit of the rectification circuit shown in FIG. 7.

FIGS. 12, 13 and 14 show examples of the structures of rectification circuits each using an N-channel type FET 61.

The basic structures of these rectification circuits are the same as those of the rectification circuits shown in FIGS. 4, 5 and 7. Source S of the FET 61 is connected to the power source 15 side, drain D is connected to the load 17, and gate G is connected to the control circuit.

Each of the control circuits activates the FET 61 under the saturation by applying a voltage having the positive polarity to the gate G when the polarity of the source voltage is positive (when the source voltage is higher than the drain voltage), and inactivates the FET 61 by applying a voltage having the negative polarity to the gate G when the polarity of the source voltage is negative (when the source voltage is lower than the drain voltage).

According to these rectification circuits, the FET 61 is activated under the saturation when the polarity of the source voltage is positive (when the source voltage is higher than the drain voltage). Therefore, the voltage between the source S and the drain D of the FET 61 drops to almost 0V, and the source voltage is applied to the load 17. On the other hand, the FET 61 is inactivated when the polarity of the source voltage is negative. The source voltage is applied between the source S and the drain D, and the ground voltage is applied to the load 17.

As describe above, the rectified voltage having the positive polarity is applied to the load 17.

In the rectification circuits shown in FIGS. 13 and 14, a parasitic diode of the FET 61 may be used as the diode 11b.

(Rectification Circuit Using P-Channel Type FET)

A P-channel FET may be used as the switching FET 61.

Figure 15:
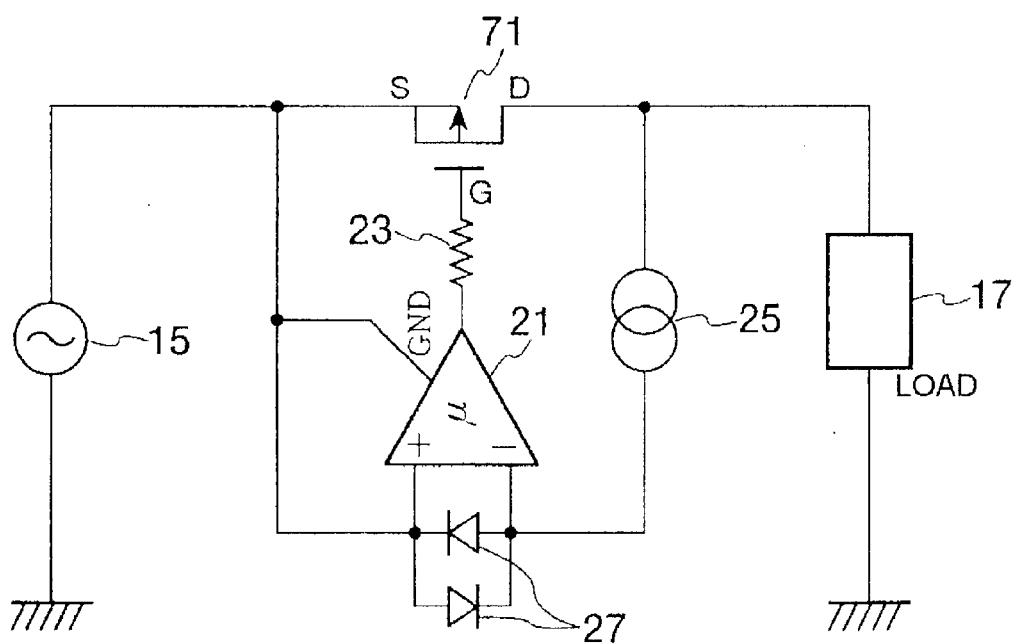
FIG. 15 is a circuit diagram showing an example of a modified circuit of the rectification circuit shown in FIG. 12.
Figure 16:
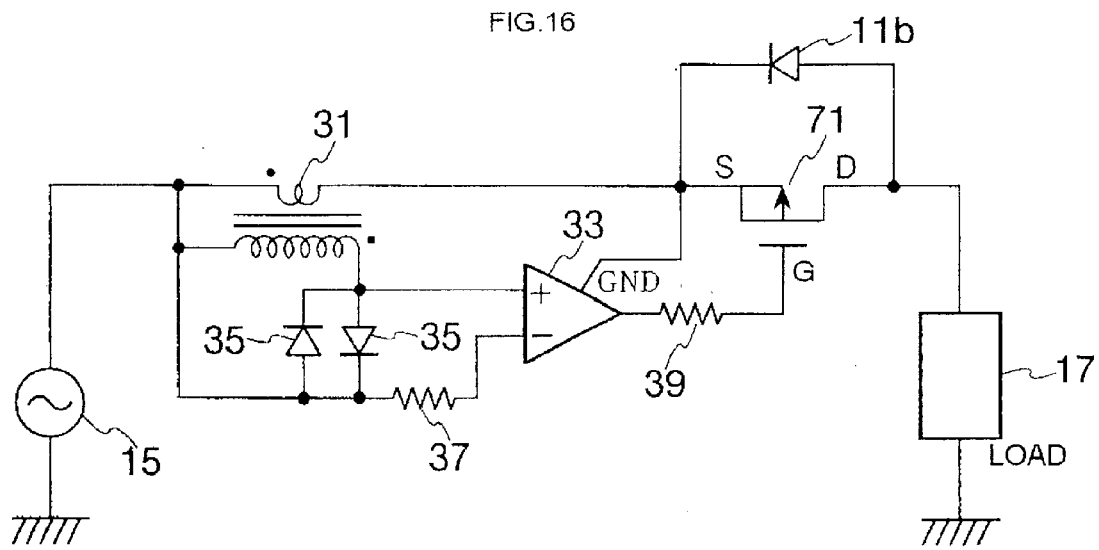
FIG. 16 is a circuit diagram showing an example of a modified circuit of the rectification circuit shown in FIG. 13.
Figure 17:
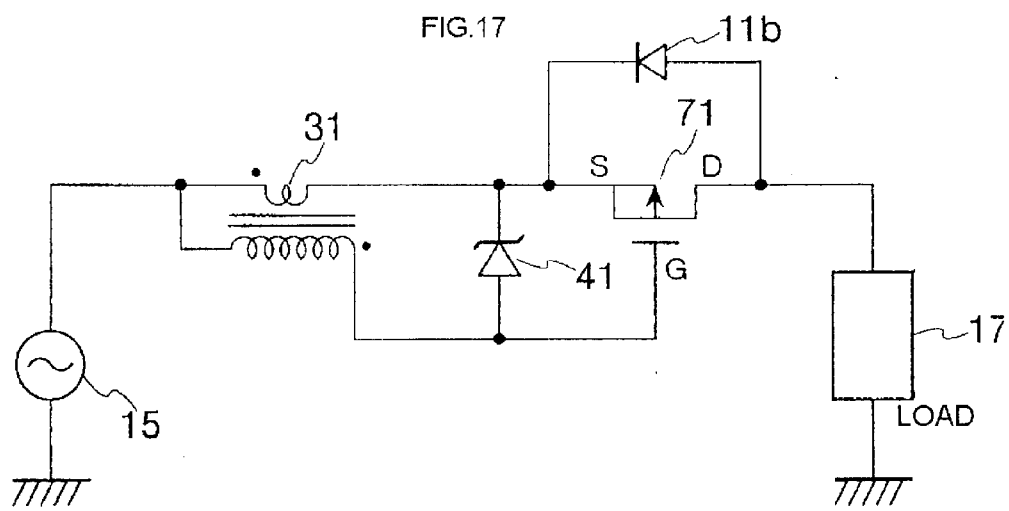
FIG. 17 is a circuit diagram showing an example of a modified circuit of the rectification circuit shown in FIG. 14.

FIGS. 15, 16 and 17 show examples of structures of rectification circuits each using the P-channel type FET 61.

Moreover, an arbitrary FET, such as a junction type FET (J-FET), a MOS (Metal-Oxide-Semiconductor) type FET, or a static induction type transistor (SIT), may be used as a switching FET.

The voltage of the a control signal output from the control circuit can be selected arbitrarily corresponding to the characteristics of a transistor (a bipolar transistor or an FET) which is being used.

For example, if a normally-on type element, such as a junction type FET, or a depression type MOS, for example, is used as a transistor, an arbitrary voltage (for example, the potential which is equal to the source potential) for keeping the transistor being activated may be applied to gate G when the transistor is activated, and an inactivation voltage may be applied when the transistor is inactivated.

The above indicated values, voltage values, or the like in the above described embodiments are just examples, therefore, they may be changed arbitrarily. A plurality of diodes may be connected directly when a bias voltage, a pinch-off voltage, or the like can not be obtained by a single diode, a Zener diode, a resistor, or the like which is used singly.

In the cases of an element such as a MOSFET through which a current, which is large enough to break the element, cannot flow because its input impedance is very high, the current regulating resistors 23 and 39 or the like are unnecessary.

In FIGS. 5, 7, 9, 10, 13, 14, 16, 17, etc., the transformers, each having the primary winding and the secondary winding, are used as the transformer 31. However, for example, an auto-transformer 81 or the like may be used as shown in FIG. 18, as a modification of the rectification circuit shown in FIG. 13 or may be used as shown in FIG. 19 as a modification of the rectification circuit shown in FIG. 14. In both cases where the transformer 31 having the primary and the secondary windings is used and the case where the auto-transformer 81 is used, a primary terminal is connected to one end of the transistor, and a secondary terminal is connected to a control terminal.

(Rectification Circuit Whose Collector is Connected to Power Source Side)

In the rectification circuits shown in FIGS. 4, 5(A), 5(B), 7, 8, 9(A), 9(B) and 10, the emitter of the bipolar transistor 11 or 51 is connected to the power source side, and the collector is connected to the load side. However, a rectification circuit having such a structure that the collector of the bipolar transistor 11 or 51 is connected to the power source side and the emitter is connected to the load side, may be adopted.

Figure 8:
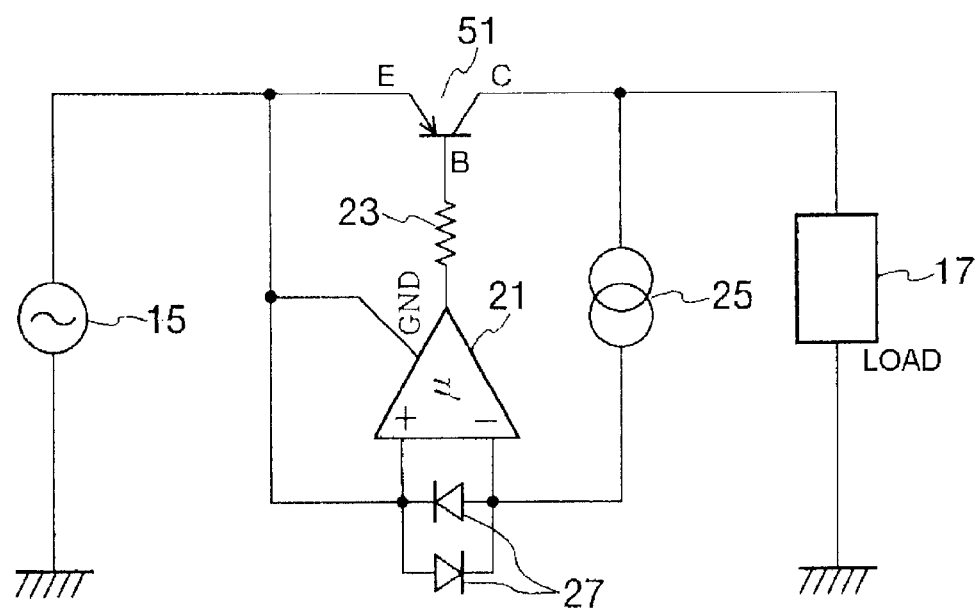
FIG. 8 is a circuit diagram showing an example of a modified circuit of the rectification circuit shown in FIG. 4.
Figure 20:
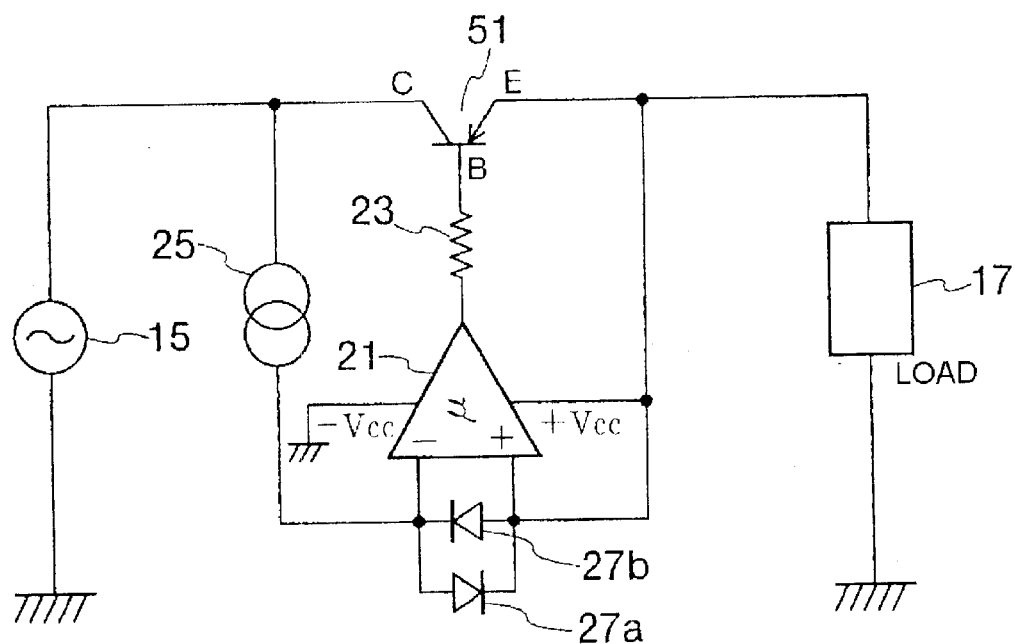
FIG. 20 is a circuit diagram showing an example of a modified circuit of the rectification circuit shown in FIG. 4.
Figure 21:
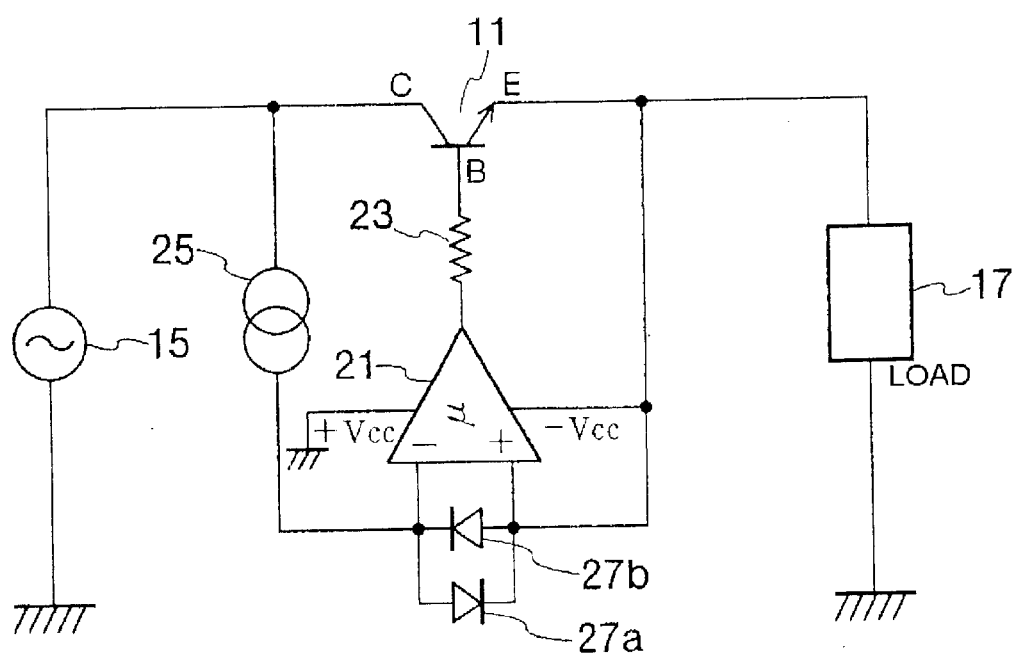
FIG. 21 is a circuit diagram showing an example of a modified circuit of the rectification circuit shown in FIG. 8.

For example, the rectification circuit shown in FIG. 4 may be modified as shown in FIG. 20, and the rectification circuit shown in FIG. 8 may be modified as shown in FIG. 21.

In each of the rectification circuits shown in FIGS. 20 and 21, the emitter E of the bipolar transistor 51 or 11 is connected to the load 17, and the collector C is connected to the power source 15. An output terminal of the OP-amp 21 is connected to the base B of the bipolar transistor 51 or 11 via the resistor 23, a positive input terminal thereof is connected to the emitter E of the bipolar transistor 51 or 11, and a negative input terminal thereof is connected to the collector C of the bipolar transistor 51 or 11 via the constant current source 25. And diodes 27a and 27b are connected parallel with each other between the positive input terminal and the negative input terminal so that the diodes are opposite in direction from each other. And a ground terminal of the OP-amp 21 is connected to the emitter of the bipolar transistor 51 or 11.

Further, in those circuits, the power for the OP-amp 21 is obtained from a rectified current. According to this structure, the operational voltage of the OP-amp 21 can be set at a relatively low value, therefore, the source voltage can be reduced.

Similarly, the rectification circuits shown in FIGS. 5(A) and (B) may be modified as shown in FIGS. 22(A) and (B), and the rectification circuits shown in FIGS. 9(A) and (B) may be modified as shown in FIGS. 23(A) and (B).

In FIGS. 22(A) and (B), the collector of the PNP type bipolar transistor 51 is connected to the power source 15, and the emitter E thereof is connected to the load 17 via the first winding of the current transformer 31.

One end of the secondary winding of the current transformer 31 is connected to the load 17. The diodes 35 for regulating the voltage are connected between two ends of the secondary winding.

Further, the voltage at the one end of the secondary winding is applied to a negative input terminal of the OP-amp 33 as is, and the voltage at the other end of the secondary winding is applied to a positive input terminal of the OP-amp 33. An output terminal of the OP-amp 33 is connected to the base B of the bipolar transistor 11 via the current regulating resistor 39. The OP-amp 33 is biased toward the positive polarity.

The emitter E of the bipolar transistor 11 is connected to the ground voltage terminal GND of the OP-amp 33.

Similarly in these circuits, a rectified voltage is used as the operational voltage of the OP-amp 33. In such a structure also, the operational voltage is set at a relatively low value, and the source voltage is reduced.

In the structure shown in FIG. 22(A), the diode 11*b* is connected between the emitter and the collector of the bipolar transistor 51. In the structure shown in FIG. 22(B), the diode 11*b* is connected between the emitter and the base of the bipolar transistor 51.

When the polarity of the voltage from the power source 15 becomes negative, a current flows via the diode 11*b*, the primary winding of the current transformer 31 and the load 17, and a voltage is generated at the secondary winding. The OP-amp 33 amplifies the generated voltage and applies a control signal having the positive polarity to the base B of the bipolar transistor 51. Thus, the bipolar transistor 51 is activated, the voltage between the emitter E and the collector C drops to almost 0V, and almost the whole source voltage is applied to the load 17.

When the source voltage increases and the current gets closer to 0 A, also the inductive voltage on the secondary side reduces. Because the OP-amp 33 is biased toward the positive polarity, the OP-amp 33 applies a bias signal having the positive polarity to the base B to inactivate the bipolar transistor 51.

When the polarity of the source voltage becomes to positive, the bipolar transistor 11 and the diode 11*b* become non conductive. Thus, no current flows through the primary winding of the current transformer 31, and no current is generated by the secondary winding thereof. However, because the OP-amp 33 is biased toward the positive side, the OP-amp 33 applies a control signal having the positive polarity to the base B of the bipolar transistor 11. Thus, the bipolar transistor 11 is inactivated completely, the whole of the source voltage is applied between the emitter E and the collector C, and the ground voltage is applied to the load 17.

The structure shown in FIGS. 23 (A) and (B) differs from the structure shown in FIGS. 22 (A) and (B) in that the PNP type bipolar transistor 51 is replaced with the NPN bipolar transistor 11, and the OP-amp 33 is biased toward the negative polarity.

When the polarity of the voltage from the power source 15 becomes positive, a current flows via the diode 11*b*, the primary winding of the current transformer 31 and the load 17, and a voltage is generated by the secondary winding. The OP-amp 33 amplifies the generated voltage, and applies a control signal having the positive polarity to the base B of the bipolar transistor 51. Thus, the bipolar transistor 51 is activated, the voltage between the emitter E and the collector C drops to almost 0V, and almost the whole source voltage is applied to the load 17.

When the source voltage increases and the current gets closer to 0A, an inductive voltage on the secondary side also drops. Because the OP-amp 33 is biased toward the negative polarity, the OP-amp 33 applies a bias signal having the negative polarity to the base B, and inactivates the bipolar transistor 51.

When the polarity of the source voltage becomes negative, the bipolar transistor 11 and the diode 11*b* become non conductive. Thus, no current flows through the primary winding of the current transformer 31, and also no current is generated by the secondary winding thereof. However, because the OP-amp 33 is biased toward the negative polarity, the OP-amp 33 applies a control signal having the negative polarity to the base B of the bipolar transistor 11. Thus, the bipolar transistor 11 is inactivated completely, the whole of the source voltage is applied between the emitter E and the collector C, and a ground voltage is applied to the load 17.

As described above, an alternating voltage can be rectified by the structures shown in FIGS. 22(A), (B), and 23(A), (B). Moreover, because the bipolar transistor 11 is activated in the saturation area, the voltage between the emitter E and the collector C is almost 0V, thus, the rectification with almost no loss can be accomplished.

Figure 24:
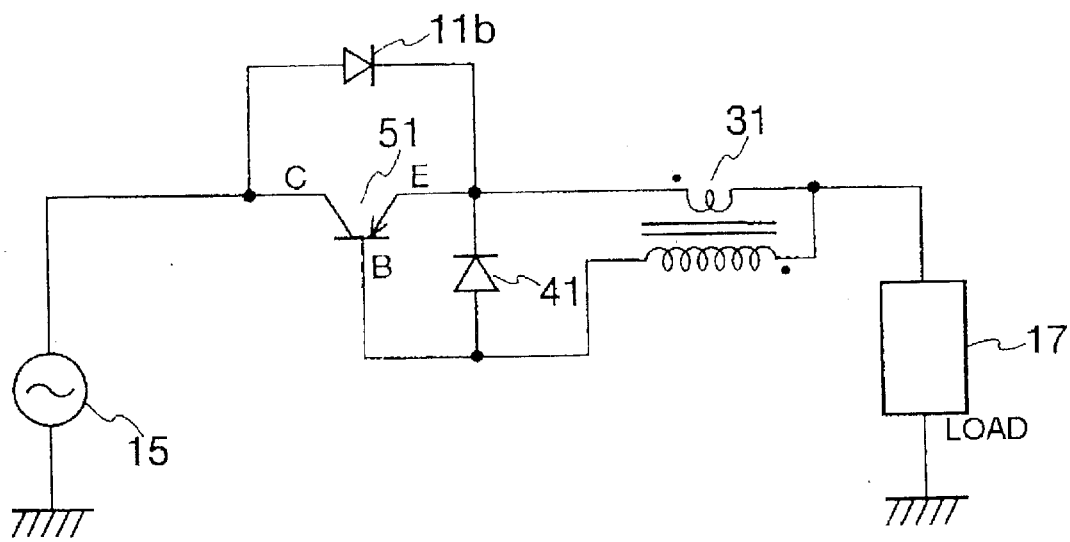
FIG. 24 is a circuit diagram showing an example of a modified circuit of the rectification circuit shown in FIG. 7.
Figure 25:
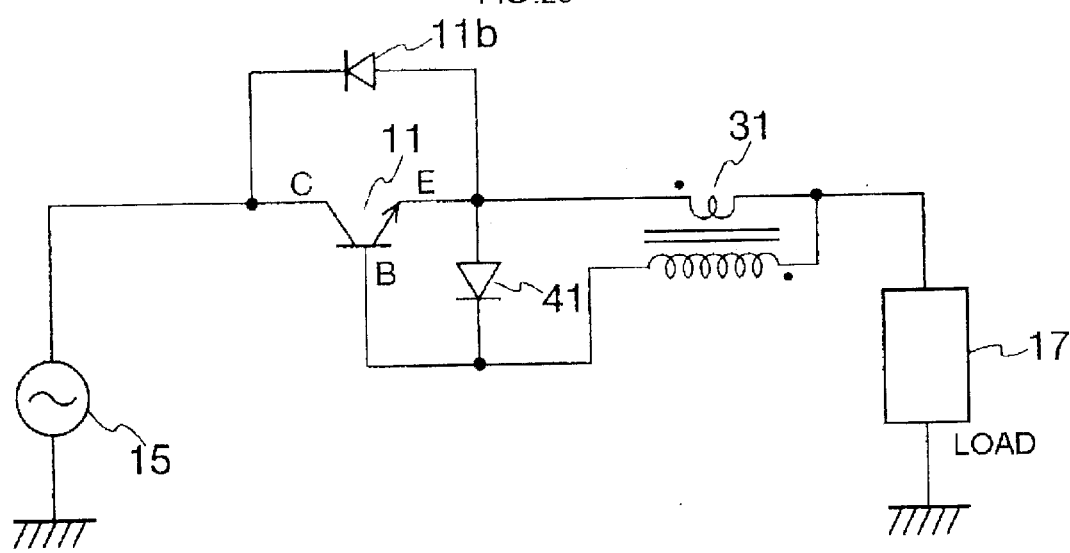
FIG. 25 is a circuit diagram showing an example of a modified circuit of the rectification circuit shown in FIG. 10.

Similarly, the rectification circuit shown in FIG. 7 may be modified as shown in FIG. 24, and the rectification circuit shown in FIG. 10 may be modified as shown in FIG. 25.

Figure 26:
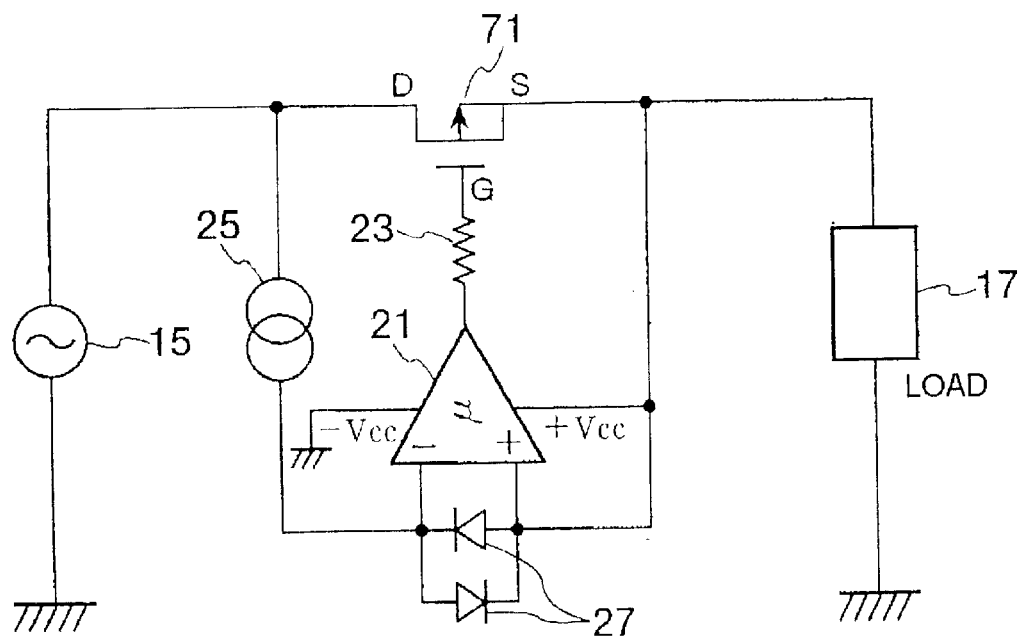
FIG. 26 is a circuit diagram showing an example of a modified circuit of the rectification circuit shown in FIG. 12.
Figure 27:
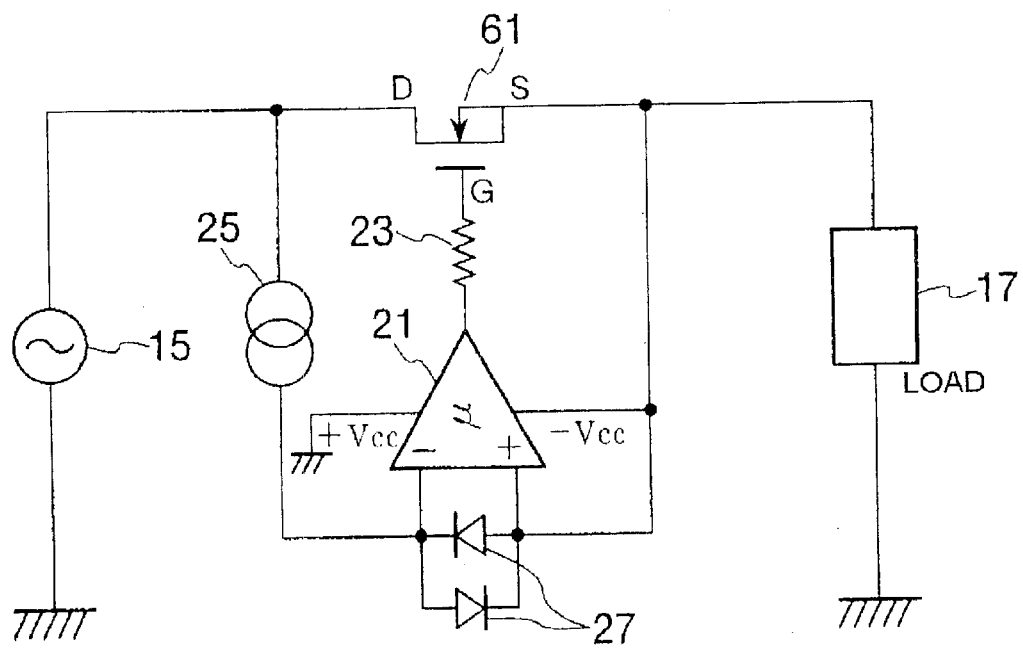
FIG. 27 is a circuit diagram showing an example of a modified circuit of the rectification circuit shown in FIG. 15.

Moreover, the rectification circuit shown in FIG. 12 may be modified as shown in FIG. 26, and the rectification circuit shown in FIG. 15 may be modified as shown in FIG. 27.

Figure 28:
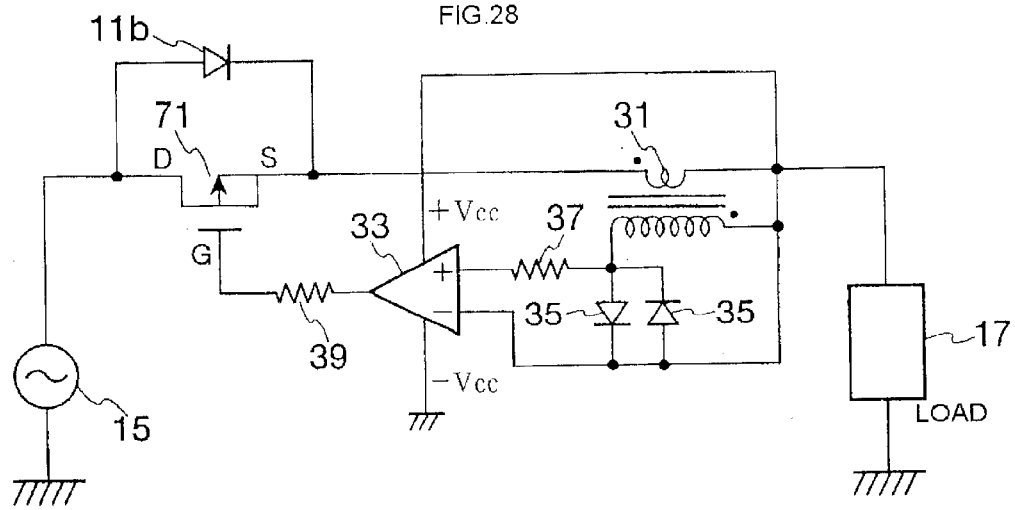
FIG. 28 is a circuit diagram showing an example of a modified circuit of the rectification circuit shown in FIG. 13.
Figure 29:
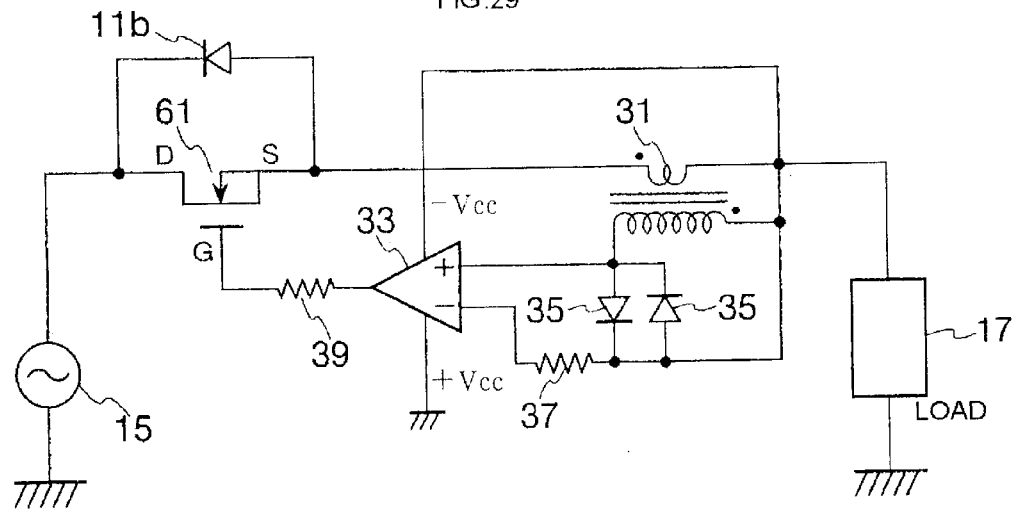
FIG. 29 is a circuit diagram showing an example of a modified circuit of the rectification circuit shown in FIG. 16.
Figure 30:
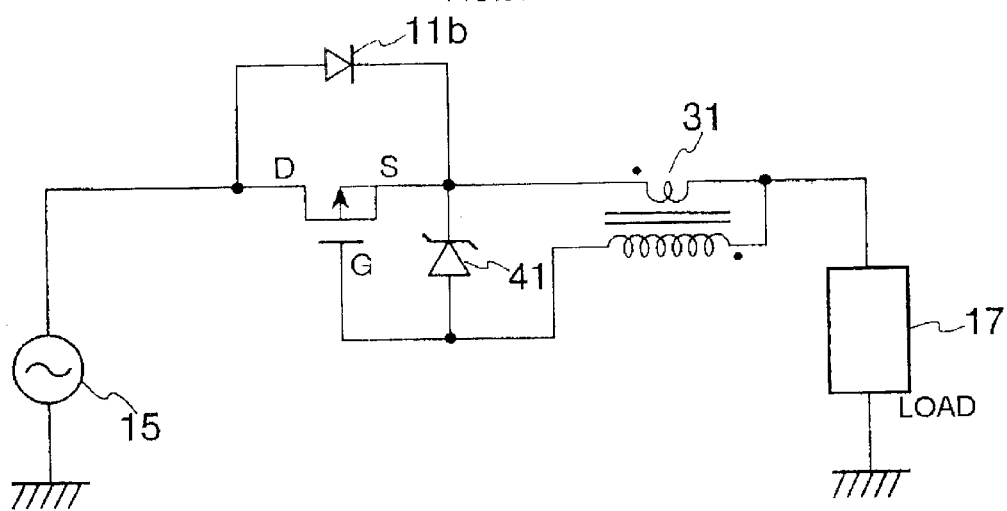
FIG. 30 is a circuit diagram showing an example of a modified circuit of the rectification circuit shown in FIG. 14.
Figure 31:
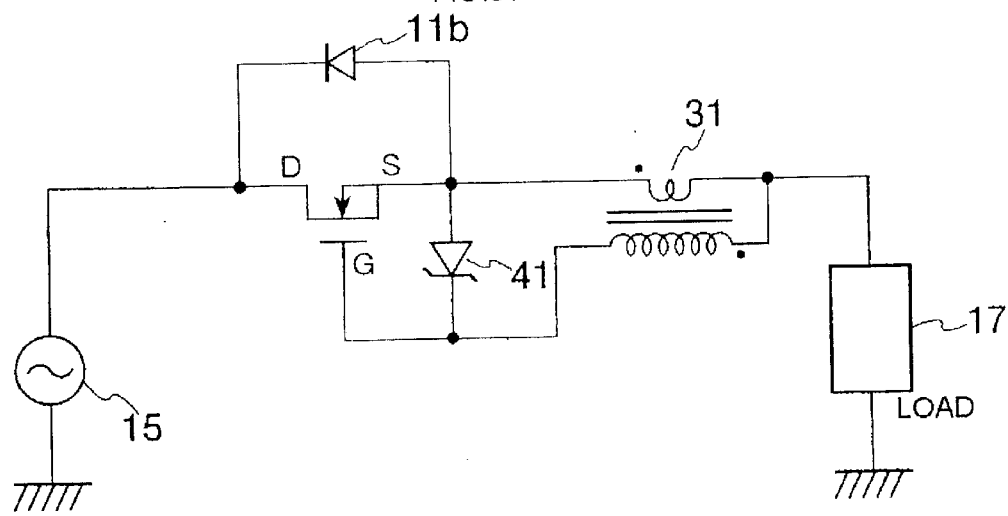
FIG. 31 is a circuit diagram showing an example of a modified circuit of the rectification circuit shown in FIG. 17.

Furthermore, the rectification circuit shown in FIG. 13 may be modified as shown in FIG. 28, and the rectification circuit shown in FIG. 16 may be modified as shown in FIG. 29.

In each of these rectification circuits, because a control section for switching the transistor is disposed on the ground side (load side), no voltage is applied to the control section when a reverse voltage is applied, therefore, it is safe. Also, the source voltage can be reduced.

And, it is efficient because the operational voltages of the OP-amps 21 and 33 are obtained from the rectified voltage.

The diode 11*b* may be removed.

Figure 32:
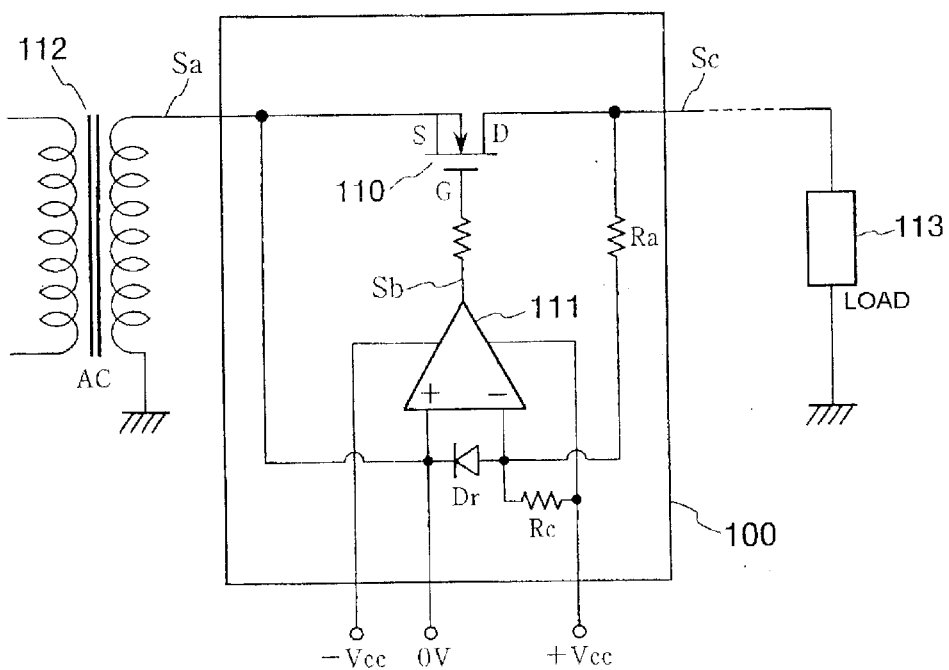
FIG. 32 is a circuit diagram showing another example of the rectification circuit of the present invention.

FIG. 32 shows another example of the rectification circuit of the present invention.

In a rectification circuit 100 shown in FIG. 32, a field effect transistor 110 is, for example, an N-channel type MOS-FET, and the source thereof is connected to a secondary coil of a transformer 112, and drain terminal D is connected to a load 113.

A branch line extending from source terminal S of the FET 110 and a power supplying line whose potential is 0 are connected to a positive input terminal of an OP-amp 111 which is one of the components forming a control circuit, and a branch line extending from the drain terminal D is connected to a negative input terminal of the OP-amp 11 via a resistor Ra. A diode Dr is connected between the input terminals to hinder a sneak current. A potential dividing resistor Rc is connected between the power supplying line of a positive bias potential (Vcc) and the negative input terminal (−) of the OP-amp 111. The output from the OP-amp 111 is input to gate G of the FET 110 via a resistor Rb. It is preferred that, for example, the resistors Ra, Rb and Rc be approximately 10 kΩ, 2 MΩ and 180Ω, respectively. The resistor Rb is used for adjusting the potential, however, it may be removed when an FET is used. In a practical usage, for example, a capacitor having a predetermined capacity is connected parallel to the load 113.

Figure 33:
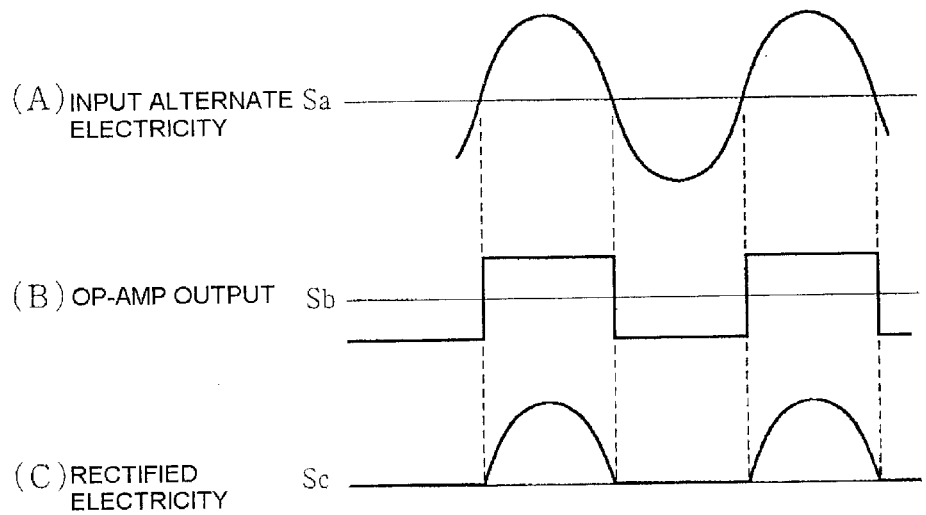
FIGS. 33(A) to (C) are timing charts for explaining operations of the rectification circuit shown in FIG. 32.

Also in the circuit shown in FIG. 32, a balance is maintained between the positive and negative input terminals of the OP-amp 111 when the alternating power is not input to the FET 110. Therefore, the potential of the output Sb from the OP-amp 111 becomes 0. Under this condition, let it be supposed that a sine wave alternating voltage Sa is input to the FET 110 from the transformer 112 as shown in FIG. 33 (A). In the FET 110, the potential at the source terminal S becomes very higher than the potential at the drain terminal D when the polarity of the alternating voltage Sa is positive. At that moment, the OP-amp 111 detects that the potential difference occurs based on the potential difference between the positive and negative input terminals, and change the output potential Sb to a positive bias potential (Vcc). Meanwhile, because the potential at the source terminal S becomes lower than the potential for the drain terminal D at the time that the polarity of the alternating voltage Sa changes to negative from positive, the OP-amp 111 detects this change, and changes the output voltage Sb to a negative bias potential (−Vcc) immediately. The waveform shown in FIG. 33 (B) shows changes in the potential of the output Sb from the OP-amp 111.

When the polarity of the output voltage Sb from the OP-amp 111 is positive, the FET 110 is turned on, therefore, a current flows from the source terminal S to the drain terminal D. On the other hand, when the output voltage Sb from the OP-amp 111 has a negative bias potential, the FET 110 is turned off, therefore, the current is cut off. As a result, the voltage (rectified voltage) Sc to be applied to the load 113 becomes a pulsating voltage from which only the negative polarity components of sine waves have been removed as shown in FIG. 33 (C).

Such a mode of supplying power to the source terminal S and the drain terminal D, is opposite to the original power supplying mode of the FET. However the present invention adopts the above described power supplying mode in order to positively use following points: the back withstanding voltage, that is, the potential difference between the gate and the drain when the current is cut off, can be made to be very high because the above potential difference is one which the FET inherently has; resistor components in the forward direction are extremely low and stable; the back recovery time is short; and the amount of leakage current is small. In an experiment, a back withstanding voltage of approximately 1000 [V] was attained even though a general-purpose FET was used.

A P-channel type FET may be used instead of the N-channel type FET. In this case, the P-channel type FET operates in the same manner as the N-channel type FET, but the direction of the current is different. Even if a junction type FET (J-FET) or a bipolar transistor is used, an operation is performed in almost the same manner, expect that a drop in the voltage between an input terminal and an output terminal of the transistor is slightly different.

As described above, using the rectification circuit of the present invention, a drop in the voltage in the forward direction can be reduced over that of a conventional apparatus. It means that the loss of power occurring during the rectification and heat irradiation from the inside of the element due to the power loss are extremely reduced. Moreover, the structure of the apparatus can be simplified and miniaturized because a cooling device is unnecessary.

Furthermore, the rectified voltage can be used as a power for the OP-amp.

Figure 34:
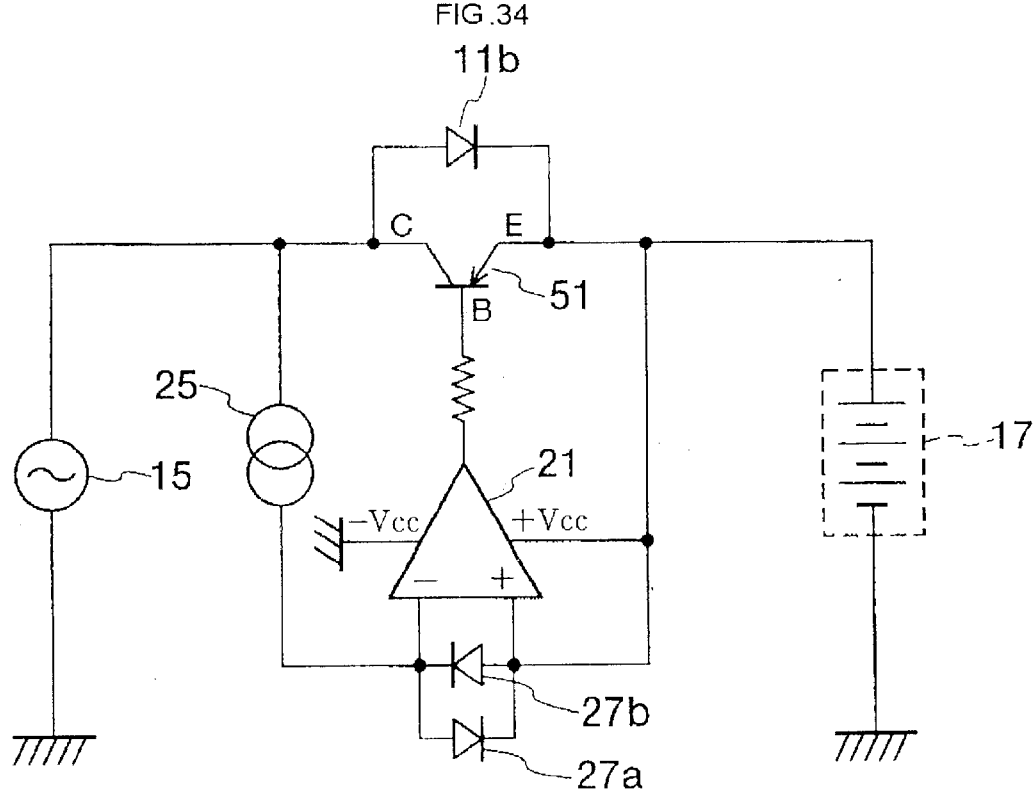
FIG. 34 is a circuit diagram showing an example of a rectification circuit comprising an OP-amp which is powered by a rectified voltage.

For example, when the load 17 in the rectification circuit shown in FIG. 4 includes a battery as shown in FIG. 34, an OP-amp 21 may be driven by supplying a rectified voltage of the positive polarity to the source terminal of the OP-amp 21.

Figure 35:
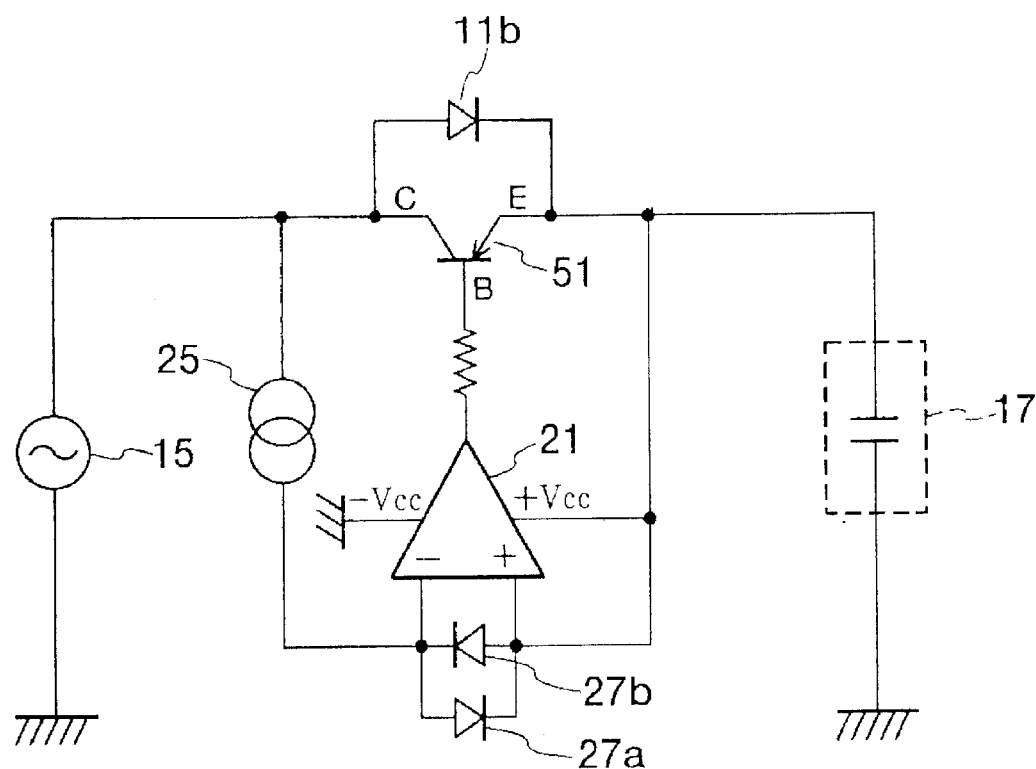
FIG. 35 is a circuit diagram showing an example of a rectification circuit comprising an OP-amp which is powered by a rectified voltage.

Similarly, if the load 17 in the rectification circuit shown in FIG. 4 includes a capacitor, the OP-amp 21 may be driven by supplying a rectified voltage of the positive polarity to the source terminal of the OP-amp 21, as shown in FIG. 35. In this rectification circuit, an external diode 11b (which may be a parasitic diode when the transistor is an FET) causes a rectification current to flow first, and then a voltage is generated at the load 17. The voltage activates the OP-amp 21, and the transistor 51 operates as a diode.

Figure 36:
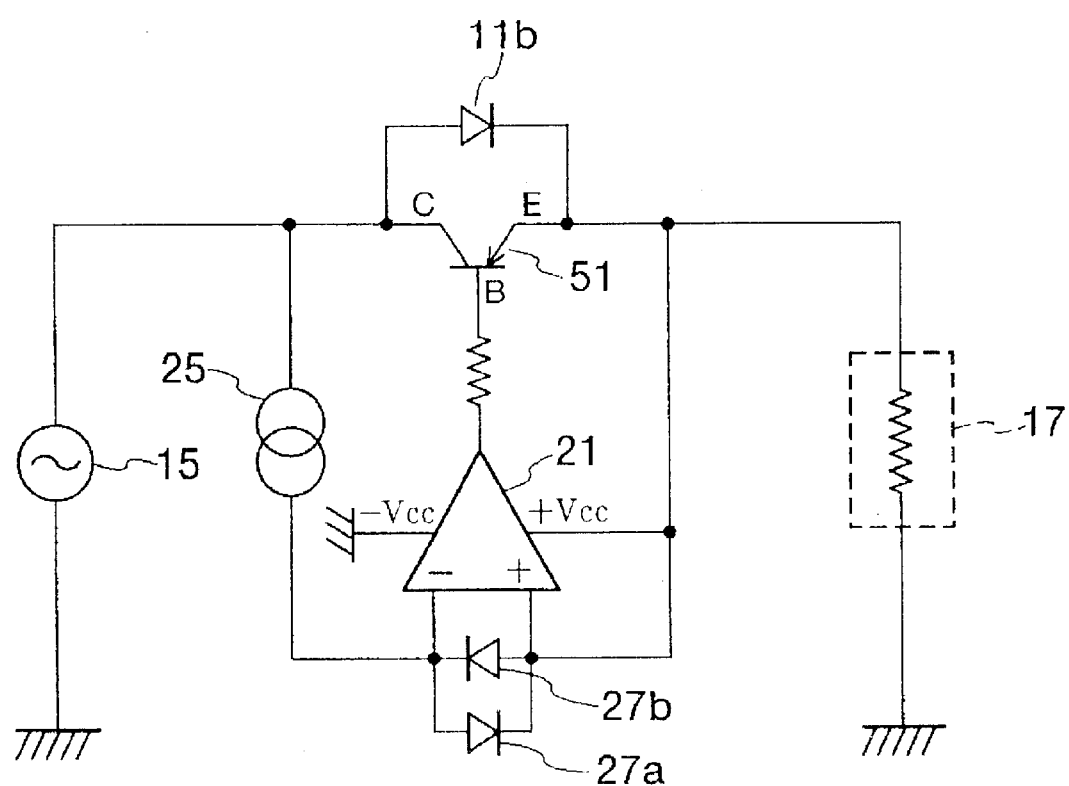
FIG. 36 is a circuit diagram showing one embodiment of a rectification circuit for a resistance load.

When the load 17 is not a resistor or the like having no voltage, the rectified voltage may be used as the operational voltage of the OP-amp as shown in FIG. 36. In this case also, a rectified current flows first due to the presence of the external diode 11b, and then a voltage is generated in the load 17. The voltage activates the OP-amp 21, and the transistor 51 is activated as a diode.

Figure 37:
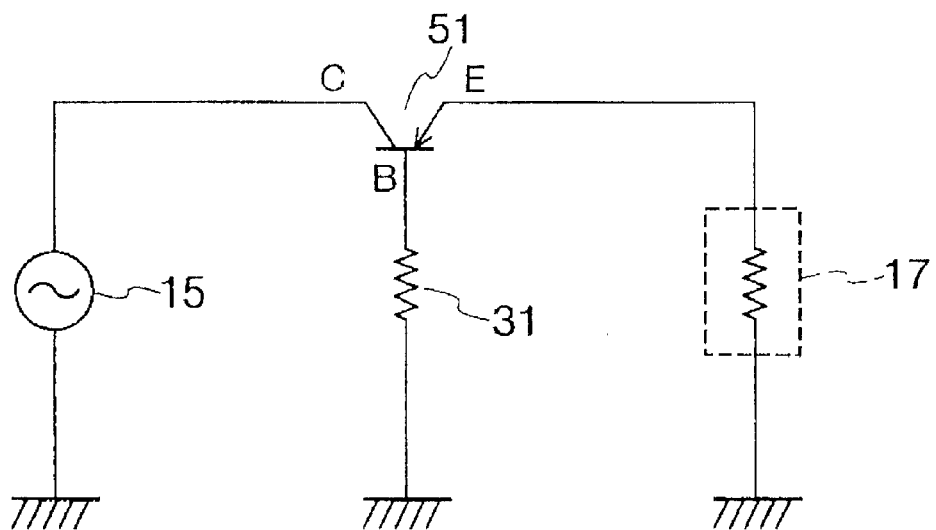
FIG. 37 is a circuit diagram showing one embodiment of a rectification circuit for a resistance load.
Figure 38:
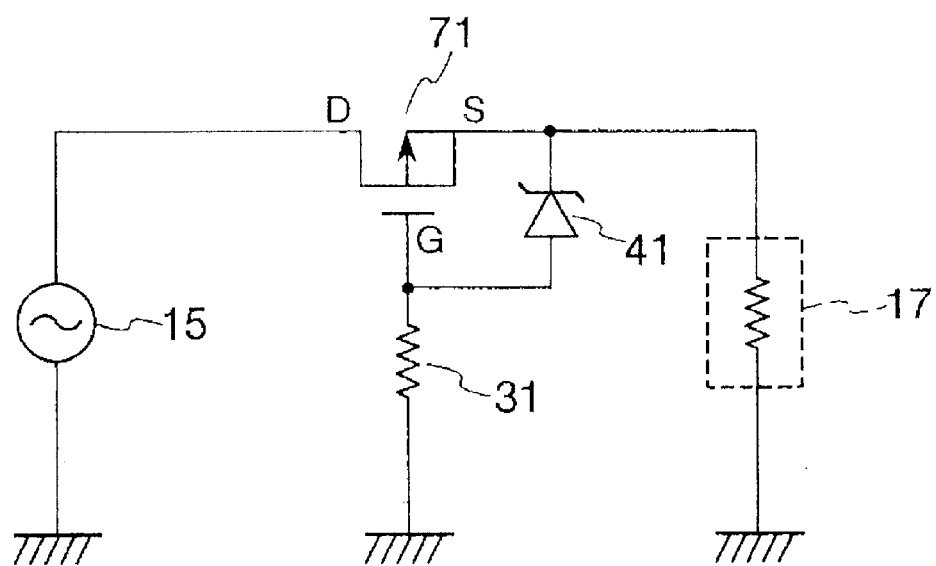
FIG. 38 is a circuit diagram showing one embodiment of a rectification circuit for a resistance load.

Moreover, when the load 17 is not a resistor or the like having no voltage, a rectification circuit may be comprised of simple circuits as shown in FIGS. 37 and 38.

In the structure shown in FIG. 37, the collector C of the PNP bipolar transistor 51 is connected to the output by the power source 15, the base B is grounded via the resistor 31 for regulating (limiting) a current value, and the emitter E is connected to the load 17.

In this structure, when the polarity of the output from the power source 15 is positive, a base current flows from the collector C of the PNP bipolar transistor 51 to the resistor 31 via the base B. The base current causes a collector current, that is, a load current to flow from the collector C to the load 17 via the emitter E.

On the other hand, when the polarity of the output from the power source 15 is negative, no base current flows because the voltage between the collector C and the base B of the PNP bipolar transistor 51 is a counter bias voltage. Therefore, no current flows from the emitter E to the collector C.

A diode may be connected between the base B and the emitter E so that the direction from the base B to the emitter E is the forward direction. In this case, a current flows through the diode until the base current flows through the resistor 31.

In the structure shown in FIG. 38, drain D of a P-channel FET 71 is connected to the output of the power source 15, gate G is grounded via the resistor 31 for regulating (limiting) current, and source S is connected to the load 17. Further, a Zener diode 41 for protecting the gate is connected between the gate G and the source S so that the direction from the gate G to the source S is the forward direction.

In this structure, when the polarity of the output from the power source 15 is positive, a parasitic diode causes a current to flow from the drain D of the FET 71 to the load 17 via the source S, and a voltage whose polarity is positive is applied to the load 17. If the polarity of the voltage applied to the load 17 becomes positive, a voltage for the gate G becomes a negative voltage relatively, and the FET 71 is activated.

On the other hand, when the polarity of the output from the power source 15 is negative, no current flows through the parasitic diode, and also no bias voltage is not applied to the gate G. Therefore, the FET 71 is inactivated.

(Switching Power Source)

Figure 39:
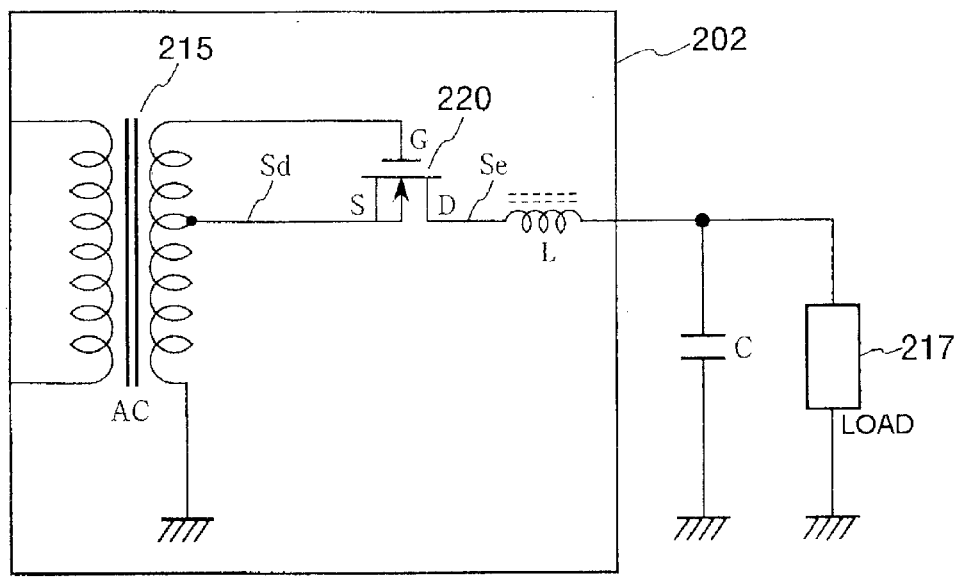
FIG. 39 is a diagram showing one example of the structural elements forming a rectification circuit which activates and inactivates a transistor with an output from a secondary winding of a transformer to rectify an alternating current.

An embodiment in which the rectification circuit of the present invention is applied to a switching (SW) power source will now be described. FIG. 39 is a block diagram showing the SW power source in this embodiment.

As shown in FIG. 39, the SW power source 202 comprises a transformer 115 for outputting an alternating voltage showing a rectangular waveform, and an active semiconductor element, for example, a MOS-type-FET 220, for rectifying the alternating voltage obtained from the transformer 215. Two taps for outputting voltages having the same alternating cycle but different amplitude values are arranged on a secondary coil of the transformer 215. A first tap for outputting a voltage having a small amplitude value is connected to source terminal S of the FET 220, and a second tap for outputting a voltage having a large amplitude value is connected to gate terminal G of the FET 220. A load and a capacitor, for example, an electrolytic capacitor C, are connected parallel to drain terminal D of the FET 220 via a smoothing coil L.

Figure 40:
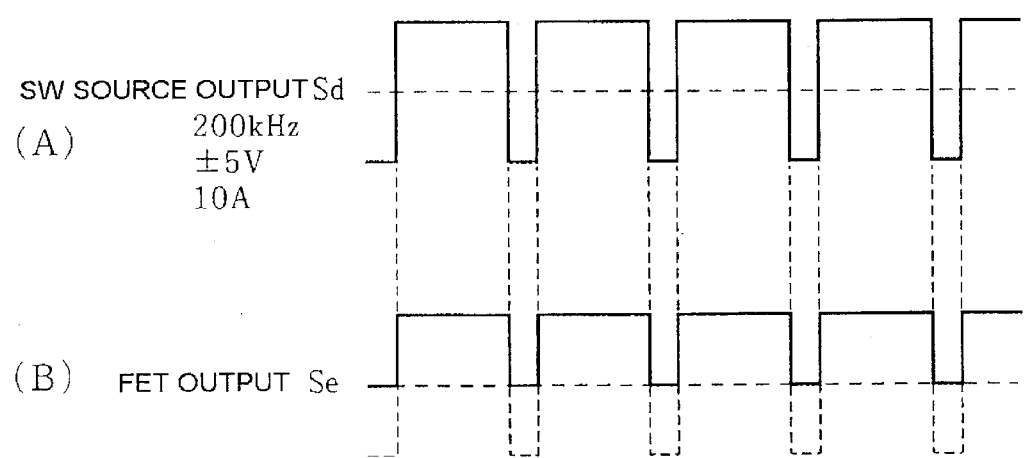
FIGS. 40(A) and (B) are timing charts for explaining operations of the rectification circuit shown in FIG. 39.

In the SW power source 220 having such components, let it be supposed that an alternating signal Sd, showing a rectangular waveform, whose alternating cycle is 200 [kHz], amplitude value is ±5 [V], and current value is 10 [A] for example, is applied to the source terminal S of the FET 220 from the first tap of the transformer 215, and an alternating voltage whose amplitude value is ±12 [V] is applied to the gate terminal G of the FET 220 from the second tap, as shown in FIG. 40 (A). In this case, when the polarity of the alternating voltage Sd is positive, the amplitude value of the power at the gate terminal G (12 [V]) becomes relatively larger than the amplitude value of the power at the source terminal S (5 [V]), thus, the FET 220 is activated. That is, a portion between the source terminal S and the drain terminal D conductive, therefore, a current flows from the source terminal S to the drain terminal D.

On the other hand, when the polarity of the alternating voltage Sd is negative, because the amplitude value of the power at the gate terminal G (−12 [V]) becomes lower than the amplitude value of the power at the source terminal S (−5 [V]), the FET 220 is inactivated, thus, the current is cut off. Therefore, positive polarity components Se of the alternating voltage Sd is output from the FET 220 and are rectified. (Of the positive polarity components Se, those whose frequency is equal to or greater than the frequency determined by the smoothing coil L and the capacitor C are inhibited from passing, and therefore the raising and falling of the output of the positive polarity components Se are, in actual fact, not completed instantly, but change exponentially.)

Almost no drop occurs in the voltage in the forward direction during the rectification, as well as in the case described above. And a leakage current is negligibly little when the power is supplied in the reverse direction, thus, the voltage can be rectified efficiently because of a reduction in the loss of power. Actually, even if a rectifying operation is performed for several hours continuously, the FET 220 does not irradiate heat, and the inventor of the present invention has confirmed that a heat sink plate or the like was unnecessary. Moreover, a control circuit is unnecessary because the alternating voltage Sd has a rectangular waveform, and the time required for changing the polarity from positive to negative, or from negative to positive is short. The voltage distribution to the FET 220 when the power is supplied in the reverse direction corresponds to the original voltage distribution in a normal usage, that is, a voltage Vds between the drain and the source. Thus, a high withstanding ability can also be obtained.

If a bipolar transistor or a J-FET is used instead of the MOSFET, almost the same operation as that described above is performed. In this case, however, an element for regulating the current, such as a resistor element, for example, is inserted between the gate terminal and the second tap of the transformer 215.

Figure 41:
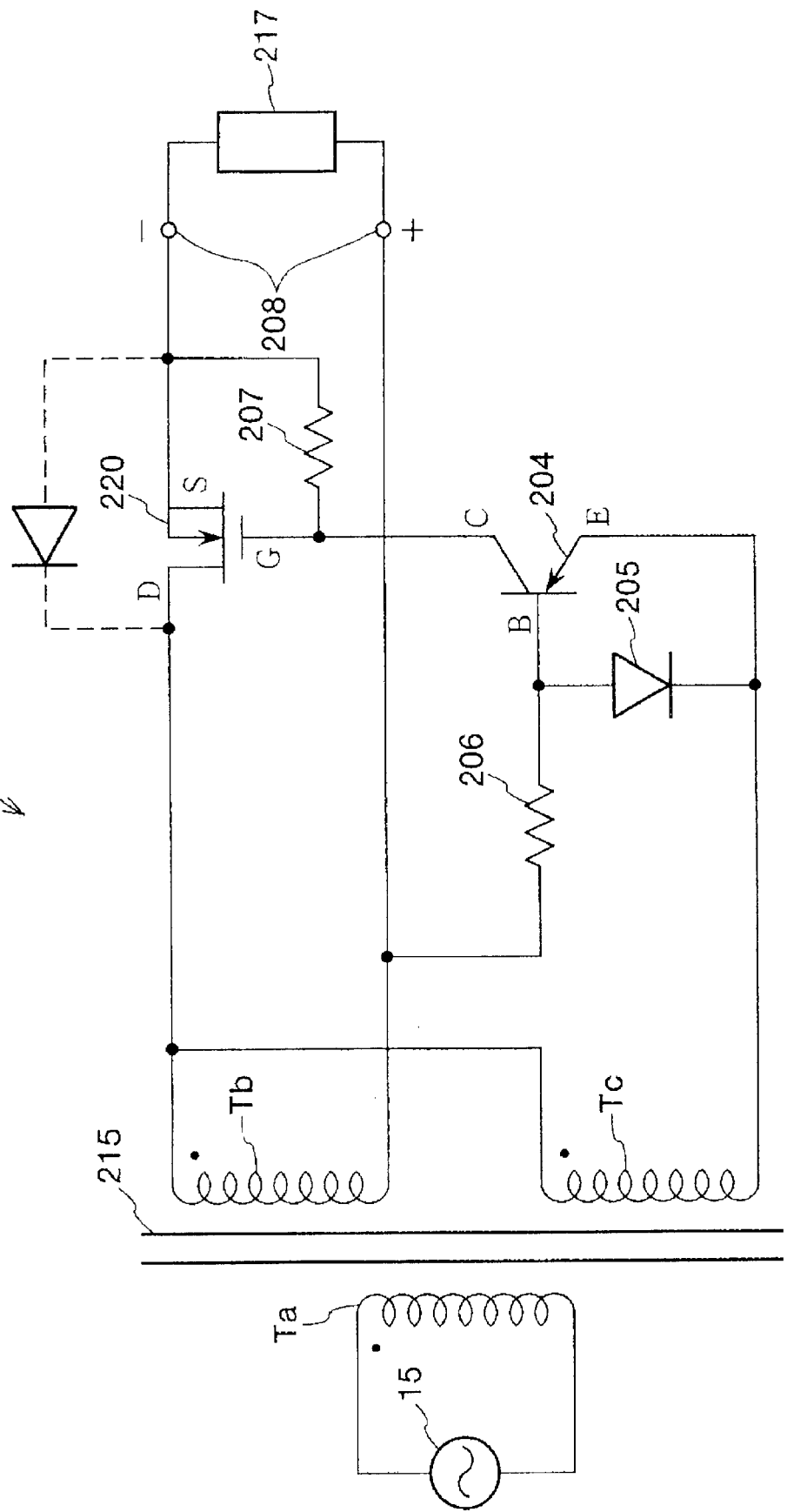
FIG. 41 is a diagram showing an example of the structural elements forming a rectification circuit which activates and inactivates a transistor with an output from a secondary winding of a transformer to rectify an alternating current.

FIG. 41 shows another example of the switching power source 202 according to the embodiment of the present invention. This rectification circuit comprises the transformer 215, the FET 220, a bipolar transistor 204, a diode 205, base resistor 206, a bias resistor 207, and an output terminal 208.

Figure 42:
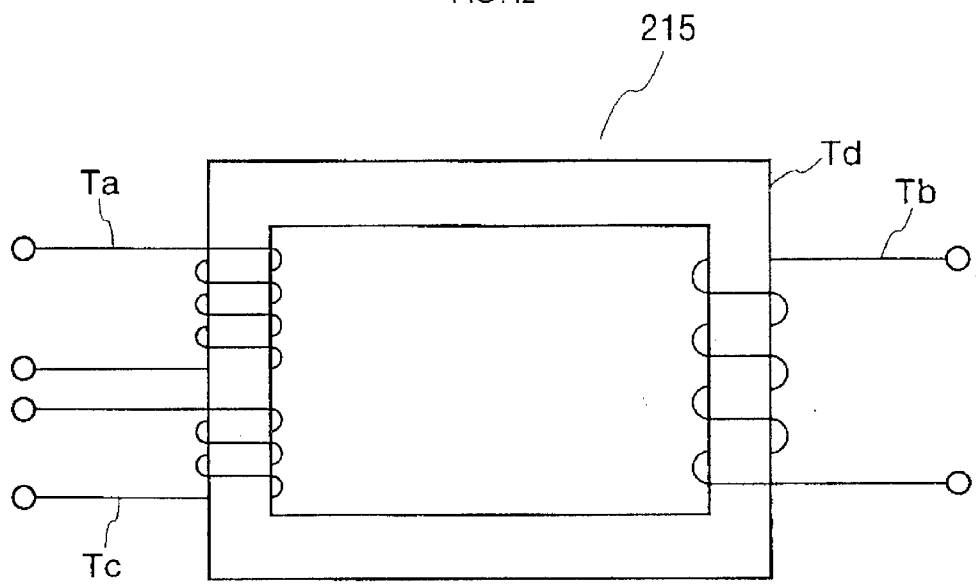
FIG. 42 is a diagram showing one example of the structural elements forming a transformer.

As shown in FIG. 42, the transformer 2 comprises a primary winding Ta, a secondary winding Tb, a detection winding Tc, and an iron core Td. The primary winding Ta is wound around one of opposing legs of the iron core Td which is a rectangular, and the secondary winding Tb is wound around the other leg thereof. The detection winding Tc is wound around the same leg on which the primary winding is wound, and the number of turns of the detection winding is the same as that of the secondary winding Tb.

The voltage between both electrodes of an external alternating power source 1 is applied to both ends of the primary winding Ta. The drain of the FET 220 and a hot end of the detection winding Tc are connected to a hot end of the secondary winding Tb. A cold end of the secondary winding Tb is connected to a positive electrode of the output terminal 208, and is connected to base B of the bipolar transistor 204 via the base resistor 206 which is equipped for regulating the base current. A cold end of the detection winding Tc is connected to emitter E of the bipolar transistor 204.

The FET 220 is an n-channel enhancement type MOS (Metal-Oxide-Semiconductor) FET. The drain D of the FET 220 is connected to the hot end of the secondary winding Tb and that of the detection winding Tc of the transformer 215. Source S is connected to a negative electrode of the output terminal 208. Gate G is connected to collector C of the bipolar transistor 204.

The bias resistor 207 is connected between the gate G and the source S of the FET 220.

A diode is connected between the source S and the drain D of the FET 220 so that the direction from the source S to the drain D is the forward direction. An independent diode or the parasitic diode of the FET 220 may be used as the above-mentioned diode.

The bipolar transistor 204 is a PNP type. The collector C of the bipolar transistor 204 is connected to the gate G of the FET 220, the emitter E is connected to the cold end of the detection winding Tc, and the base B is connected to the cold end of the secondary winding Tb of the transformer 2 via the base resistor 206.

The diode 205, for preventing a reverse bias from being applied between the base B and the emitter E of the bipolar transistor, is connected between the base B and the emitter E of the bipolar transistor 204 so that the direction from the base B to the emitter E is the forward direction.

An operation when a load 217 is connected between electrodes of the output terminal 208 in the rectification circuit shown in FIG. 41 will now be described with reference to the timing charts shown in FIGS. 43(A) to (E).

Figure 43:
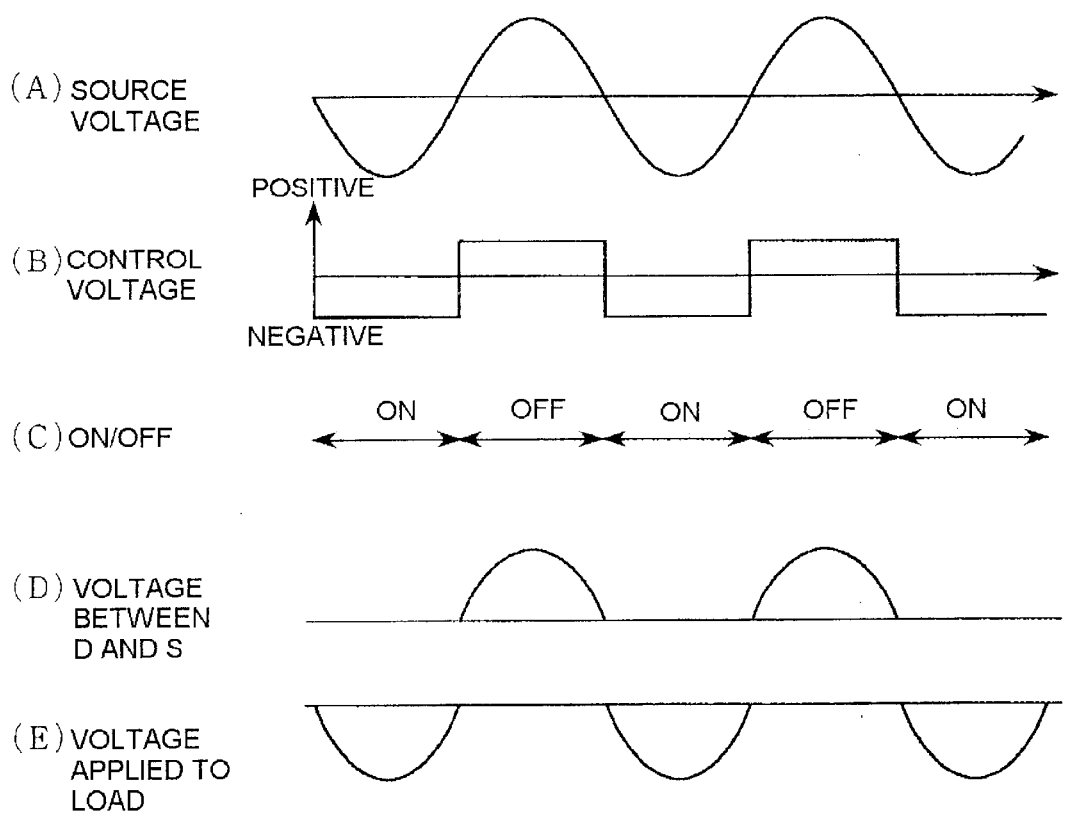
FIGS. 43(A) to (E) are timing charts for explaining operations of the rectification circuit shown in FIG. 41.
Figure 44:
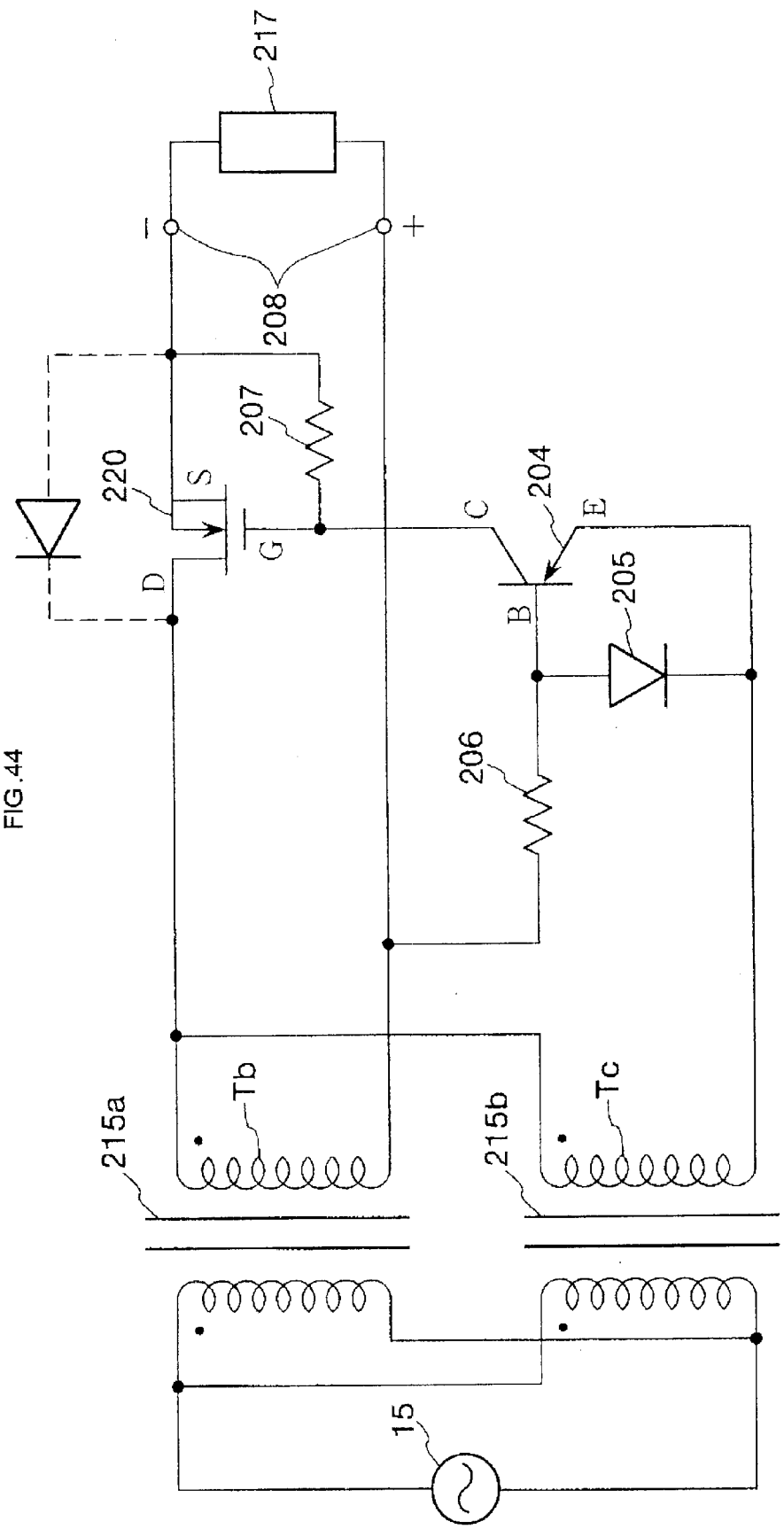
FIG. 44 is a diagram showing an example of the structural elements forming a rectification circuit which activates and inactivates a transistor with an output from a secondary winding of a transformer to rectify an alternating current.

FIG. 43(A) shows the waveform of the source voltage output from the alternating current source 15, FIG. 43(B) shows the waveform of the gate voltage to be applied to the FET 220, FIG. 43(C) shows the turning on and off of the FET 220, FIG. 43(D) shows the waveform of the voltage to be applied between the drain D and the source S of the FET 220, and FIG. 43(E) shows the waveform of the voltage to be applied to the load 217.

First, when the polarity of the source voltage shown in FIG. 43(A) becomes negative (in other words, the voltage at the hot end of the primary winding Ta becomes lower than that at the cold end thereof), the secondary winding Tb and the detection winding Tc generate a secondary voltage so that the voltage at the hot end becomes lower than that at the cold end.

At that time, the voltages generated at both ends of the secondary winding Tb are supplied to the load via the diode connected between the source S and the drain D of the FET 220. A load current flows through the secondary winding because of power consumption at the load, and then, the voltage between the ends of the secondary winding Tb drops due to the internal resistance of the secondary winding Tb and the magnetic resistance caused by the transformer 215.

On the other hand, the detection winding Tc does not allow a current to flow when the bipolar transistor 204 is inactivated. Even if the bipolar transistor 204 is activated, the detection winding Tc does not apply a voltage to the load 217.

Because of this, the extent of a drop, which occurs in the voltage between the terminals of the detection winding Tc, is smaller than that of the voltage between the terminals of the secondary winding Tb if the impedance of a section to which the both ends of the detection winding Tc are connected is satisfactorily higher than the impedance of the load 217.

As a result, the voltage at the cold end of the secondary winding Tb becomes lower than the voltage at the cold end of the detection winding Tc, and the potential difference between the both cold ends becomes almost equal to a difference between the quantity of the voltage between the both ends of the secondary winding Tb and the quantity of the voltage between the both ends of the detection winding Tc.

Then, the voltage between the both cold ends is applied between the base B and the emitter E of the bipolar transistor 204. As a result, the bipolar transistor 204 is activated when the voltage at the base B of the bipolar transistor 204 becomes lower than the voltage at the emitter E by approximately 0.6 V or greater.

After the bipolar transistor 204 is activated, a current path is formed extending from the cold end of the detection winding Tc to the hot end of the detection winding Tc via the emitter E and the collector C of the bipolar transistor 204, the bias resistor 207, and the source S and the drain D of the FET 220 in order.

As a result, the voltage drop shown in FIG. 43(B) occurs at the both ends of the bias resistor 207, and the voltage at the gate G of the FET 220 becomes higher than the voltage at the source S. Therefore, the FET 220 is forward biased, and the FET 220 is saturated as shown in FIG. 43(C).

Under the saturation, the voltage between the source S and the drain D of the FET 220 is almost 0 (being shunt), and the voltages at the source S and drain D are almost the same as each other. Further, the voltage is very lower than the forward voltage in the diode.

Because of this, almost no voltage drop occurs at the FET 220 as shown in FIG. 43(D), and the voltage which is almost equal to the source voltage is applied to the load 217 as shown in FIG. 43(E).

Then, when the polarity of the source voltage shown in FIG. 43(A) becomes positive, the secondary winding Tb and the detection winding Tc generate a secondary voltage so that the voltage at the hot end becomes higher than that at the cold end.

At that time, if a load current flows through the secondary winding Tb, the voltage between the both ends of the secondary winding Tb drops because of the internal resistance of the secondary winding Tb and the magnetic resistance of the transformer 215. On the other hand, the detection winding Tc generates a voltage whose quantity is proportional to the impedance of a section where the both ends of the detection winding Tc are connected.

As a result, when the impedance of the section where the both ends of the detection winding Tc are connected is satisfactorily higher than the impedance of the load 217, the voltage at the cold end of the secondary winding Tb becomes higher than the voltage at the cold end of the detection winding Tc. In this case, the potential difference between the both cold ends is also almost equal to the difference between the quantity of the voltage between the both ends of the secondary winding Tb and the quantity of the voltage between the both ends of the detection winding Tc.

The voltage between the both ends is applied between the base B and emitter E of the bipolar transistor 204, and the voltage at the base B of the bipolar transistor 204 becomes higher than the voltage at the emitter E. As a result, the bipolar transistor 204 is inactivated.

After the bipolar transistor 204 is inactivated, the current path, extending from the cold end of the detection winding Tc to the hot end of the detection winding Tc via the emitter E and collector C of the bipolar transistor 204, the bias resistor 207 and the source S and drain D of the FET 220 in order, is cut off.

Then, no bias voltage is applied between the gate G and source S of the FET 220 (in other words, the potentials at the gate G and the source S become almost the same as each other). Because the FET 220 is the enhancement type FET, the FET 220 is reversely biased, thus, the FET 220 is inactivated as shown in FIG. 45(C).

As a result, a ground voltage is applied to the load 217 as shown in FIG. 43(E), and a source voltage is applied between the source S and the drain D (FIG. 43(E) shows the voltage at the drain D whose reference voltage is the voltage at the source S).

After such processing is repeated, a half-wave rectified voltage which is applied to the load 217 as shown in FIG. 43(E).

According to the structure shown in FIG. 41, a drop in the voltage between the source S and the drain D becomes almost 0 (for example, approximately 5 mV to 40 mV) when the FET 220 is activated. Thus, the alternating voltage can be rectified with a small loss.

Moreover, because the FET 220 is switched off at the time the target voltage to be rectified is almost 0, the overshoot and the undershoot do not occur on the rectified voltage.

The waveform of the target voltage to be rectified is not limited to a sine wave voltage such as that shown in FIG. 43(A). It may have a triangular waveform, a rectangular waveform, or the like. The voltage whose average value is not become 0, in other words, the voltage containing AC components to which DC components have been added, may be rectified.

The transformer 215 is not limited to the above described one. For example, the transformer 215 may comprise a power source transformer 215*a* and a current detecting insulation transformer 215*b*.

In this case, a primary winding of the power source transformer 215*a* and a primary winding of the insulation transformer 216*b* are connected parallel with each other as illustrated, and an output voltage from the alternating current source 15 is input to their common ends.

A hot end and a cold end of a secondary winding of the power source transformer 215*a* are connected to the drain of the FET 220 and one end of the base resistor 206, as well as in the aforementioned case of the hot end and the cold end of the secondary winding Tb of the transformer 2.

A hot end and cold end of a secondary winding of the insulation transformer 215b are connected to the drain of the FET 222 and the emitter of the bipolar transistor 204, as well as in the aforementioned case of the hot end and cold end of the detection winding Tc of the transformer 2.

Moreover, instead of the voltage at collector C of the bipolar transistor 204, a voltage which is obtained by adding a predetermined bias voltage to the voltage for the collector C may be applied to the gate G of the FET 220. At that time, the FET 220 is not limited to the enhancement type MOSFET. The FET 220 may be a depression type MOSFET, a junction type FET, or a static induction transistor (SIT).

The rectification circuit may comprise an NPN type bipolar transistor 220b instead of the FET 220.

Figure 45:
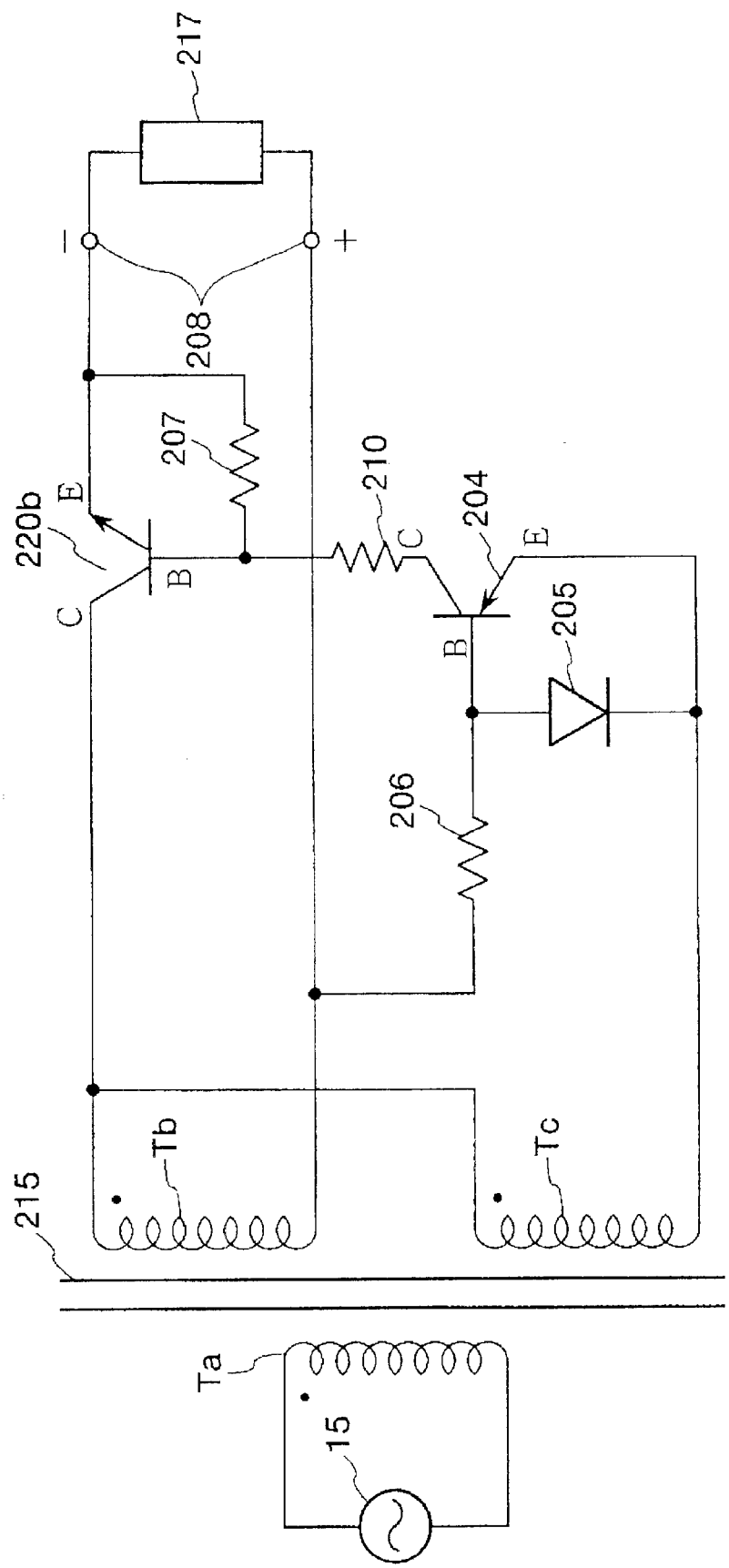
FIG. 45 is a diagram showing an example of the structural elements forming a rectification circuit which activates and inactivates a transistor with an output from a secondary winding of a transformer to rectify an alternating current.

In this rectification circuit, the base, collector or emitter of the bipolar transistor 220b is connected to a portion to which the gate G, drain D or source S of the FET 220 should be connected, as shown in FIG. 45.

Base resistor 210 for regulating the base current for the bipolar transistor 220b is connected between the base B of the bipolar transistor 220b and the collector C of the bipolar transistor 204.

If the NPN type bipolar transistor 220b is used instead of the FET 220 as described above, a bias resistor 207 is connected between the emitter E and the base B of the bipolar transistor 220b.

In this case, when the polarity of a primary voltage becomes negative, an initial bias current flows via the collector C, the base B and the bias resistor 207 even if a diode does not exist between the collector C and emitter E, and the bipolar transistor 220b is activated. As a result, a current flows through the load 217 and the secondary winding Tb, and the voltage appearing between the both ends of the secondary winding Tb drops. Therefore, the diode between the collector C and the emitter E is unnecessary in this case.

However, a diode may be connected between the collector C and the emitter E so that the direction from the emitter E to the collector C is the forward direction, for the sake of, for example, adjusting the extent of a drop in the voltage, appearing between the both ends of the secondary winding Tb to a desired extent.

The rectification circuit may comprise, for example, an FET 204b which is a p-channel or enhancement type MOSFET, instead of the bipolar transistor 204.

If the FET 204b is used, the gate, drain or source of the FET 204b is connected to that portion of this rectification circuit to which the base B, collector C or emitter E of the bipolar transistor 204 should be connected, as shown in FIGS. 46(A) and (B).

In this case, the base resistor 206 may be removed. If the base resistor 206 is removed, the cold end of the secondary winding Tb and the gate of the of the FET 204b may be connected directly.

In this case, a voltage which is obtained by adding a predetermined bias voltage to the voltage for the cold end of the secondary winding Tb may be applied to the FET 204b, instead of the voltage for the cold end of the secondary winging Tb.

In this case, the FET 204b is not limited to the enhancement type MOSFET. It may be a depression type MOSFET, a JFET (junction type FET), or an SIT.

The operation by which each of the rectification circuits shown in FIGS. 45, 46(A), and 46(B) drives the load 217 is substantially the same as the operation of the rectification circuit shown in FIG. 1.

That is, when the polarity of the source voltage becomes negative, the voltage at the cold end of the secondary winding Tb becomes lower than the voltage at the cold end of the detection winding Tc. Thus, the potential difference between the both cold ends becomes almost equal to the difference between the quantity of the voltage between the both ends of the secondary winding Tb and the quantity of the voltage between the both ends of the detection winding Tc.

As a result, if the voltage at the base B of the bipolar transistor 204 becomes lower than the voltage at the emitter E by approximately 0.6V or greater, or if the voltage at the gate of the FET 204b becomes lower than a pinch-off voltage, the bipolar transistor 204 or the FET 204b is activated. A drop occurs in the voltage between the both ends of the bias resistor 207, and the FET 220 or the bipolar transistor 203b is saturated while being forwardly biased. At that time, a voltage which is almost equal to the source voltage is applied to the load 217.

Then, when the polarity of the source voltage becomes positive, the voltage at the cold end of the secondary winding Tb becomes higher than the voltage at the cold end of the detection winding Tc, and the potential difference between the both cold ends becomes almost equal to the difference between the quantity of the voltage between the both ends of the secondary winding Tb and the quantity of the voltage between the both ends of the detection winding Tc.

If the voltage at the base B of the bipolar transistor 204 becomes higher than the voltage at the emitter E, or if the gate voltage of the FET 204b becomes higher than the pinch-off voltage, the bipolar transistor 204 or FET 204b is inactivated. As a result, the FET 220 or the bipolar transistor 220b is reversely biased and inactivated. At that time, a ground voltage is applied to the load 217.

After such processing is repeated, a half-wave rectified voltage is applied to the load 217.

The FET 220 or the bipolar transistor 220b may be connected as shown in FIGS. 47(A), (B), 48(A) and (B), for example.

That is, the drain D of the FET 220 or the collector C of the bipolar transistor 220b may be connected to the negative electrode of the output terminal, and the source S of the FET 220 or the emitter E of the bipolar transistor 220b may be connected to the hot end of the secondary winding Tb.

Also in each of the rectification circuits shown in FIGS. 47(A), (B), 48(A), and (B), when the polarity of the source voltage becomes negative, the voltage at the cold end of the secondary winding Tb becomes lower than the voltage at the cold end of the detection winding Tc. As a result, if the voltage at the base B of the bipolar transistor 204 becomes lower than the voltage at the emitter E by approximately 0.6V or greater, or if the voltage at the gate of the FET 204b becomes lower than the pinch-off voltage, the bipolar transistor or the FET 204b is activated.

At that time, in each of the rectification circuits, a current path is formed extending from the cold end of the detection winding Tc to the hot end of the detection winding Tc via the emitter E and collector C of the bipolar transistor 204 (or the source S and drain D of the FET 204b), and bias resistor 207 in order.

Because of this, a drop occurs in the voltage between the both ends of the bias resistor 207, the FET 220 or the bipolar transistor 220b is saturated while being forwardly biased, and a voltage which is almost equal to the source voltage is applied to the load 217.

If the polarity of the source voltage becomes positive and the voltage at the cold end of the secondary winding Tb becomes higher than the voltage at the cold end of the detection winding Tc, the bipolar transistor 204 or the FET 204b is reversely biased and inactivated.

At that time, the above mentioned current path, extending from the cold end of the detection winding Tc to the hot end of the detection winding Tc via the emitter E and collector C of the bipolar transistor 204 (or the source S and drain D of the FET 204b) and bias resistor 207 in order, is cut off, and substantially no drop occurs in the voltage between the both ends of the bias resistor 207.

As a result, the FET 220 or the bipolar transistor 220b is reversely biased and inactivated, and then a ground voltage is applied to the load 217.

After such processing is repeated, a half-wave rectified voltage is applied to the load 217.

Further, each of the rectification circuits may comprise a p-channel type MOSFET and an NPN type bipolar transistor.

Figure 49:
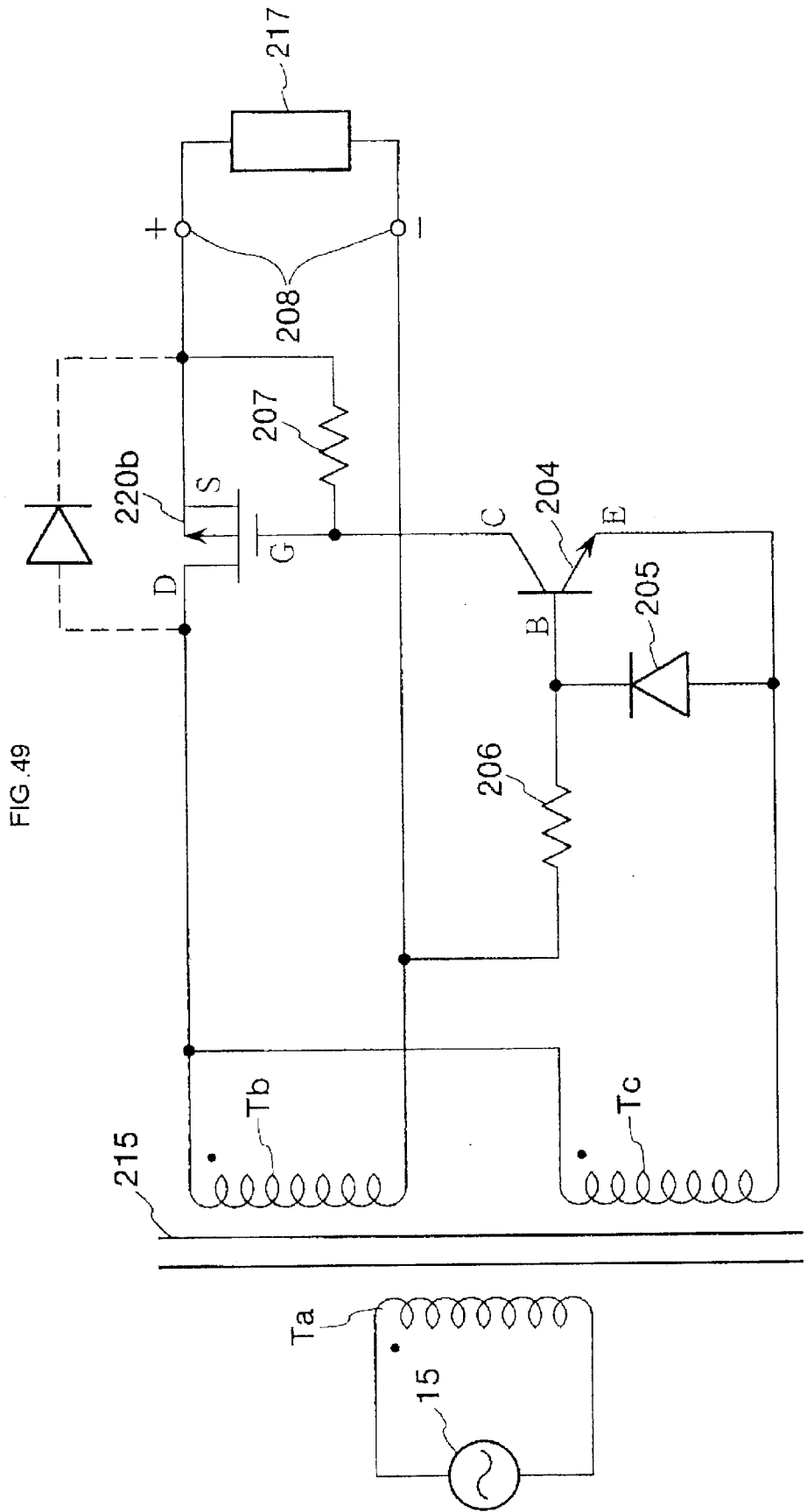
FIG. 49 is a diagram showing an example of the structural elements forming a rectification circuit which activates and inactivates a transistor with an output from a secondary winding of a transformer to rectify an alternating current.

FIG. 49 shows a rectification circuit comprising the p-channel type MOSFET and the NPN type bipolar transistor. As illustrated, the basic structure of this rectification circuit is the same as that of the rectification circuit shown in FIG. 41. However, the FET 220 is the p-channel type MOSFET, and the bipolar transistor 204 is the NPN type bipolar transistor. The cold end of the secondary winding Tb is connected to the negative electrode of the output terminal 208, and the source S of the FET 220 is connected to the positive electrode of the output terminal 208.

In the case where the FET 220 is the p-channel type MOSFET, a diode is connected between the source S and the drain D of the FET 220 so that the direction from the drain D to the source S is the forward direction. This diode may be an independently prepared diode, or the parasitic diode of the FET 220.

When the load 217 is connected to the both electrodes of the output terminal 208 in the rectification circuit shown in FIG. 49, the load 217 is driven as described below.

First, when the polarity of the source voltage becomes positive, the secondary winding Tb and the detection winding Tc generate a secondary voltage in such a direction that the voltage for a hot end is higher than that at a cold end.

At that time, the voltage appearing between the both ends of the secondary winding Tb is applied to the load via the diode connected between the source S and the drain D of the FET 220. When power consumption at the load causes a load current to flow through the secondary winding Tb, the voltage between the both ends of the secondary winding is lowered by the resistance of the secondary winding Tb and the magnetic resistance of the transformer 215. On the other hand, a voltage whose quantity is proportional to the impedance of a section to which the both ends of the detection winding Tc are connected, is generated between the both ends of the detection winding Tc.

As a result, when the impedance of the section to which the both ends of the detection winding Tc are connected is satisfactorily higher than the impedance of the load 217, the voltage at the cold end of the secondary winding Tb becomes higher than the voltage at the cold end of the detection winding Tc. And the potential difference between the both cold ends becomes almost equal to the difference between the quantity of the voltage between the both ends of the secondary winding Tb and the quantity of the voltage between the detection winding Tc.

Then, the voltage between the both cold ends is applied between the base B and the emitter E of the bipolar transistor 204. As a result, if the voltage at the base B of the bipolar transistor 204 becomes higher than the voltage at the emitter E by approximately 0.6V or greater, the bipolar transistor 204 is activated.

After the bipolar transistor 204 is activated, a current path is formed extending from the hot end of the detection winding Tc to the cold end of the detection winding Tc via the drain D and source S of the bipolar transistor 204, a bias resistor 207, and the collector C and emitter E of the bipolar transistor 204 in order.

As a result, a drop occurs in the voltage appearing between the both ends of the bias resistor 207, and the voltage at the gate G of the FET 220 becomes lower than that at the source S. Therefore, the FET 220 is forwardly biased, and therefore is saturated.

As a result, the voltage between the source S and the drain D of the FET 220 becomes almost 0, and then a voltage which is almost equal to the source voltage is applied to the load 217.

When the polarity of the source voltage becomes negative, the secondary winding Tb and the detection winding Tc generate a secondary voltage in such a direction that the voltage at the hot end is lower than the voltage at the cold end.

Under this condition, if a load current flows through the secondary winding Tb, the voltage between the both ends of the secondary winding Tb drops because of the resistance of the secondary winding Tb and the magnetic resistance of the transformer 215. On the other hand, a voltage whose value is proportional to the impedance of a section to which the both ends of the detection winding Tc are connected, is generated between the both ends of the detection winding Tc.

As a result, if the impedance of the section to which the both ends of the detection winding Tc are connected is satisfactorily higher than the impedance of the load 217, the voltage at the cold end of the secondary winding Tb becomes lower than the voltage at the cold end of the detection winding Tc. In this case, the potential difference between the both cold ends also becomes almost equal to the difference between the quantity of the voltage between the both ends of the secondary winding Tb and quantity of the voltage between the both ends of the detection winding Tc.

Then, the voltage between the both cold ends is applied between the base B and the emitter E of the bipolar transistor 204, and the voltage at the base B becomes lower than the voltage at the emitter, and the bipolar transistor 204 is inactivated.

As a result, potentials at the gate G and the source S of the FET 220 are almost equalized. Because the FET 220 is the enhancement type FET, the FET 220 is reversely biased and inactivated. Then the ground voltage is applied to the load 217, and the source voltage is applied between the source S and the drain D.

After such processing is repeated, a half-wave rectified voltage is applied to the load 217.

Instead of the voltage at the collector C of the bipolar transistor 204, a voltage which is obtained by adding a predetermined bias voltage to the voltage at the collector C may be applied to the gate G of the FET 220. Under this condition, the FET 220 is not limited to the enhancement type MOSFET. It may be a depression type MOSFET, a junction type FET, or an SIT.

Instead of the FET 220, the PNP type bipolar transistor 220b may be used in the rectification circuit.

Figure 50:
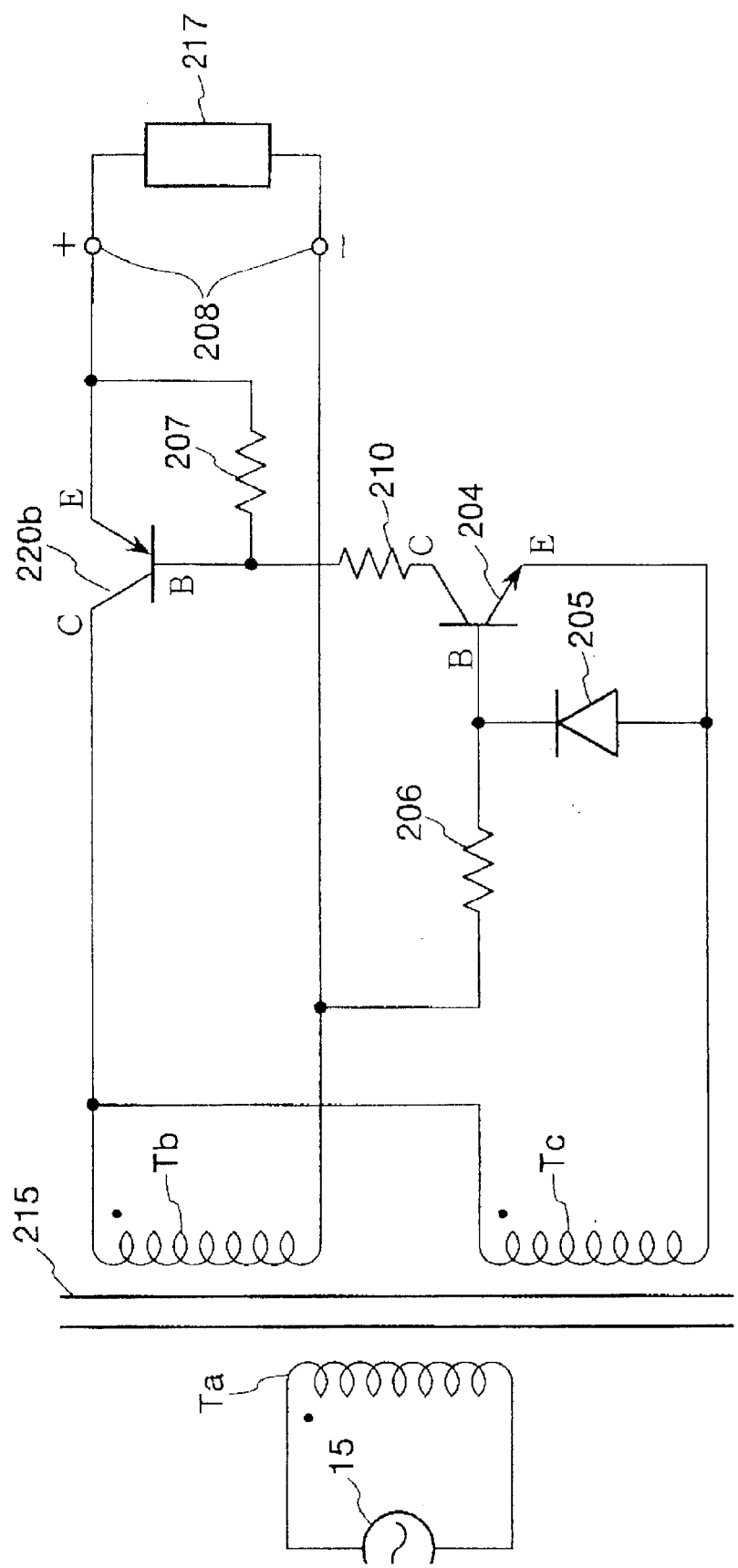
FIG. 50 is a diagram showing an example of the structural elements forming a rectification circuit which activates and inactivates a transistor with an output from a secondary winding of a transformer to rectify an alternating current.

In this case, the base, collector, or emitter of the bipolar transistor 220b is connected to that portion of the rectification circuit to which the gate G, drain D or source S of the FET 220 should be connected, as shown in FIG. 50.

The base resistor 210 for regulating the base current for the bipolar transistor 220b is connected between the base B of the bipolar transistor 220b and the collector C of the bipolar transistor 204.

In this case, when the polarity of a primary voltage becomes positive, an initial bias current flows via the collector C, the base B and a bias resistor 207 even if a diode does not exist between the collector C and the emitter E, thus, the bipolar transistor 220b is activated. As a result, a current flows through the load 217 and the secondary winding Tb, and the voltage between both ends of the secondary winding Tb drops. Therefore, the diode between the collector C and the emitter E is unnecessary in this case.

However, a diode may be connected between the collector C and the emitter E so that the direction from the emitter E to the collector C is the counter direction, for the sake of adjusting the extent of the voltage drop at the both ends of the secondary winding Tb to a predetermined extent.

Instead of the bipolar transistor 204, for example, an FET 204b, whose type is p-channel type, enhancement type, or MOS type, may be used for the rectification circuit.

In this case, the gate, drain or source of the FET 204b is connected to that portion of the rectification circuit to which the base B, collector C or emitter E of the bipolar transistor 204 should be connected, as shown in FIGS. 51(A) and (B).

Moreover, the base resistor 206 may be removed in this case, and the cold end of the secondary winding Tb and the gate of the FET 204b may be connected directly.

Instead of the voltage for the cold end of the secondary winding Tb, a voltage which is obtained by adding a predetermined bias voltage to the voltage for the cold end of the secondary winding Tb, may be applied to the FET 204b. Under this condition, the FET 204b is not limited to the enhancement type MOSFET. It may be a depression type MOSFET, a junction type FET, or an SIT.

The operation by which each of the rectification circuits shown in FIGS. 50, 51(A), and (B) drives the load 217 is the same as the operation of the rectification circuit shown in FIG. 48.

That is, if the polarity of the source voltage becomes positive, the voltage at the cold end of the secondary winding Tb becomes higher than the voltage at the cold end of the detection winding Tc, thus, the potential difference between the both cold ends becomes almost equal to the difference between the quantity of the voltage between the both ends of the secondary winding Tb and the quantity of the voltage between the both ends of the detection winding Tc.

As a result, if the voltage at the base B of the bipolar transistor 204 becomes higher than the voltage at the emitter E by approximately 0.6V or greater, or if the voltage at the gate of the FET 204b becomes higher than the pinch-off voltage, the bipolar transistor 204 or the FET 204b is activated. Then the voltage drop occurs at the both ends of the bias resistor 207, therefore, the FET 220 or the bipolar transistor 220b is forwardly biased and saturated. At that time, voltage which is almost equal to the source voltage is applied to the load 217.

Then, if the polarity of the source voltage becomes negative, the voltage at the cold end of the secondary winding Tb becomes lower than the voltage at the cold end of the detection winding Tc, thus, the potential difference between the both cold ends becomes almost equal to the difference between the quantity of the voltage between the both ends of the secondary winding Tb and the quantity of the voltage between the both ends of the detection winding Tc.

If the voltage at the base B of the bipolar transistor 204 becomes lower than the voltage at the emitter E of the FET 204b, or if the gate voltage of the FET 204b becomes lower than the pinch-off voltage, the bipolar transistor 204 or the FET 204b is inactivated. As a result, the FET 203 or the bipolar transistor 203b is reversely biased and inactivated. At that time, the ground voltage is applied to the load 217.

After such processing is repeated, a half-wave rectified voltage is applied to the load 217.

The form of the connection between the FET 220 or the bipolar transistor 220b and the other devices is not limited to the above described one. They may be connected as shown in, for example, FIGS. 52(A), (B), 53(A), and (B).

That is, the drain D of the FET 220 or the collector C of the bipolar transistor 220b may be connected to the positive electrode of the output terminal, and the source S of the FET 220 or the emitter E of the bipolar transistor 220b may be connected to the hot end of the secondary winding Tb.

In each of the rectification circuits shown in FIGS. 52(A), (B), 53(A), and (B), if the polarity of the source voltage becomes positive, the voltage at the cold end of the secondary winding Tb also becomes higher than the voltage at the cold end of the detection winding Tc. As a result, if the voltage at the base B of the transistor 204 becomes higher than the voltage at the emitter E by approximately 0.6V or greater, or if the voltage at the gate of the FET 204b becomes higher than the pinch-off voltage, the bipolar transistor 204 or the FET 204b is activated.

At that time, in each of the rectification circuits, a current path is formed extending from the hot end of the detection winding Tc to the cold end of the detection winding Tc via the bias resistor 207 and the collector C and emitter E of the bipolar transistor 204 (or the drain D and source S of the FET 204b) in order.

Because of this, a drop occurs in the voltage drop between the both ends of the bias resistor 207, and the FET 220 or the bipolar transistor 220b is forwardly biased and saturated. Then, a voltage which is almost equal to the source voltage is applied to the load 217.

When the polarity of the source voltage becomes negative and the voltage at the cold end of the secondary winding Tb becomes lower than the voltage at the cold end of the detection winding Tc, the bipolar transistor 204 or the FET 204b is reversely biased and inactivated.

At that time, the above described current path, from the hot end of the detection winding Tc to the cold end of the detection winding Tc via the bias resistor 207 and the collector C and emitter E of the bipolar transistor 204 (or the drain D and source S of the FET 204b) in order, is cut off, therefore, substantially no drop occurs in the voltage between the both ends of the bias resistor 207.

As a result, the FET 220 or the bipolar transistor 220b is reversely biased and inactivated. And the ground voltage is applied to the load 217.

After such processing is repeated, a half-wave rectified voltage is applied to the load 217.

Values, voltage values, or the like in the above described embodiment are just examples, therefore, they may be changed arbitrarily. If the bias voltage, the pinch-off voltage, or the like can not be obtained by a single diode, a Zener diode, a resistor, or the like, a plurality of diodes, Zener diodes, or resistors may be connected directly.

When an element, such as an MOSFET, through which a current large enough to break the element cannot flow because of very high input impedance of its control terminal, is used, the base resistor 206, or the like for regulating the current is unnecessary.

Figure 54:
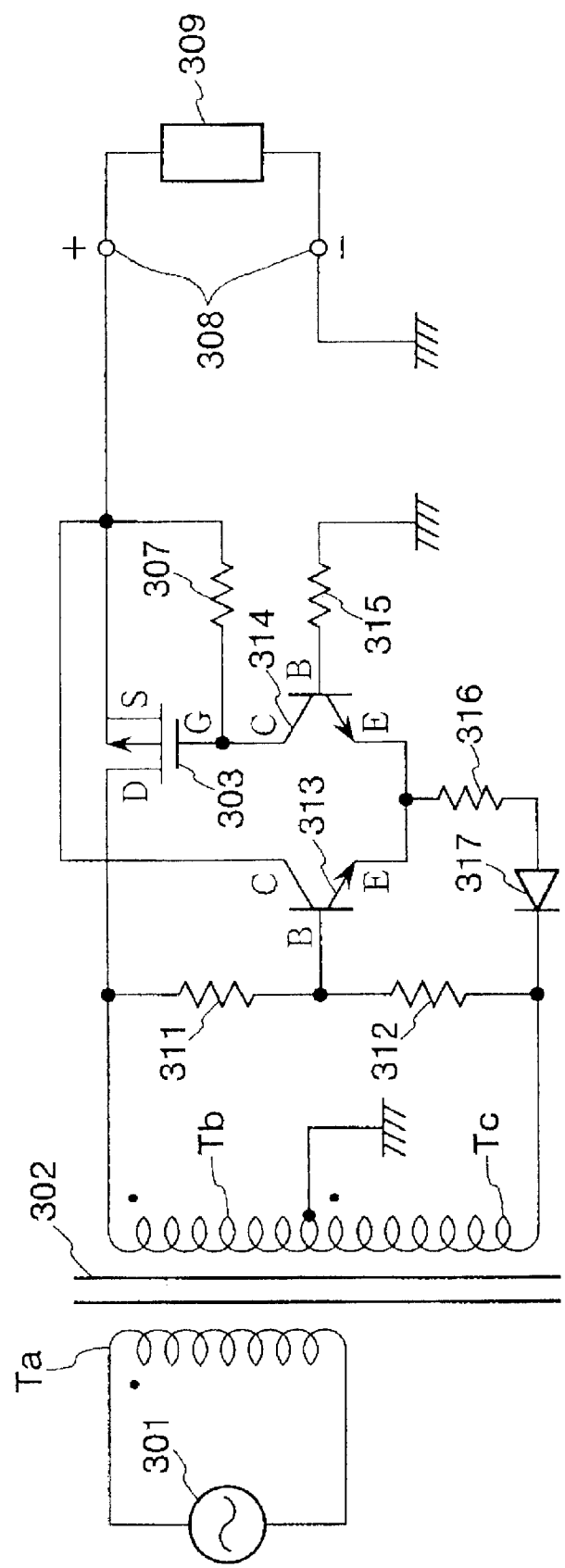
FIG. 54 is a diagram showing one example of the structural elements forming a rectification circuit which activates and inactivates a transistor with an output from a secondary winding of a transformer to rectify an alternating current.

The switching power source according to the present invention may comprise the structure shown in FIG. 54.

As illustrated, the switching power source comprises a transformer 302, an FET 303, an output terminal 308, resistors 311 and 312, bipolar transistors 313 and 314, base resistor 315, emitter resistor 316, and a diode 317.

The transformer 302 is the same as the transformer 2 in the first embodiment. One end of the resistor 311 is connected to a hot end of a secondary winding Tb of the transformer 302, and one end of the resistor 312 is connected to a cold end of a detection winding Tc. The other end of each of the resistors 311 and 312 is connected to base B of the bipolar transistor 313. A connecting point between the cold end of the secondary winding Tb of the transformer 302 and the hot end of the detection winding Tc is grounded. The hot end of the secondary winding Tb is connected to source S of the FET 303.

The FET 303 is a p-channel MOS type FET. The source S of the FET 303 is connected to the hot end of the secondary winding Tb of the transformer 302 as described above. One end of the load 309 is connected to drain D, and the other end thereof is grounded. The bias resistor 307 is connected between gate G and the drain.

The bipolar transistors 313 and 314 are NPN type bipolar transistors.

In the bipolar transistor 313, the base B is connected to the connecting point between the resistors 311 and 312 as described above, collector C is connected to the source S of the FET 303, and emitter E is connected to emitter E of the bipolar transistor 314.

In the bipolar transistor 314, collector C is connected to the gate G of the FET 303, and the emitter E is connected to the emitter E of the bipolar transistor 313 and one end of the emitter resistor 316. The other end of the emitter resistor 316 is connected to an anode of the diode 317. A cathode of the diode 317 is connected to the cold end of the detection winding Tc. The base B of the bipolar transistor 314 is grounded via the base resistor 315.

The number of turns of the detection winding Tc is the same as that of the secondary winding Tb or is simply in proportional to that of the secondary winding Tb. Resistance values of the resistor 311 and the resistor 312 correspond to the turn ratio of the secondary winding Tb to the detection winding Tc.

An operation of the switching power source will now be described.

When an alternating voltage which is output from an alternating voltage source 301 is input to the both ends of a primary winding Ta of the transformer 302, the output from the secondary winding Tb is supplied to the load 309 via the FET 303.

Because of the power consumption at the load 309, when a load current flows through the secondary winding Tb, the voltage between the both ends of the secondary winding Tb drops due to the resistance of the secondary winding Tb and the magnetic resistance of the transformer 302.

At that time, because the load current does not flow through the detection winding Tc, a circuit comprising the transistors 313 and 314, the base resistor 315, the emitter resistor 317 and the diode 317, switches the FET 303 in accordance with the relationship of the potentials between the connecting point, between the resistors 311 and 312, and the ground potential.

If the voltage drop at the secondary winding Tb increases because of increment of the load current, the bias which is applied to the gate G of the FET 303 is controlled and strengthened so as to supply adequate power to the load 309.

On the contrary, if the voltage drop at the secondary winding Tb decreases because of decrement of the load current, the bias which is applied to the gate G of the FET 303 is controlled and weakened so that the power to be supplied to the load 309 is reduced.

The channel type of the FET 303 is not limited to the p-type. An n-type FET may be used. In this case, the bipolar transistors 313 and 314 are PNP type bipolar transistors.

Further, an arbitrary semiconductor switching element may be used for the switching power source instead of the MOS type FET 303.

If a bipolar transistor, or the like, whose current path is opened/shut in response to flow of substantial quantity of current at a control terminal is used, a current-limiting device such as a resistor may be inserted between the control terminal and the collector C of the bipolar transistor 314.

(Full-Wave Rectification Circuit)

Although the half-wave rectification circuit is mainly described in the above embodiment, a full-wave rectification circuit may be comprised of a combination of the half-wave rectification circuits.

That is, the full-wave rectification circuit may be comprised of the half-wave rectification circuits which are bridge-connected (they are represented by diodes in FIGS. 55(A) and (B)) as shown in FIG. 55(A). Moreover, the full-wave rectification circuit may be comprised of a transformer having a middle point in its secondary winding and two half-wave rectification circuits, as shown in FIG. 55(B).

Even in the full-wave rectification circuits shown in FIGS. 55(A) and (B), half-wave rectification circuits D1 to D6 are activated when the polarity of voltages to be applied thereto are positive, and full-wave rectified voltages are applied to loads.

Although the half-wave rectification circuit using the transistor singly is described in the above embodiment, a plurality of transistors may be used. For example, FIG. 56(A) shows an example in which a plurality of NPN bipolar transistors are connected parallel with each other, and a control circuit controls the activation/inactivation of the transistors. FIG. 56(B) exemplifies that a plurality of junction FETs are connected parallel with each other, and a control circuit controls the activation/inactivation of the FETs. FIG. 56(C) exemplifies that a plurality of N-channel junction FETs are connected parallel, and a control circuit controls the activation/inactivation of the FETs. These structures can make the quantity of a switchable current which is plural times larger than that obtained by the circuit using a single transistor.

Figure 57:
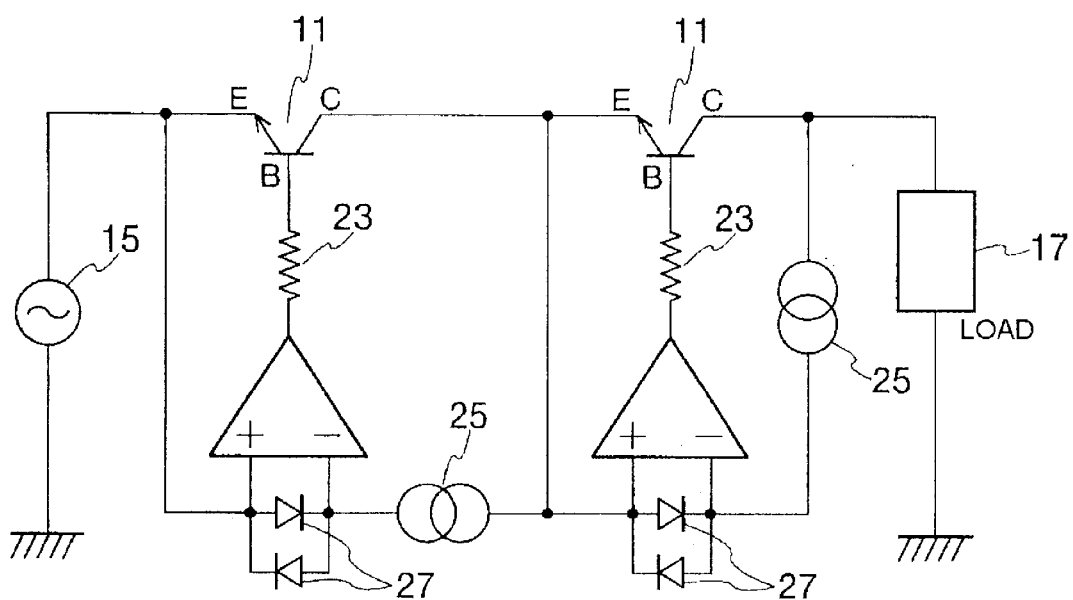
FIG. 57 is a circuit diagram showing an example of a rectification circuit having a plurality of transistors which are cascaded.

FIG. 57 exemplifies that a plurality of transistors are cascaded. According to this structure, the cascaded transistors are activated/inactivated simultaneously, therefore, it is capable of increasing a withstanding voltage.

Figure 58:
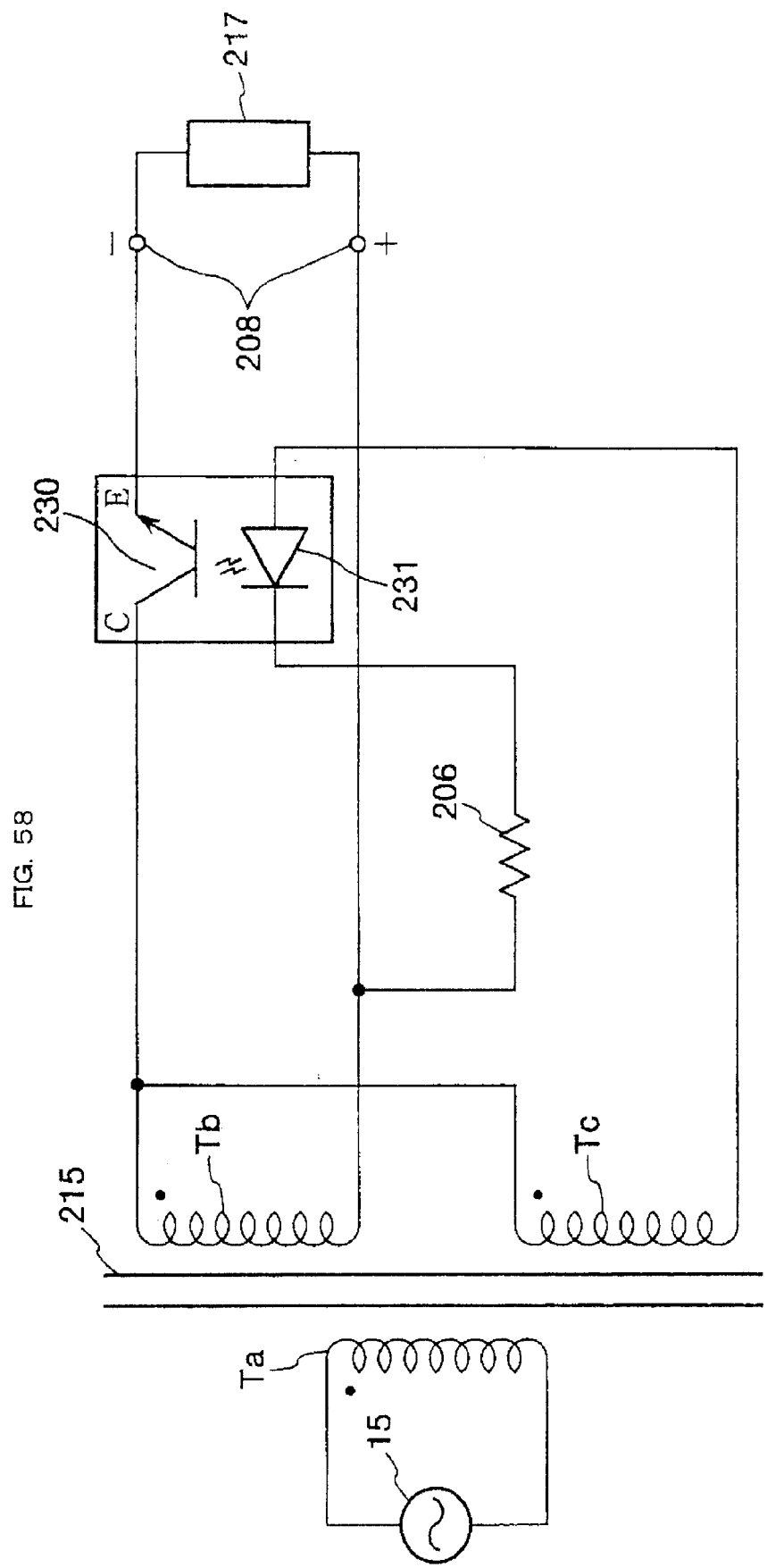
FIG. 58 is a circuit diagram showing an example of the structural elements forming a rectification circuit using an optically controllable transistor.

If multiple transistors are cascaded, a photo transistor 230 which is activated/inactivated in response to lights may be used as the transistor for example, and the control circuit may comprise a luminescent element 231 which luminesces lights for activation/inactivation control as shown in FIG. 58, for synchronous activation and inactivation of the transistor.

A Hall element may be used as the transistor. In this case, the Hall element is connected between the power source and the load. The Hall element is activated or inactivated by applying a magnetic field to the Hall element in accordance with the result of the detection of the voltage to be applied to the hole element or the polarity thereof.

Otherwise, an arbitrary semiconductor switching element, which is externally controlled to be activated or inactivated, may be used.

A desirable transistor as the switching element has a small activation resistance and a high withstanding voltage while being inactivated.

Figure 59:
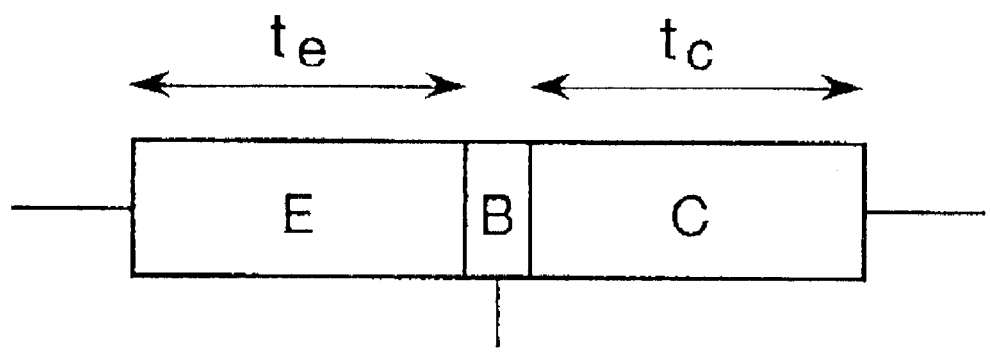
FIG. 59 is a diagram showing an example of a bipolar transistor.

A structure shown in FIG. 59, for example, whose emitter layer te and collector layer tc have substantially the same thickness, may be used for the desirable transistor.

Figure 60:
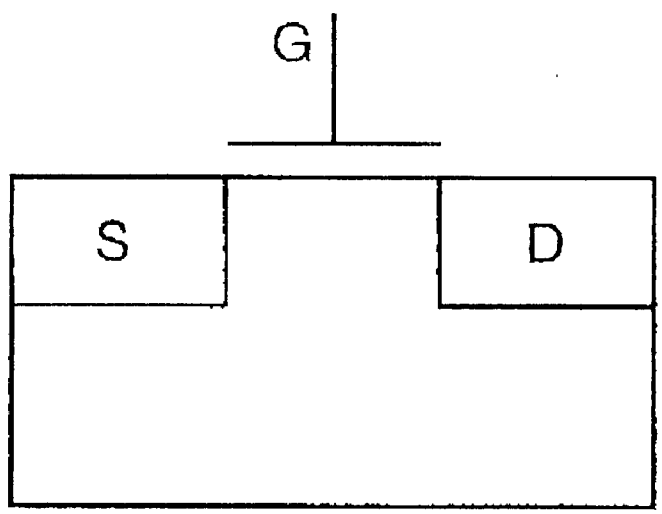
FIG. 60 is a diagram showing an example of a field effect transistor.

A field effect transistor whose source structure and drain structure are the same as shown in FIG. 60 may be used.

FIG. 61 shows a comparison of the characteristics of the rectification circuit, which is structured as shown in FIG. 12, with an ordinal silicon diode and schottky-barrier diode.

The result is obtained under the conditions wherein: the power from the mains is used as a target voltage to be rectified; a load of 10A is used as the load 17; an FET manufactured by FUJI ELECTRIC CO., LTD. whose model number is 2SK905 is used for as the MOSFET; the resistance value of the resistor 23 is set to 100Ω; and an operational amplifier manufactured by NATIONAL SEMICONDUCTOR CORPORATION whose model number is LM4558 is used as the OP-amp 21.

It is obvious from FIG. 61 that the half-wave rectification circuit shown in FIG. 4 can rectify the alternating voltage with a small loss because the voltage drop (the voltage between the emitter E and the collector C) is approximately 0.01V in the half-wave rectification circuit shown in FIG. 4 when the transistor is activated, whereas the voltage drop when a schottky-barrier diode is used is approximately 0.4V, and the voltage drop when a silicon diode is used is approximately 0.9V.

FIG. 62 shows a comparison of characteristics of the half-wave rectification circuit structured as shown in FIG. 14, with the ordinal silicon diode and schottky-barrier diode.

The result is obtained under the conditions wherein: the power from the mains is used as a target voltage to be rectified; the load of 10A is used as the load 17; the FET manufactured by FUJI ELECTRIC CO., LTD. whose model number is 2SK905 is used for as the MOSFET; and winding ratio of the current transformer is set to 1:100.

It is obvious from FIG. 62 that the voltage drop (the voltage between the emitter E and the collector C) is approximately 0.6V immediately after the polarity of the source voltage becomes positive and immediately before the source voltage becomes 0V in the rectification circuit shown in FIG. 14, however, it is almost 0V over almost the entire period during which the polarity of source voltage is positive. On the contrary, the voltage drop is approximately 0.4V when a schottky-barrier diode is used, and is approximately 0.9V when a silicon diode is used. Therefore, the half-wave rectification circuit shown in FIG. 14 can rectify the alternating voltage with a small loss.

It has been proved from the first and second examples that the rectification circuit of the present invention could rectify the alternating voltage efficiently with a small loss.

Industrial Applicability

As described above, the electric circuit according to the present invention is suitable for rectifying the alternating voltage and current.

What is claimed is:

1. A rectification circuit comprising:

a transistor and a control circuit connected to said transistor, wherein said transistor comprises a current path and a control terminal, receives a target voltage to be rectified at one end of said current path, and outputs a rectified voltage at the other end of said current path by being activated and inactivated in accordance with control of said control circuit, said control circuit is connected to said current path and said control terminal of said transistor, and controls a signal to be supplied to said control terminal, in accordance with the direction of a current flowing through a node between the one end of said current path and an external circuit, thereby activating or inactivating said transistor to make said transistor rectify said target voltage, wherein said transistor serves as an inverse transistor when it is turned on.

2. The rectification circuit according to claim 1, wherein said control circuit comprises:

a current transformer having a primary winding connected to one end of said current path of said transistor and a secondary winding connected to said primary winding magnetically; and a circuit, connected to said secondary winding of said current transformer, for controlling a signal to be provided to said control terminal of said transistor, in accordance with a current in said secondary winding induced by a current flowing in a predetermined one direction through the primary winding, wherein the predetermined one direction is the same direction in which the rectified current flows.

3. The rectification circuit according to claim 2, wherein said control circuit comprises means for converting the induced current flowing through said secondary winding into a voltage signal, and for applying the voltage signal to said control terminal.

4. A rectification circuit comprising:

a transistor and a control circuit, connected to said transistor, wherein said transistor comprises a current path and a control terminal, receives a target voltage to be rectified at one end of said current path, and outputs a rectified voltage at the other end of said current path by being activated and inactivated in accordance with control of said control circuit; and said control circuit is connected to said current path and said control terminal of said transistor, and controls a signal to be supplied to said control terminal, in accordance with the direction of a current flowing through a node between the one end of said current path and an external circuit, thereby activating or inactivating said transistor to make said transistor rectify said target voltage, wherein said control circuit comprises:

a transformer having a primary winding connected to one end of said current path of said transistor and a secondary winding connected to said primary winding magnetically; and a circuit, connected to said secondary winding of said transformer, for controlling a signal to be provided to said control terminal of said transistor, in accordance with a current induced in said secondary winding, said control circuit comprises a conversion circuit for converting a current induced in said secondary winding into a voltage signal, and an amplifier which amplifies the voltage signal converted by said conversion circuit and applying the amplified voltage signal to said control terminal of said transistor.

5. A rectification circuit comprising:

a transistor and a control circuit, connected to said transistor, wherein said transistor comprises a current path and a control terminal, receives a target voltage to be rectified at one end of said current path, and outputs a rectified voltage at the other end of said current path by being activated and inactivated in accordance with control of said control circuit; and said control circuit comprises:

a transformer having a primary winding connected to one end of said current path of said transistor and a secondary winding connected to said primary winding magnetically; a conversion circuit for converting a current induced in said secondary winding into a voltage signal; and an amplifier which amplifies the voltage signal converted by said conversion circuit and applying the amplified voltage signal to said control terminal of said transistor.

6. The rectification circuit according to claim 5, further comprising a diode circuit which bypasses between one end of the current path and the other end of the current path of the transistor so that current flows in one direction through the primary winding until the transistor turns on.

7. The rectification circuit according to claim 5, wherein said transistor comprises a bipolar transistor and the rectification circuit further comprises a diode circuit which is connected between the control terminal and one end of the current path and the other end of the current path of the transistor so that current flows in one direction through the primary winding until the transistor turns on.

* * * * *